(12) United States Patent
Koscielnik et al.

(10) Patent No.: US 8,928,516 B2
(45) Date of Patent: Jan. 6, 2015

(54) METHOD AND APPARATUS FOR CONVERSION OF VOLTAGE VALUE TO DIGITAL WORD

(75) Inventors: Dariusz Koscielnik, Cracow (PL); Marek Miskowicz, Cracow (PL)

(73) Assignee: Akademia Gorniczo-Hutnicza IM. Stanislawa Staszica, AL., Cracow (PL)

( * ) Notice: Subject to any disclaimer, the term of this patent is extended or adjusted under 35 U.S.C. 154(b) by 104 days.

(21) Appl. No.: 13/702,127

(22) PCT Filed: Jun. 5, 2011

(86) PCT No.: PCT/PL2011/050022
§ 371 (c)(1),
(2), (4) Date: Mar. 27, 2013

(87) PCT Pub. No.: WO2011/152745
PCT Pub. Date: Dec. 8, 2011

(65) Prior Publication Data
US 2013/0176157 A1      Jul. 11, 2013

(30) Foreign Application Priority Data

| Jun. 5, 2010 | (PL) | 391420 |
| Jun. 5, 2010 | (PL) | 391421 |
| Nov. 10, 2010 | (PL) | 392924 |

(51) Int. Cl.
| H03M 1/12 | (2006.01) |
| H03M 1/14 | (2006.01) |
| H03M 1/80 | (2006.01) |
| H03M 1/00 | (2006.01) |
| H03M 1/46 | (2006.01) |

(52) U.S. Cl.
CPC ............... *H03M 1/14* (2013.01); *H03M 1/804* (2013.01); *H03M 1/12* (2013.01); *H03M 1/00* (2013.01); *H03M 1/125* (2013.01); *H03M 1/466* (2013.01)
USPC ............................................ 341/172; 341/155

(58) Field of Classification Search
CPC .......... H03M 1/00; H03M 1/12; H03M 1/804
USPC .................................. 341/155, 156, 163, 172
See application file for complete search history.

(56) References Cited

U.S. PATENT DOCUMENTS 7,268,719 B2 * 9/2007 Terazawa et al. ............. 341/157

* cited by examiner

*Primary Examiner* — Joseph Lauture
(74) *Attorney, Agent, or Firm* — Ladas & Parry LLP

(57) ABSTRACT

The solution according to the invention consisting in conversion of a voltage value to a digital word of a number of bits equal to n is characterized in that the converted voltage value is first mapped to a portion of electric charge accumulated in the sampling capacitor ($C_{-n}$) during the active state of the signal on the trigger input (InS) and the accumulated charge portion is next successively redistributed by the use of the current source (I) in the array (A) of binary-scaled capacitors ($C_{n-1}, \ldots, C_0$) in the order of decreasing capacitances starting from the capacitor ($C_{n-1}$) having the highest capacitance value in the array (A). The process of charge redistribution is controlled by the control module (CM) on the basis of the output signals of the comparators (K1) and (K2) without the use of a clock while the value one is assigned to these bits ($b_{n-1}, \ldots, b_0$) in the digital output word that correspond to the capacitors ($C_{n-1}, \ldots, C_0$) on which the reference voltage ($U_L$) of a desired value has been obtained, and the value zero is assigned to the other bits.

15 Claims, 19 Drawing Sheets

METHOD AND APPARATUS FOR CONVERSION OF VOLTAGE VALUE TO DIGITAL WORD

Figure 1:
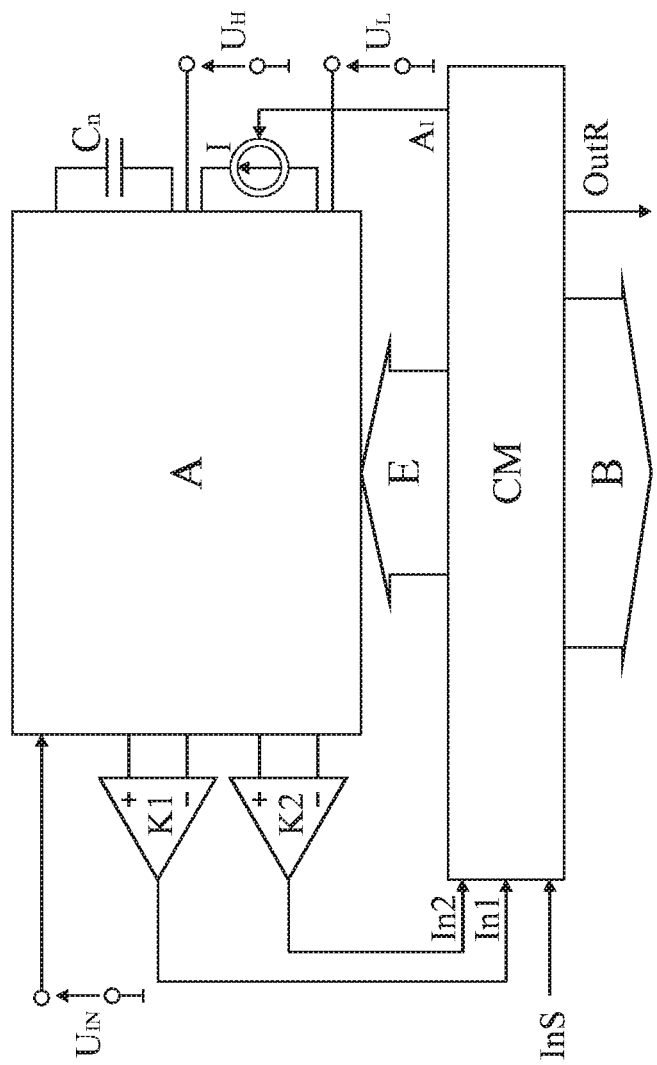

The subject of this invention is a method and an apparatus for conversion of an voltage value to a digital word that can be applied in monitoring and control systems.

The method for the conversion of the voltage signal to the digital signal known from the article (James McCreary, Paul R. Gray "A High-Speed, All-MOS Successive-Approximation Weighted Capacitor A/D Conversion Technique", Proceedings of IEEE International Solid-State Circuits Conference, February 1975, pp. 38-39) exploits the electric charge redistribution in the array of capacitors according to the successive approximation algorithm. The first stage of this method is sampling an instantaneous value of the input voltage signal consisting in accumulation of electric charge whose value is directly proportional to the input voltage value in the array of capacitors connected in parallel. The capacitance value of each given capacitor is twice as high as the capacitance value of the previous capacitor in the array, and one of plates of each capacitor is connected to the first common rail. As soon as sampling is terminated, the process of conversion of the accumulated charge value to a digital word is realized through its appropriate redistribution among the capacitors in the array. The conversion process is started from moving the other plate of the capacitor having the highest capacitance value to the reference potential of a desired value. A state of the switches exploited for this purpose is controlled by a synchronous sequential control module that generates relevant control signals. The charge redistribution among the capacitors in the array, which is enforced in this way, causes a change of a resultant potential of the first common rail. This potential is compared to the potential of the ground of the circuit by the use of a comparator. If the resultant potential of the first rail after changing the potential of the other plate of a given capacitor is higher than the potential of the ground of the circuit, this plate is moved back to the potential of the ground of the circuit, and the relevant bit in a digital word corresponding to this capacitor is set to zero. Otherwise, the other plate of this capacitor is left on the reference potential, and the relevant bit in a digital word is set to one. Afterwards, the potential of the other plate of the next capacitor of twice lower capacitance value is changed by means of the control module, and after that, the cycle is repeated until the whole digital word having a number of bits equal to n is generated where a duration of the sampling stage and a duration of successive steps of the conversion process is determined by period of the clock signal that clocks the circuit operation.

The voltage analog-to-digital converter known from the article (James McCreary, Paul R. Gray "A High-Speed, All-MOS Successive-Approximation Weighted Capacitor A/D Conversion Technique", Proceedings of IEEE International Solid-State Circuits Conference, February 1975, pp. 38-39) comprises the successive approximation capacitor array whose one input is connected to the source of converted input voltage, whereas the other input is connected to the source of the reference voltage while its output is connected to the sequential control module through the comparator. The sequential control module is equipped with the digital output and the input of the clock signal that clocks a course of the conversion process. Two control outputs of the sequential control module are connected to the comparator, and the other control outputs are connected to the successive approximation capacitor array. The successive approximation capacitor array comprises a number of n capacitors of binary-weighted capacitance values and an additional capacitor while the first plate of each capacitor in the array is connected to the first common rail, and the capacitance value of the additional capacitor equals the capacitance value of the smallest capacitor in the array. The other plates of the capacitors in the array are connected to the other common rail through the change-over switches whose other stationary contacts are connected to the ground of the circuit. The first common rail is connected to the non-inverting input of the comparator, and the second common rail is connected through another switch to the source of the input voltage or to the source of the reference voltage while the inverting input of the comparator is connected to the ground of the circuit.

Method according to the invention consisting in mapping the converted voltage value to a portion of electric charge proportional to this converted voltage value, while charge is accumulated in at least one capacitor, and consisting in assigning a digital word having a number of bits equal to n is characterized in that after detecting the beginning of the active state of the signal on the trigger input by means of the control module, the converted voltage value is mapped to the portion of electric charge proportional to this converted voltage value, while the portion of charge is accumulated in the sampling capacitor, by connecting the sampling capacitor in parallel to the source of the converted voltage during the active state of the signal on the trigger input, while the duration of the active state of the signal on the trigger input is not shorter than the assumed minimum value. After detecting the end of the active state of the signal on the trigger input by means of the control module, the function of the source capacitor whose index is defined by the content of the source capacitor index register in the control module is assigned by means of the control module to the sampling capacitor by writing the value of the index of the sampling capacitor to the source capacitor index register, and at the same time the function of the destination capacitor, whose index is defined by the content of the destination capacitor index register in the control module, is assigned by means of the control module to the capacitor having the highest capacitance value in the array of capacitors, while a capacitance value of each capacitor of a given index is twice as high as a capacitance value of the capacitor of the previous index, by writing the value of the index of the capacitor having the highest capacitance value in the array of capacitors to the destination capacitor index register. Afterwards, the process of redistribution of the accumulated charge in capacitors in the array is realized during which charge accumulated in the source capacitor is transferred to the destination capacitor by the use of the current source, and at the same time the voltage increasing on the destination capacitor is compared to the reference voltage value by the use of the second comparator, and also the voltage on the source capacitor is observed by the use of the first comparator. When the voltage on the source capacitor observed by the use of the first comparator equals zero during the charge transfer, the function of the source capacitor is assigned to the current destination capacitor by means of the control module on the basis of the output signal of the first comparator by writing the current content of the destination capacitor index register in the control module to the source capacitor index register in the control module, and also the function of the destination capacitor is assigned to the subsequent capacitor in the array whose capacitance value is twice lower than the capacitance value of the capacitor that operated as the destination capacitor directly before by reducing the content of the destination capacitor index register by one, and charge transfer from a new source capacitor to a new destination capacitor is continued by the use of the current source. When the voltage on the destination capacitor observed by the use of the second comparator equals the reference voltage value during the transfer of charge from the source capacitor to the destination capacitor, the function of the destination capacitor is assigned by means of the control module on the basis of the output signal of the second comparator to the subsequent capacitor in the array whose capacitance value is twice lower than the capacitance value of the capacitor that operated as the destination capacitor directly before by reducing the content of the destination capacitor index register by one, and also the charge transfer from the source capacitor to a new destination capacitor is continued. This process is still controlled by means of the control module on the basis of the output signals of both comparators until the voltage on the source capacitor observed by the use of the first comparator equals zero during the period in which the function of the destination capacitor is assigned to the capacitor having the lowest capacitance value in the array of capacitors, or the voltage increasing on the capacitor having the lowest capacitance value in the array of capacitors and observed at the same time by the use of the second comparator equals the reference voltage value. The value one is assigned to these bits in the digital word corresponding to the capacitors in the array of capacitors on which the voltage equal to the reference voltage value has been obtained, and the value zero is assigned to the other bits by means of the control module.

In the another variant of the method, after detecting the beginning of the active state of the signal on the trigger input by means of the control module, electric charge is accumulated in the capacitor having the highest capacitance value in the array of capacitors and at the same time in the sampling capacitor connected in parallel to the capacitor having the highest capacitance value in the array of capacitors where the capacitance value of the sampling capacitor is not smaller than the capacitance value of the capacitor having the highest capacitance value in the array of capacitors, by connecting at the same time both capacitors in parallel to the source of the converted voltage during the active state of the signal on the trigger input. After detecting the end of the active state of the signal on the trigger input by means of the control module the function of the source capacitor, whose index is defined by the content of the source capacitor index register in the control module, is assigned by means of the control module to the sampling capacitor by writing the value of the index of the sampling capacitor to the source capacitor index register. At the same time, the function of the destination capacitor whose index is defined by the content of the destination capacitor index register in the control module is assigned by means of the control module to the capacitor having the highest capacitance value in the array of capacitors by writing the value of the index of the capacitor having the highest capacitance value in the array of capacitors to the destination capacitor index register. After that, the process of electric charge transfer from the source capacitor to the destination capacitor is realized by the use of the current source. This process is controlled by means of the control module on the basis of the output signals of the comparators until the voltage on the current source capacitor observed by the use of the first comparator equals zero during the period in which the function of the destination capacitor is assigned to the capacitor having the lowest capacitance value in the array of capacitors, or the voltage, which increases on the capacitor having the lowest capacitance value in the array of capacitors and is simultaneously observed by the use of the second comparator, equals the reference voltage value.

In the another variant of the method, after detecting the beginning of the active state of the signal on the trigger input by means of the control module, electric charge is delivered by the use of the current source and accumulated in the sampling capacitor, and at the same time the voltage increasing on the sampling capacitor is compared to the converted voltage value by the use of the second comparator. This process is realized until the voltage, which increases on the sampling capacitor equals the converted voltage value. After that the function of the source capacitor whose index is defined by the content of the source capacitor index register in the control module is assigned by means of the control module to the sampling capacitor by writing the value of the index of the sampling capacitor to the source capacitor index register. At the same time, the function of the destination capacitor whose index is defined by the content of the destination capacitor index register in the control module is assigned by means of the control module to the capacitor having the highest capacitance value in the array of capacitors by writing the value of the index of the capacitor having the highest capacitance value in the array of capacitors to the destination capacitor index register. After that, the process of charge transfer from the source capacitor to the destination capacitor is realized by the use of the current source. This process is controlled by means of the control module on the basis of the output signals of the comparators until the voltage on the current source capacitor observed by the use of the first comparator equals zero during the period in which the function of the destination capacitor is assigned to the capacitor having the lowest capacitance value in the array of capacitors, or the voltage, which increases on the capacitor having the lowest capacitance value in the array of capacitors and is simultaneously observed by the use of the second comparator, equals the reference voltage value.

In the another variant of the method, after detecting the beginning of the active state of the signal on the trigger input by means of the control module, electric charge is delivered by the use of the current source and accumulated in the capacitor having the highest capacitance value in the array of capacitors and at the same time in the sampling capacitor connected in parallel to the capacitor having the highest capacitance value in the array of capacitors where the capacitance value of the sampling capacitor is not smaller than the capacitance value of the capacitor having the highest capacitance value in the array of capacitors, and at the same time the voltage increasing on the sampling capacitor is compared to the converted voltage value by the use of the second comparator. This process is realized until the voltage, which increases on the sampling capacitor equals the converted voltage value, and after that the function of the source capacitor, whose index is defined by the content of the source capacitor index register in the control module, is assigned by means of the control module to the sampling capacitor by writing the value of the index of the sampling capacitor to the source capacitor index register. At the same time, the function of the destination capacitor whose index is defined by the content of the destination capacitor index register in the control module is assigned by means of the control module to the capacitor having the highest capacitance value in the array of capacitors by writing the value of the index of the capacitor having the highest capacitance value in the array of capacitors to the destination capacitor index register. After that, the process of electric charge transfer from the source capacitor to the destination capacitor is realized by the use of the current source. This process is controlled by means of the control module on the basis of the output signals of the comparators until the voltage on the current source capacitor observed by the use of the first comparator equals zero during the period in which the function of the destination capacitor is assigned to the capacitor having the lowest capacitance value in the array of capacitors, or the voltage, which increases on the capacitor having the lowest capacitance value in the array of capacitors and is simultaneously observed by the use of the second comparator, equals the reference voltage value.

In the another variant of the method, after detecting the beginning of the active state of the signal on the trigger input by means of the control module, electric charge is delivered by the use of the current source and accumulated in the sampling capacitor, and at the same time the voltage increasing on the sampling capacitor is compared to the converted voltage value by the use of the second comparator. This process is realized until the voltage, which increases on the sampling capacitor, equals the converted voltage value. After that the function of the source capacitor, whose index is defined by the content of the source capacitor index register in the control module, is assigned by means of the control module to the sampling capacitor by writing the value of the index of the sampling capacitor to the source capacitor index register. At the same time, the function of the destination capacitor, whose index is defined by the content of the destination capacitor index register in the control module, is assigned by means of the control module to the capacitor having the highest capacitance value in the array of capacitors by writing the value of the index of the capacitor having the highest capacitance value in the array of capacitors to the destination capacitor index register. After that, the process of redistribution of accumulated charge is realized during which charge is transferred from the source capacitor to the destination capacitor by the use of the additional current source whose effectiveness is different from the effectiveness of the current source. The process of charge redistribution is controlled by means of the control module on the basis of the output signals of the comparators until the voltage on the current source capacitor observed by the use of the first comparator equals zero during the period in which the function of the destination capacitor is assigned to the capacitor having the lowest capacitance value in the array of capacitors, or the voltage, which increases on the capacitor having the lowest capacitance value in the array of capacitors and is simultaneously observed by the use of the second comparator, equals the reference voltage value.

In the another variant of the method, after detecting the beginning of the active state of the signal on the trigger input by means of the control module, electric charge is delivered by the use of the current source and accumulated in the capacitor having the highest capacitance value in the array of capacitors and at the same time in the sampling capacitor connected in parallel to the capacitor having the highest capacitance value in the array of capacitors where the capacitance value of the sampling capacitor is not smaller than the capacitance value of the capacitor having the highest capacitance value in the array of capacitors, and at the same time the voltage increasing on the sampling capacitor is compared to the converted voltage value by the use of the second comparator. This process is realized until the voltage, which increases on the sampling capacitor, equals the converted voltage value. After that the function of the source capacitor, whose index is defined by the content of the source capacitor index register in the control module, is assigned by means of the control module to the sampling capacitor by writing the value of the index of the sampling capacitor to the source capacitor index register. At the same time, the function of the destination capacitor, whose index is defined by the content of the destination capacitor index register in the control module, is assigned by means of the control module to the capacitor having the highest capacitance value in the array of capacitors by writing the value of the index of the capacitor having the highest capacitance value in the array of capacitors to the destination capacitor index register. After that the process of redistribution of accumulated charge is realized during which charge is transferred from the source capacitor to the destination capacitor by the use of the additional current source whose effectiveness is different from the effectiveness of the current source. The process of charge redistribution is controlled by means of the control module on the basis of the output signals of the comparators until the voltage on the current source capacitor observed by the use of the first comparator equals zero during the period in which the function of the destination capacitor is assigned to the capacitor having the lowest capacitance value in the array of capacitors, or the voltage, which increases on the capacitor having the lowest capacitance value in the array of capacitors and is simultaneously observed by the use of the second comparator, equals the reference voltage value.

The apparatus according to the invention comprising the array of capacitors and at least one comparator connected to the control module equipped with the digital output where the control outputs of the control module are connected to the array of capacitors characterized in that the source of the converted voltage is connected to the array of capacitors whose control inputs are connected to the set of control outputs of the control module. The control module is equipped with the digital output, the complete conversion signal output, the trigger input and two control inputs. The first control input of the control module is connected to the output of the first comparator whose inputs are connected to one pair of outputs of the array of capacitors. The other control input of the control module is connected to the output of the second comparator whose inputs are connected to the other pair of outputs of the array. Furthermore, the source of auxiliary voltage together with the source of the reference voltage, the sampling capacitor and the controlled current source are connected to the array of capacitors, and the control input of the current source is connected to the relevant control output of the control module.

The array in this variant of the apparatus comprises a number of n capacitors and a capacitance value of a capacitor of a given index is twice as high as a capacitance value of the capacitor of the previous index. The sampling capacitor is connected to the array of capacitors, while the top plate of the sampling capacitor is connected to the source of the converted voltage through the closed voltage source on-off switch and also it is connected through the closed first on-off switch to the first rail with which the top plates of all the capacitors in the array of capacitors are connected through the open first on-off switches in the array. The top plate of the capacitor having the highest capacitance value in the array of capacitors is also connected through the closed second on-off switch in the array to the second rail with which the top plate of the sampling capacitor is connected through the open second on-off switch and with which the top plates of the other capacitors in the array are also connected through the open second on-off switches in the array. The bottom plate of the sampling capacitor is connected to the ground of the circuit through the change-over switch whose moving contact is connected to its first stationary contact and the other stationary contact of this change-over switch is connected to the source of auxiliary voltage and also to the non-inverting input of the first comparator. The bottom plates of all the capacitors in the array are connected to the source of auxiliary voltage through the change-over switches in the array whose moving contacts are connected to their other stationary contacts, and the first stationary contacts of the change-over switches in the array are connected to the ground of the circuit. The first rail is connected to the ground of the circuit through the open first rail on-off switch and to the non-inverting input of the second comparator whose inverting input is connected to the source of the reference voltage. The second rail is connected to the inverting input of the first comparator. Moreover, the control input of the first on-off switch and the control inputs of the first on-off switches in the array and the control input of the change-over switch and the control inputs of the relevant change-over switches in the array are coupled together and connected to the relevant control outputs of the set of control outputs of the control module. The control input of the second on-off switch and the control inputs of the second on-off switches in the array and the control input of the first rail on-off switch are connected to the relevant control outputs of the set of control outputs of the control module. One end of the current source is connected to the second rail, and the other end of the current source is connected to the first rail. The control input of the current source is connected to the relevant control output of the control module. The control input of the voltage source on-off switch is connected to the relevant control output of the control module.

In the another version of this apparatus variant, the sampling capacitor is connected in parallel to the capacitor having the highest capacitance value in the array of capacitors while the capacitance value of the sampling capacitor is not smaller than the capacitance value of the capacitor having the highest capacitance value in the array of capacitors. At the same time, both of these capacitors are connected in parallel to the source of the converted voltage in a way that the top plate of the capacitor having the highest capacitance value in the array of capacitors is connected to the source of the converted voltage through the closed additional voltage source on-off switch, and the bottom plate of the capacitor having the highest capacitance value in the array of capacitors is connected to the ground of the circuit through the change-over switch in the array whose moving contact is connected to its first stationary contact, and the other stationary contact of this change-over switch in the array is connected to the source of auxiliary voltage. Moreover, the top plate of the capacitor having the highest capacitance value in the array of capacitors is connected also to the first rail through the closed first on-off switch in the array The control input of the voltage source on-off switch and the control input of the additional voltage source on-off switch are coupled together and connected to the relevant control output of the control module, In the another variant of the apparatus, a voltage supply is additionally connected to the array of capacitors.

The array in this variant of the apparatus comprises a number of n capacitors and a capacitance value of a capacitor of a given index is twice as high as a capacitance value of the capacitor of the previous index. The sampling capacitor is connected to the array of capacitors, while the top plate of the sampling capacitor is connected through the closed first on-off switch to the first rail with which also the top plates of all the capacitors in the array of capacitors are connected through the open first on-off switches in the array. The top plate of the capacitor having the highest capacitance value in the array of capacitors is connected through the closed second on-off switch in the array to the second rail with which the top plate of the sampling capacitor is also connected through the open second on-off switch and with which the top plates of the other capacitors in the array are connected through the open second on-off switches in the array. The bottom plate of the sampling capacitor is connected to the ground of the circuit through the change-over switch whose moving contact is connected to its first stationary contact and the other stationary contact of this change-over switch is connected to the source of auxiliary voltage and also to the non-inverting input of the first comparator. The bottom plates of all the capacitors in the array are connected to the source of auxiliary voltage through the relevant change-over switches in the array whose moving contacts are connected to their other stationary contacts, and the first stationary contacts of these change-over switches in the array are connected to the ground of the circuit. The first rail is connected to the ground of the circuit through the open first rail on-off switch and to the non-inverting input of the second comparator whose inverting input is connected to the source of the converted voltage through the voltage source change-over switch whose moving contact is connected to its first stationary contact and the other stationary contact of the voltage source change-over switch is connected to the source of the reference voltage, while the second rail is connected to the inverting input of the first comparator. The control input of the first on-off switch and the control inputs of the first on-off switches in the array and the control input of the change-over switch and the control inputs of the relevant change-over switches in the array are coupled together and connected to the relevant control outputs of the set of control outputs of the control module. The control input of the second on-off switch and the control inputs of the second on-off switches in the array and the control input of the first rail on-off switch are connected to the relevant control outputs of the set of control outputs of the control module. The control input of the voltage source change-over switch is connected to the relevant control output of the control module. One end of the current source is connected to the voltage supply through the current source change-over switch whose moving contact is connected to its first stationary contact and the other stationary contact of the current source change-over switch is connected to second rail. The other end of the current source is connected to the first rail. Moreover, the control input of the current source change-over switch is connected to the control output of the relevant control module, and the control input of the current source is connected to the relevant control output of the control module.

In the another version of this apparatus variant, the sampling capacitor is connected in parallel to the capacitor having the highest capacitance value in the array of capacitors through the first rail and through the ground of the circuit in a way that the top plate of the capacitor having the highest capacitance value in the array of capacitors is connected to the first rail through the closed first on-off switch in the array, and the bottom plate of the capacitor having the highest capacitance value in the array of capacitors is connected to the ground of the circuit through the change-over switch in the array whose moving contact is connected to its first stationary contact, and the other stationary contact of this change-over switch in the array is connected to the source of auxiliary voltage while the capacitance value of the sampling capacitor is not smaller than the capacitance value of the capacitor having the highest capacitance value in the array of capacitors.

In the another variant of the apparatus the voltage supply and a controlled additional current source are connected to the array of capacitors, and the control input of the additional current source is connected to the relevant control output of the control module.

The array in this variant of the apparatus comprises a number of n capacitors and a capacitance value of a capacitor of a given index is twice as high as a capacitance value of the capacitor of the previous index. The sampling capacitor is connected to the array of capacitors, while the top plate of the sampling capacitor is connected through the closed first on-off switch to the first rail with which also the top plates of all the capacitors in the array of capacitors are connected through the open first on-off switches in the array. The top plate of the sampling capacitor is also connected through the closed second on-off switch to the second rail with which the top plates of all the capacitors in the array are connected through the open second on-off switches in the array. The bottom plate of the sampling capacitor is connected to the ground of the circuit through the change-over switch whose moving contact is connected to its first stationary contact and the other stationary contact of this change-over switch is connected to the source of auxiliary voltage and also to the non-inverting input of the first comparator. The bottom plates of all the capacitors in the array are connected to the source of auxiliary voltage through the relevant change-over switches in the array whose moving contacts are connected to their other stationary contacts, and the first stationary contacts of these change-over switches in the array are connected to the ground of the circuit. The first rail is connected to the ground of the circuit through the open first rail on-off switch and to the non-inverting input of the second comparator whose inverting input is connected to the source of the converted voltage through the voltage source change-over switch whose moving contact is connected to its first stationary contact and the other stationary contact of the voltage source change-over switch is connected to the source of the reference voltage. The second rail is connected to the inverting input of the first comparator. Moreover, the control input of the first on-off switch and the control inputs of the first on-off switches in the array and the control input of the change-over switch and the control inputs of the relevant change-over switches in the array are coupled together and connected to the relevant control outputs of the set of control outputs of the control module. The control input of the second on-off switch and the control inputs of the second on-off switches in the array and the control input of the first rail on-off switch are connected to the relevant control outputs of the set of control outputs of the control module. The control input of the voltage source change-over switch is connected to the relevant control output of the control module. One end of the current source is connected to the voltage supply. The other end of the current source is connected to the first rail, with which also the other end of the additional current source is connected. One end of the additional current source is connected to the second rail. The control input of the current source is connected to the control output of the relevant control module while the control input of the additional current source is connected to the relevant control output of the control module.

In the another version of this apparatus variant, the sampling capacitor, whose capacitance value is not smaller than the capacitance value of the capacitor having the highest capacitance value in the array of capacitors, is connected in parallel to the capacitor having the highest capacitance value in the array of capacitors through the first rail and through the ground of the circuit in a way that the top plate of the capacitor having the highest capacitance value in the array of capacitors is connected to the first rail through the closed first on-off switch in the array, and the bottom plate of the capacitor having the highest capacitance value in the array of capacitors is connected to the ground of the circuit through the change-over switch in the array whose moving contact is connected to its first stationary contact, and the other stationary contact of this change-over switch in the array is connected to the source of auxiliary voltage.

The method and the apparatus for conversion of a voltage value to a digital word according to the invention is characterized by simplicity of design. Furthermore, the use of the external gate signal and the comparators output signals for indication of instants of appropriate state transitions in the apparatus enables an external source of clock signal consuming considerable amount of energy to be eliminated, and thus, it causes a significant reduction of energy consumption by the apparatus.

The accumulation of charge in the sampling capacitor and at the same time in the capacitor having the highest capacitance value in the array of capacitors allows the required capacitance value of the sampling capacitor to be reduced twice with the same maximum value of voltage obtained on the sampling capacitor. Moreover, it also allows the duration of the transfer of charge accumulated in the sampling capacitor to subsequent capacitors in the array to be decreased.

Delivery of charge, which is accumulated in the sampling capacitor, or in the sampling capacitor and at the same time in the capacitor having the highest capacitance value in the array of capacitors, by the use of the current source allows the load of the source of the converted voltage to be constrained by the current source effectiveness.

The use of two current sources whose effectivenesses are well chosen allows the conversion time to be limited while the required conversion accuracy may be guaranteed at the same time.

The solution according to the invention is presented in the following figures:

FIG. 1—illustrates the block diagram of the apparatus.

Figure 2:
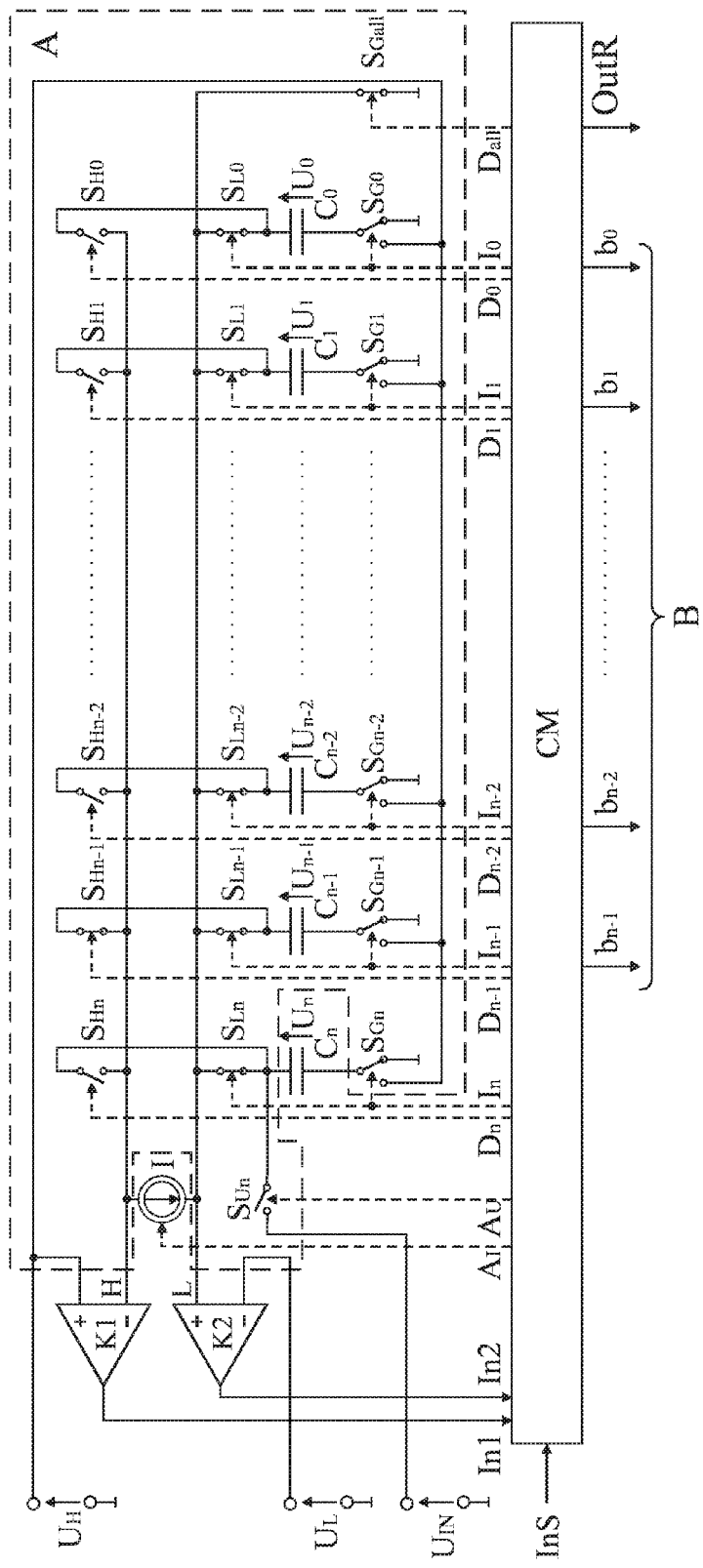

FIG. 2—illustrates the schematic diagram of the apparatus in the relaxation phase.

Figure 3:
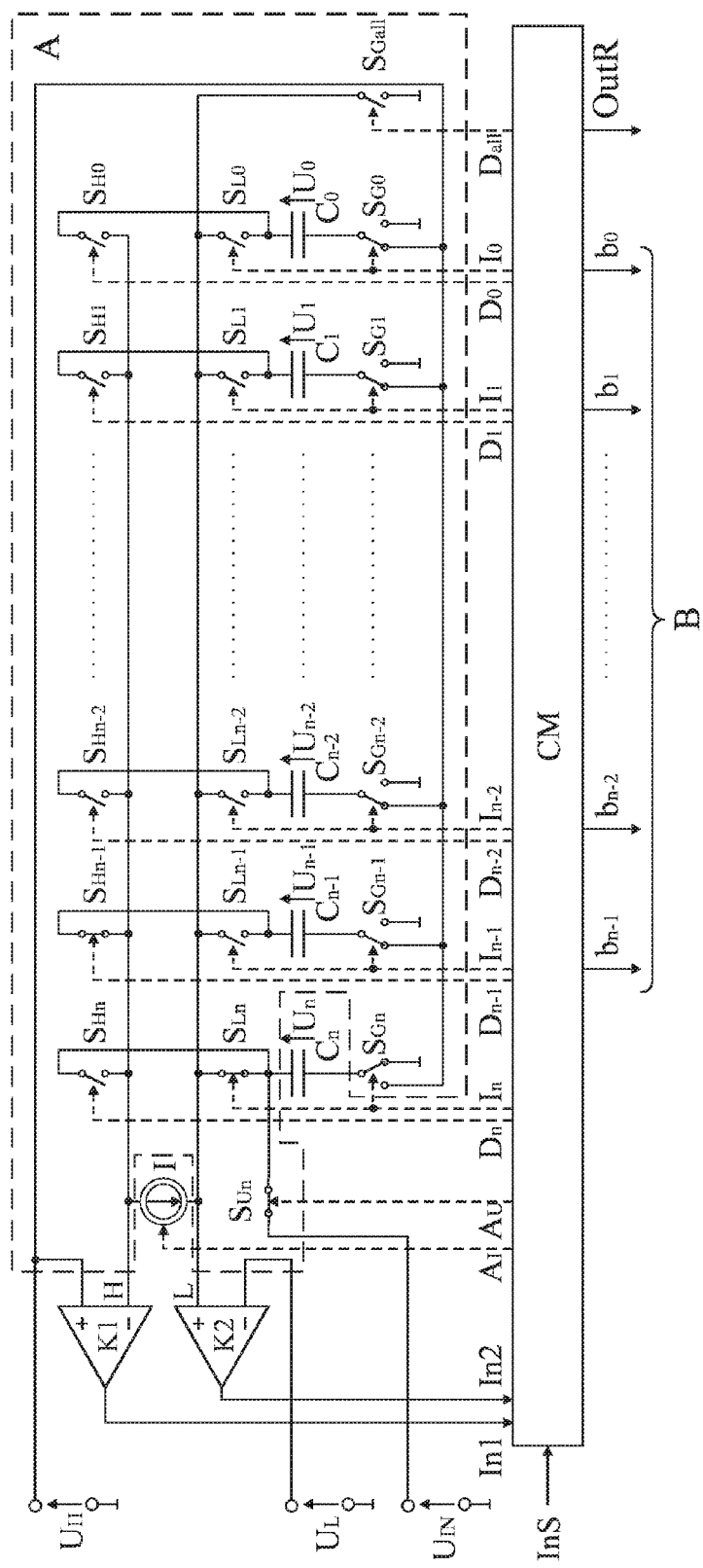

FIG. 3—illustrates the schematic diagram of the apparatus at time of starting the conversion cycle: the charge accumulation in the sampling capacitor $C_n$ connected in parallel to the source of the converted voltage $U_{IN}$.

Figure 4:
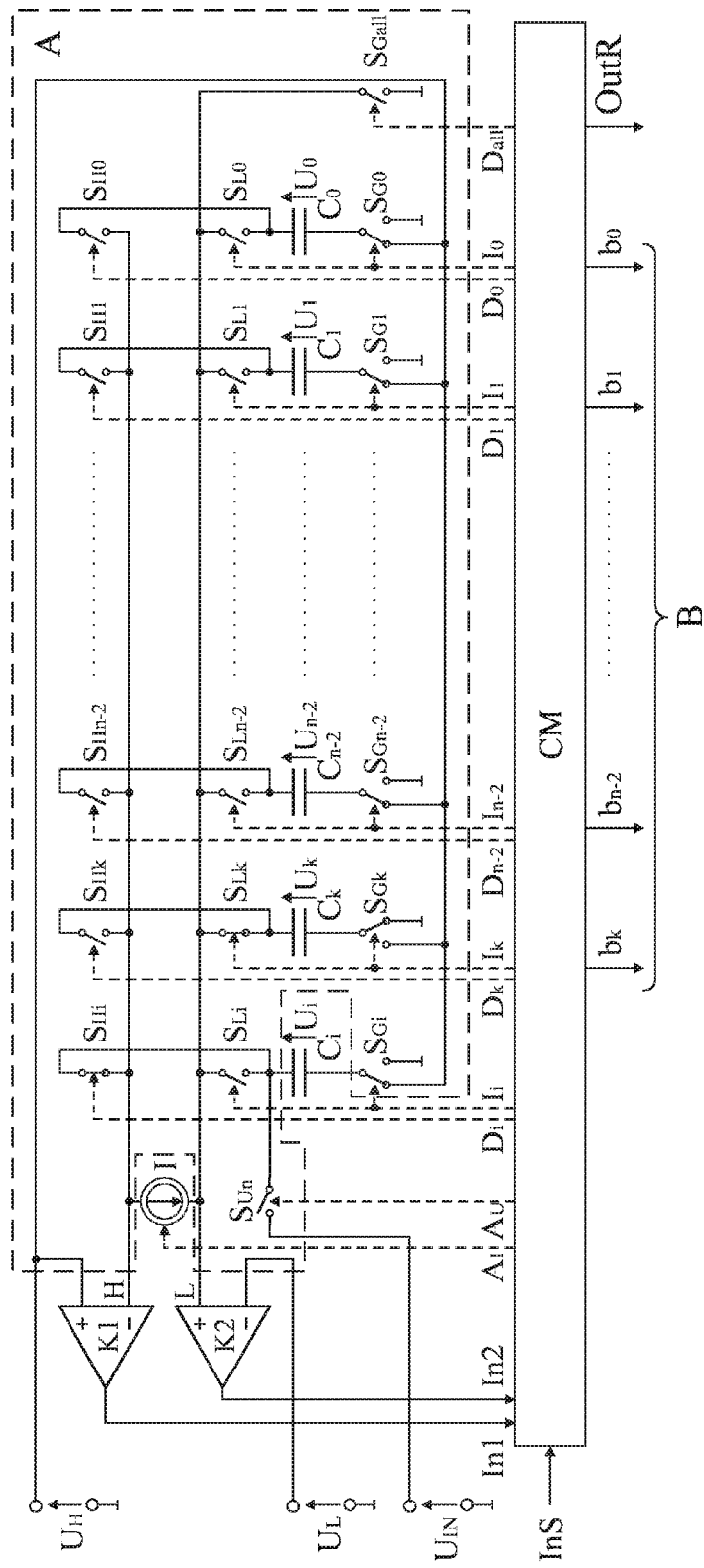

FIG. 4—illustrates the schematic diagram of the apparatus during the charge transfer from the source capacitor $C_i$ to the destination capacitor $C_k$ for i=n and k=n−1.

Figure 5:
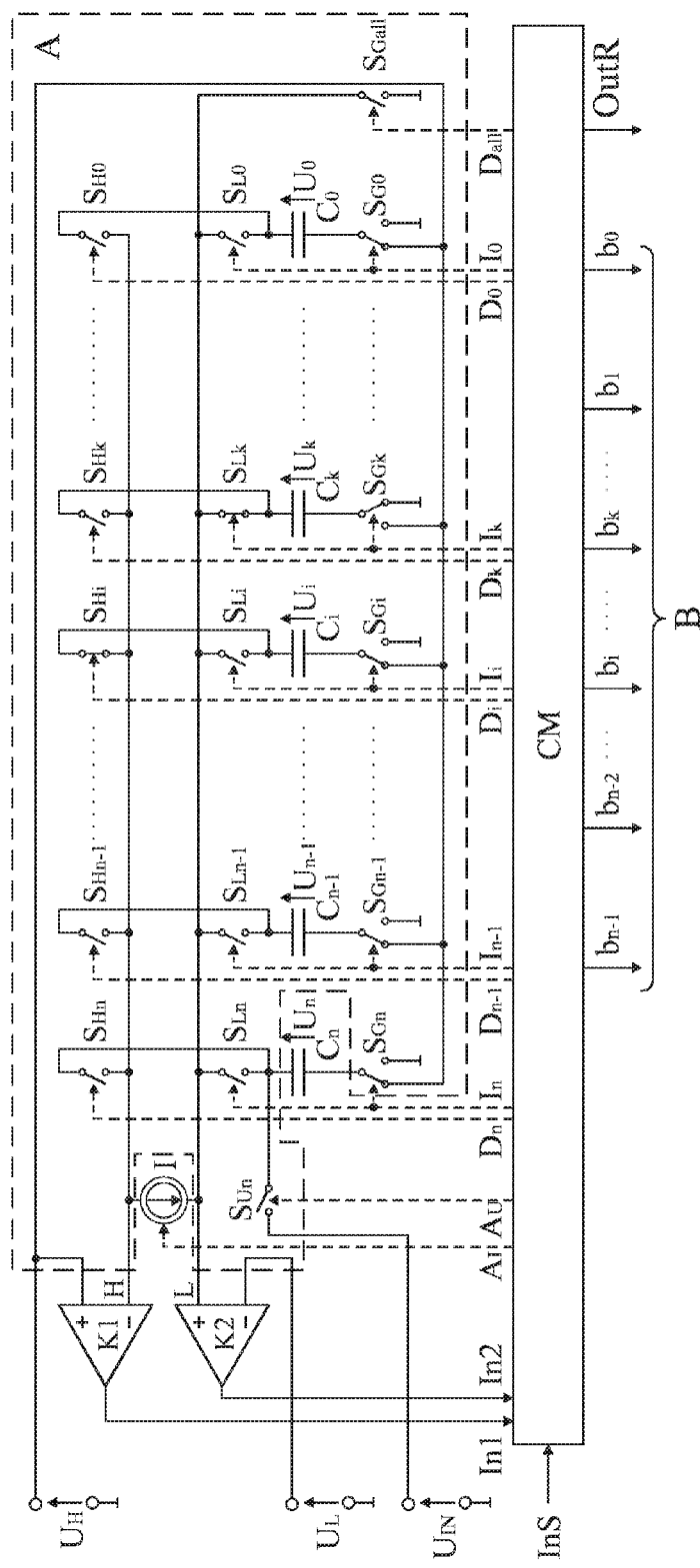

FIG. 5—illustrates the schematic diagram of the apparatus during the transfer of charge from the source capacitor $C_i$ to the destination capacitor $C_k$.

Figure 6:
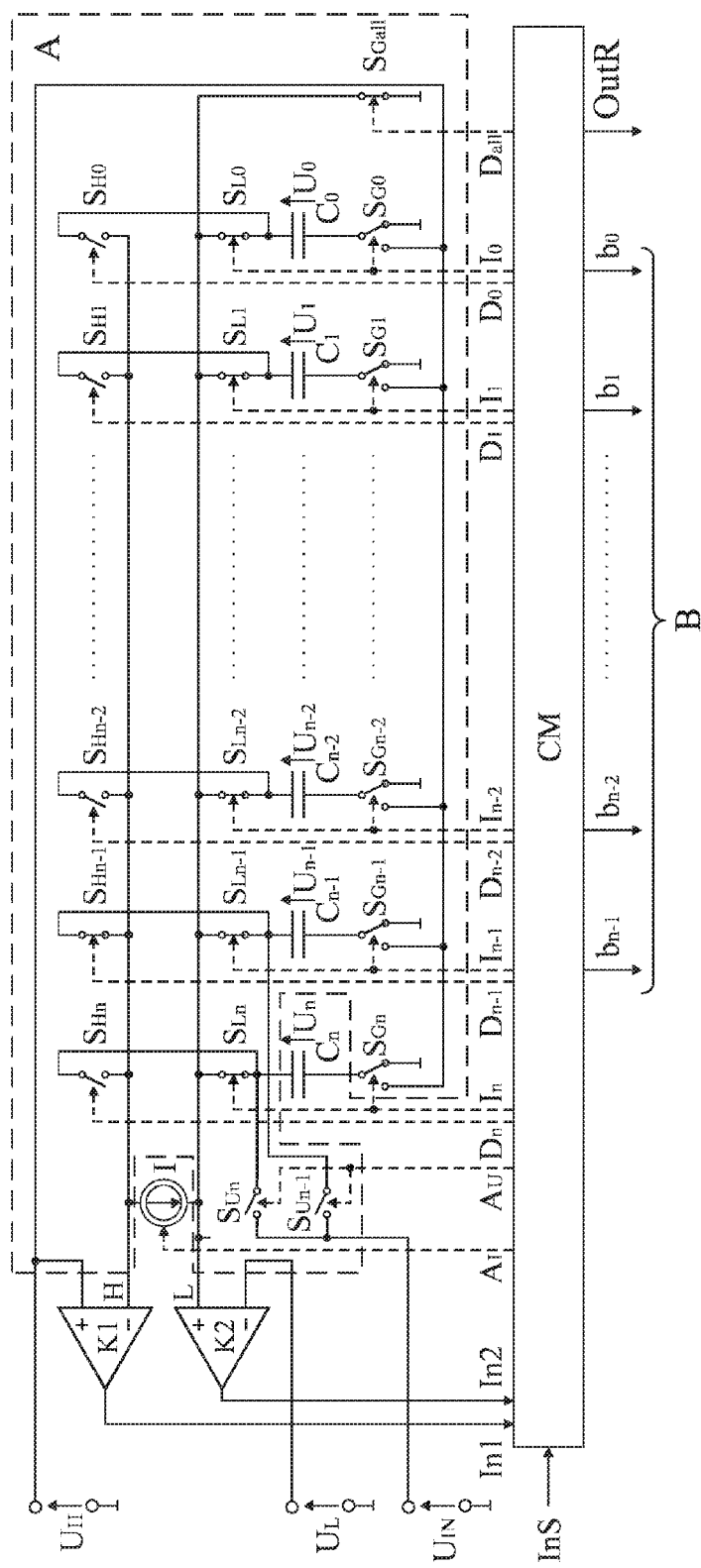

FIG. 6—illustrates the schematic diagram of the another version of the apparatus in the relaxation phase.

Figure 7:
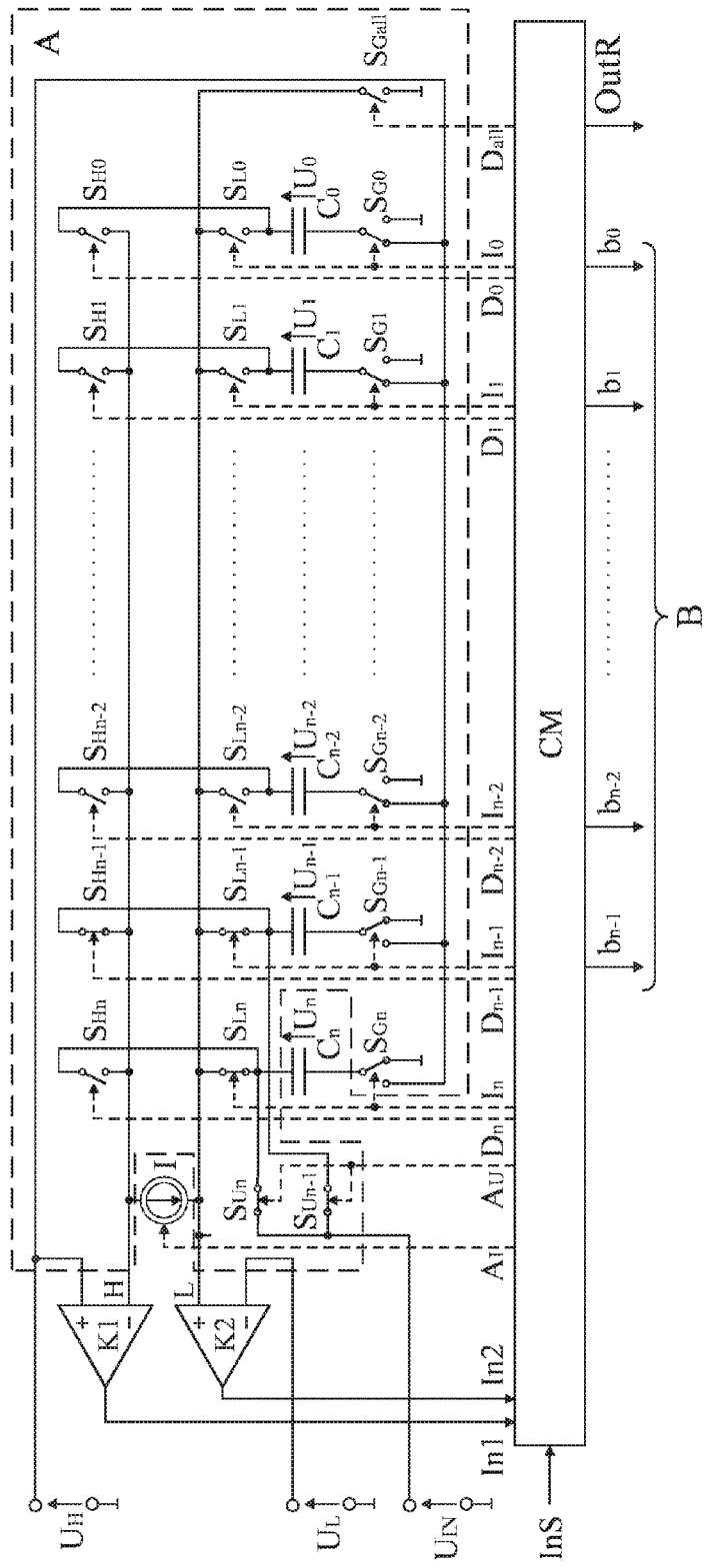

FIG. 7—illustrates the schematic diagram of the another version of the apparatus at time of starting the conversion cycle: charge accumulation both in the sampling capacitor $C_n$ and in the capacitor $C_{n-1}$ connected both in parallel to the source of the converted voltage $U_{IN}$.

Figure 8:
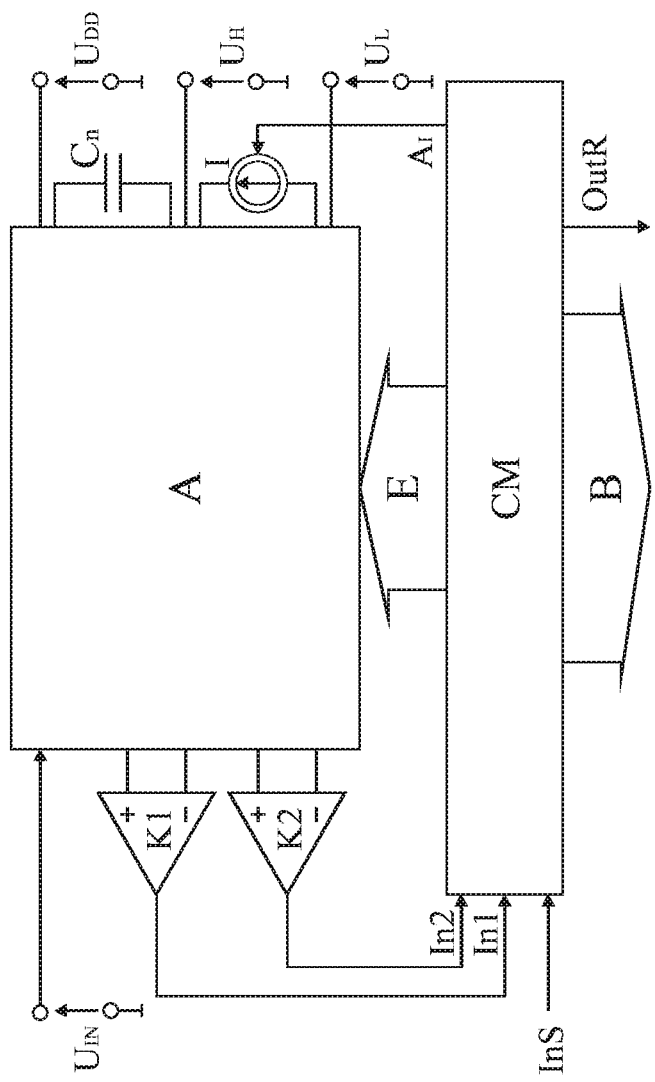

FIG. 8—illustrates the block diagram of the another variant of the apparatus.

Figure 9:
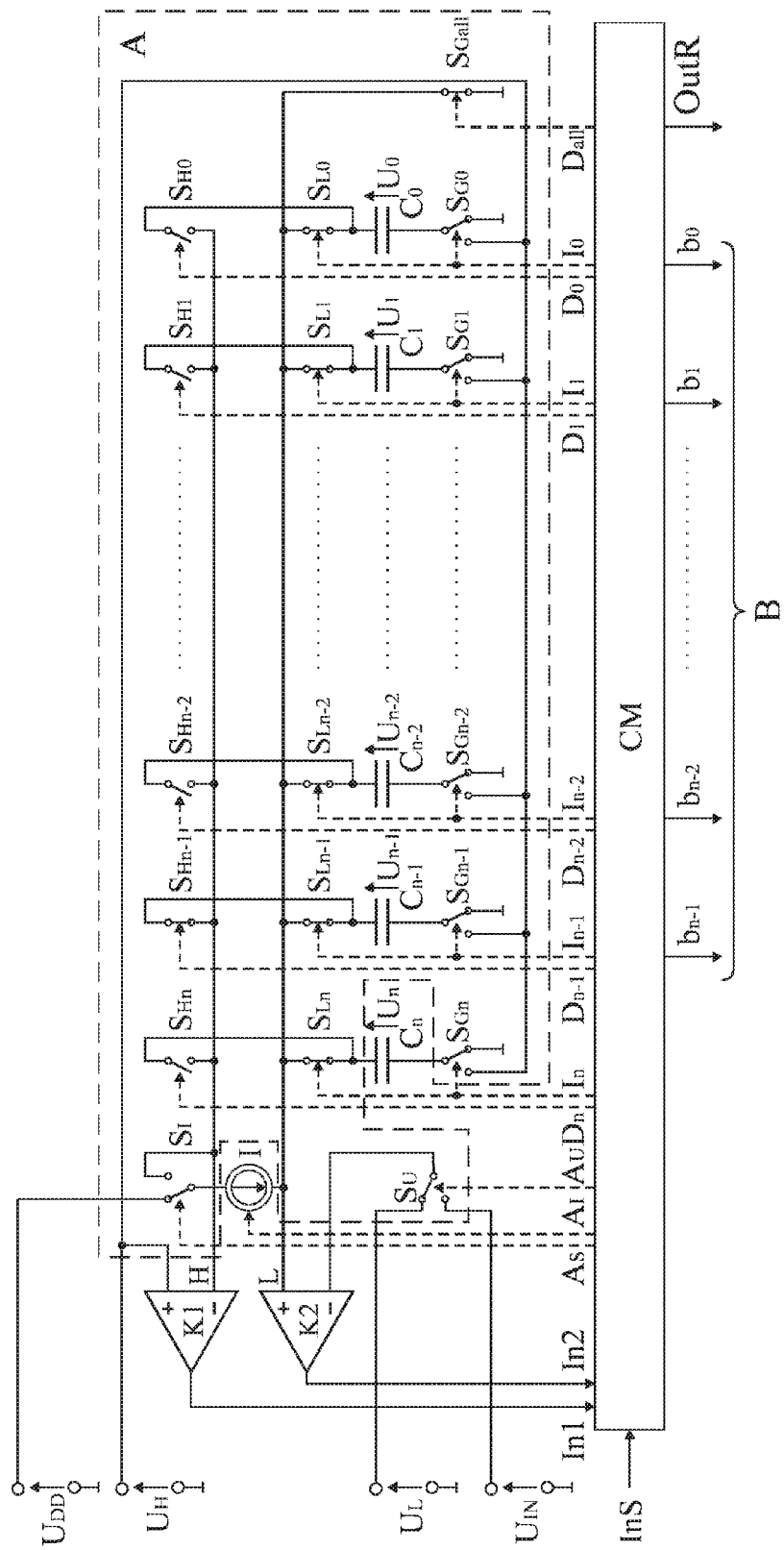

FIG. 9—illustrates the schematic diagram of the another variant of the apparatus in the relaxation phase.

Figure 10:
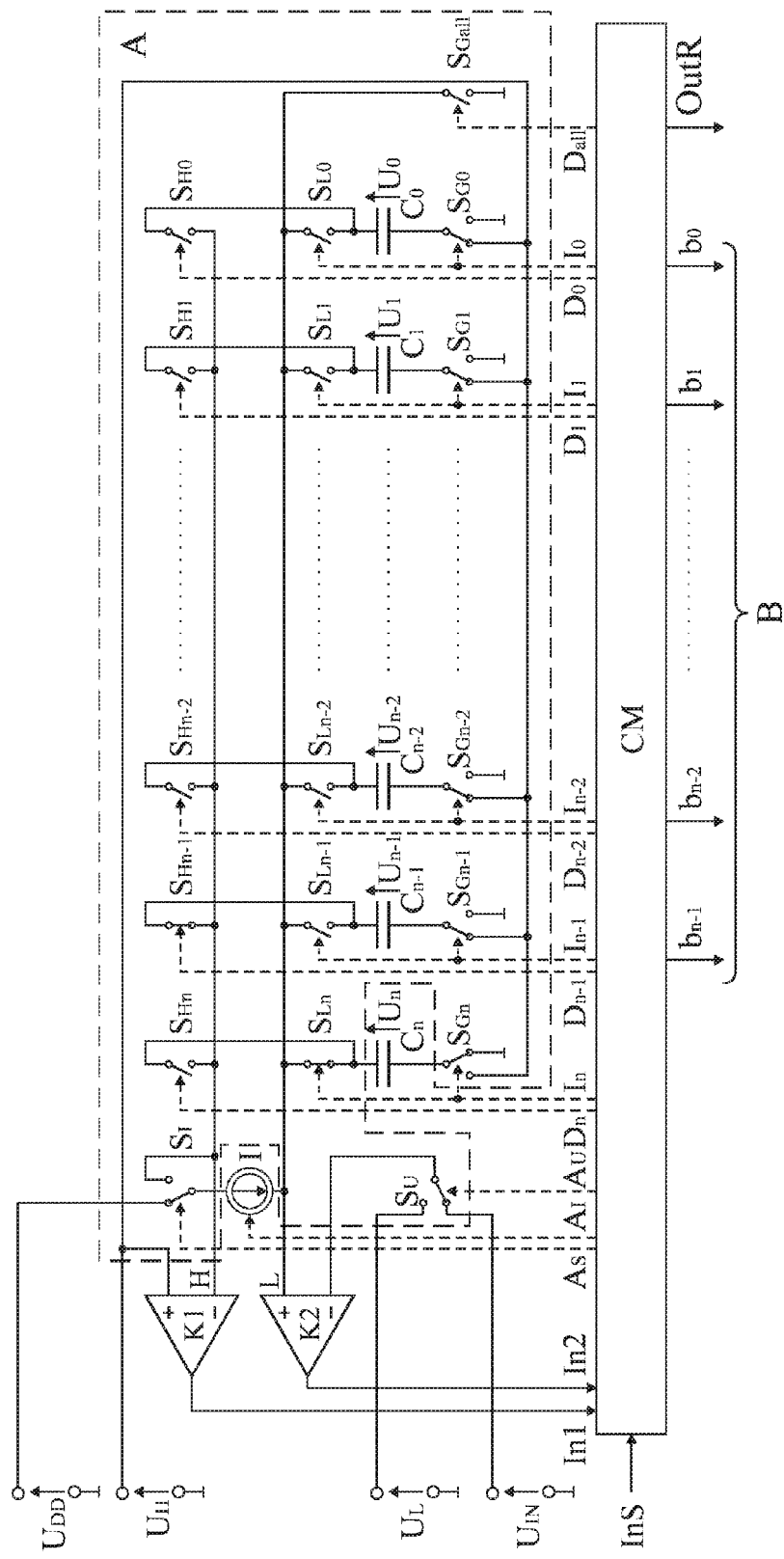

FIG. 10—illustrates the schematic diagram of the another variant of the apparatus at time of starting the conversion cycle: accumulation of charge delivered by the use of the current source I in the sampling capacitor $C_n$.

Figure 11:
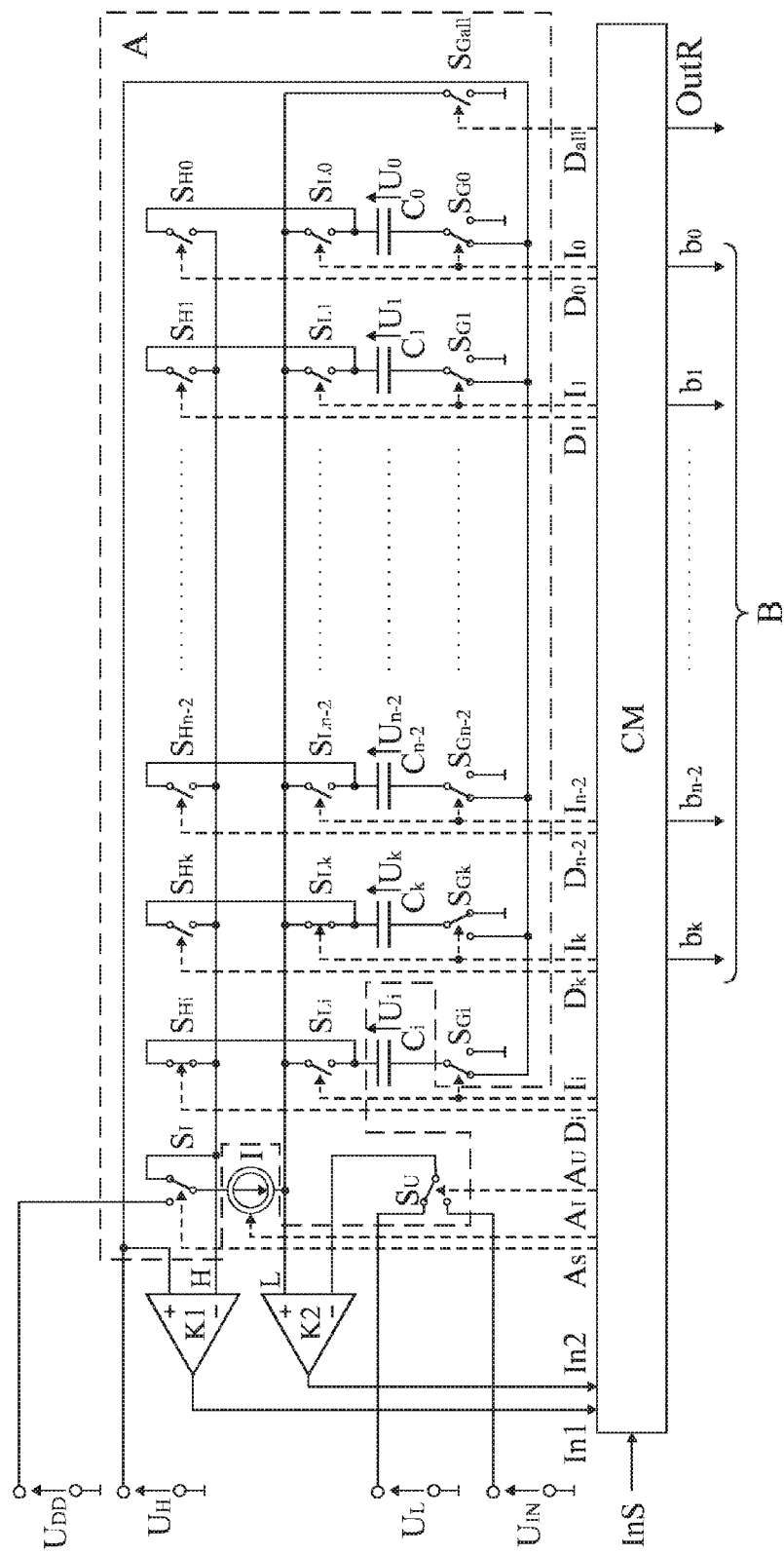

FIG. 11—illustrates the schematic diagram of the another version of the apparatus during the transfer of charge from the source capacitor $C_i$ to the destination capacitor $C_k$ for i=n and k=n−1.

Figure 12:
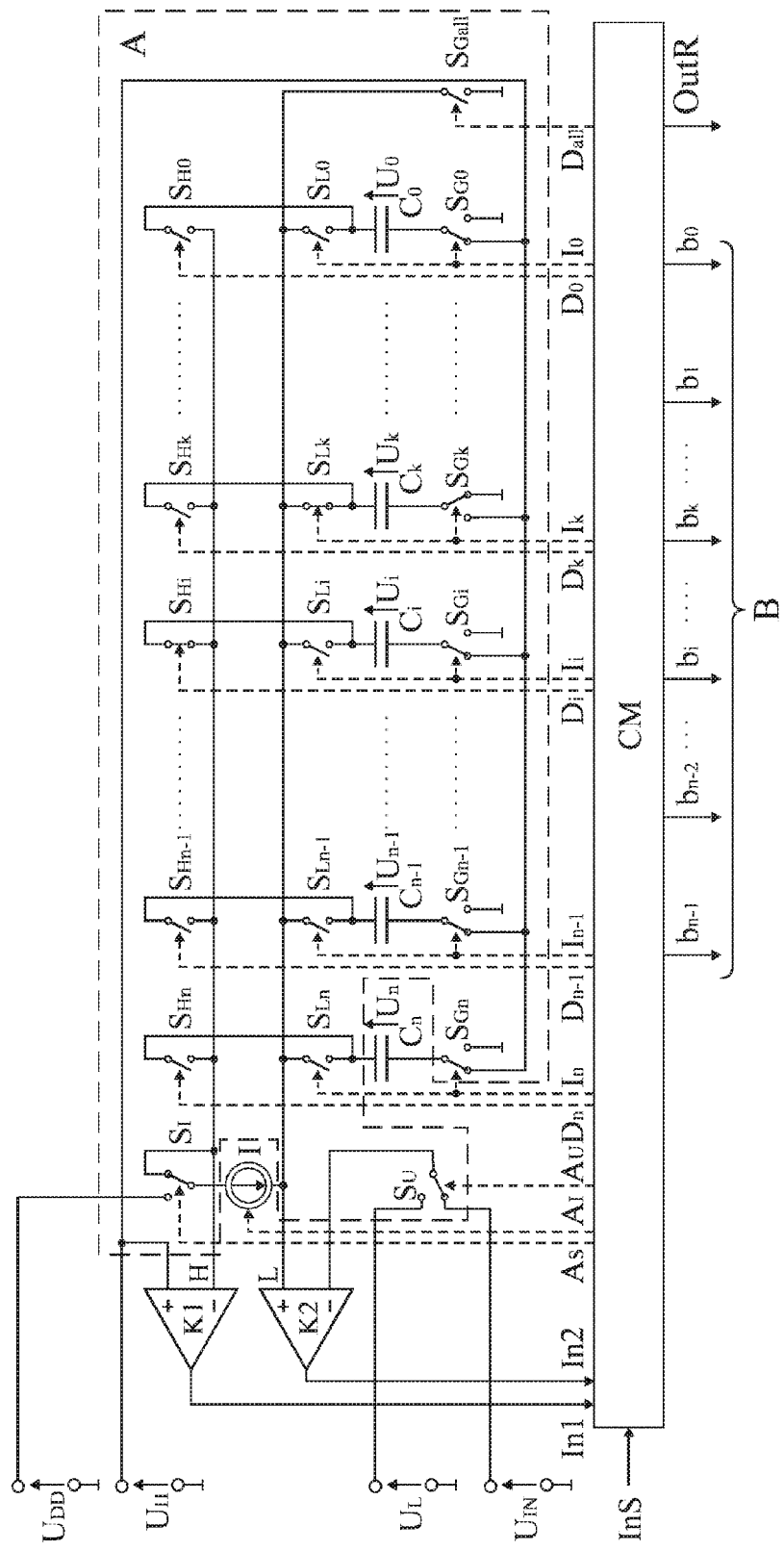

FIG. 12—illustrates the schematic diagram of the another version of the apparatus during the transfer of charge from the source capacitor $C_i$ to the destination capacitor $C_k$.

Figure 13:
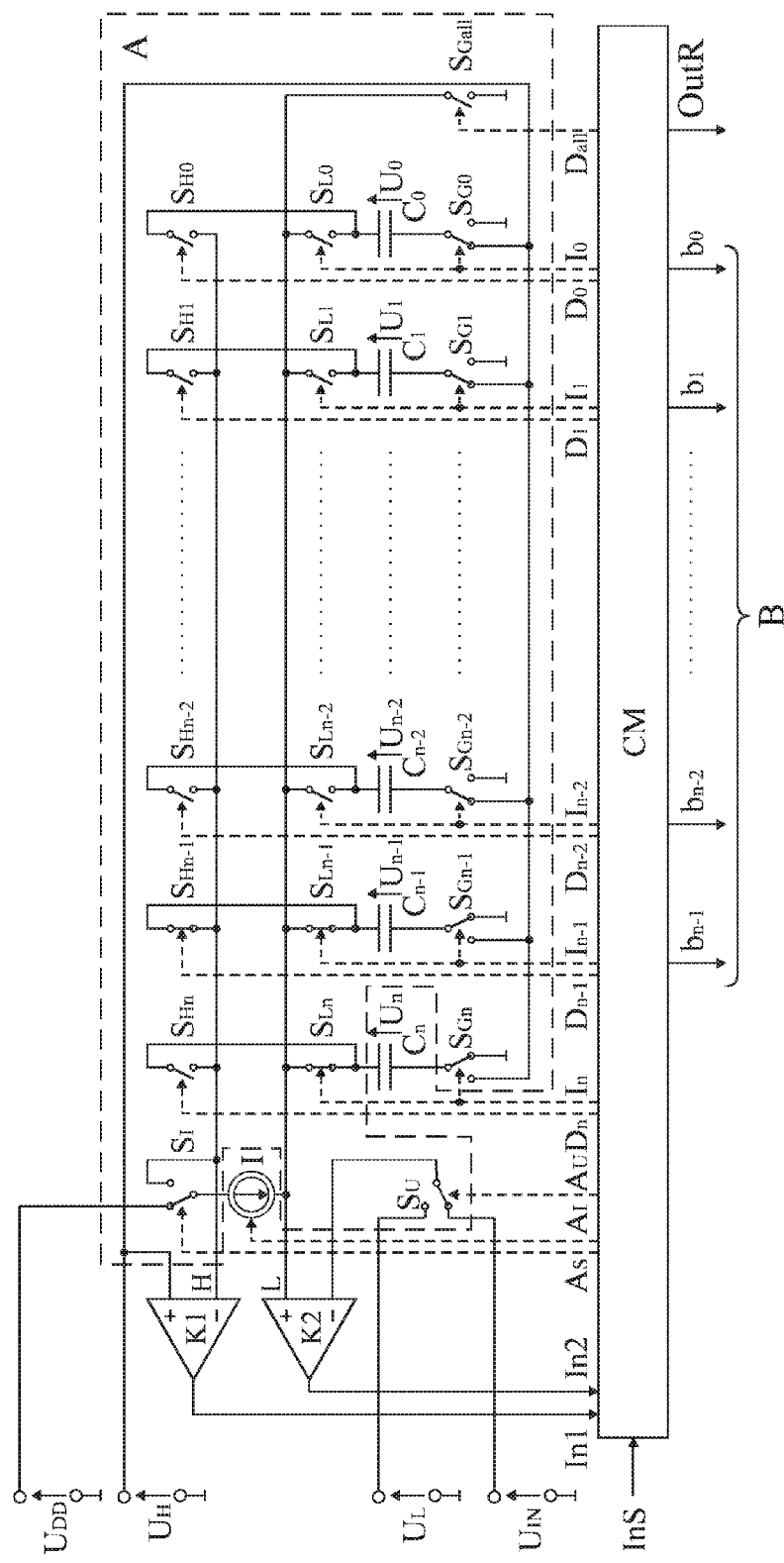

FIG. 13—illustrates the schematic diagram of the another version of the other apparatus variant at time of starting the conversion cycle: accumulation of charge delivered by the use of the current source I both in the sampling capacitor $C_n$ and in the capacitor $C_{n-1}$ connected in parallel.

Figure 14:
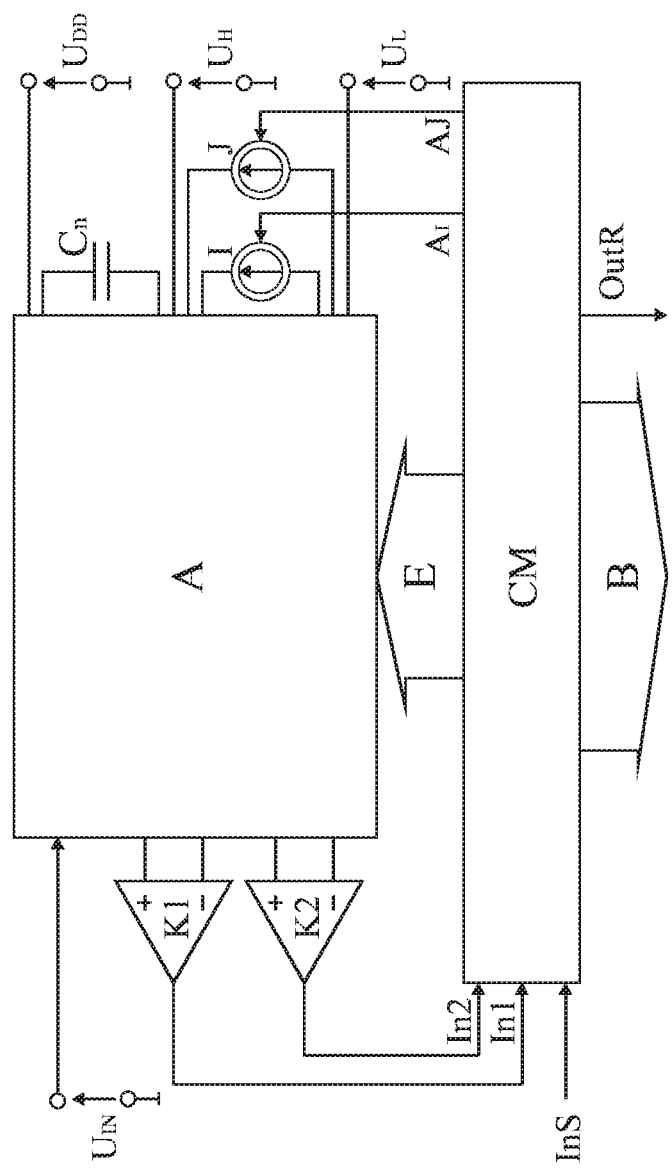

FIG. 14—illustrates the block diagram of the another variant of the apparatus.

Figure 15:
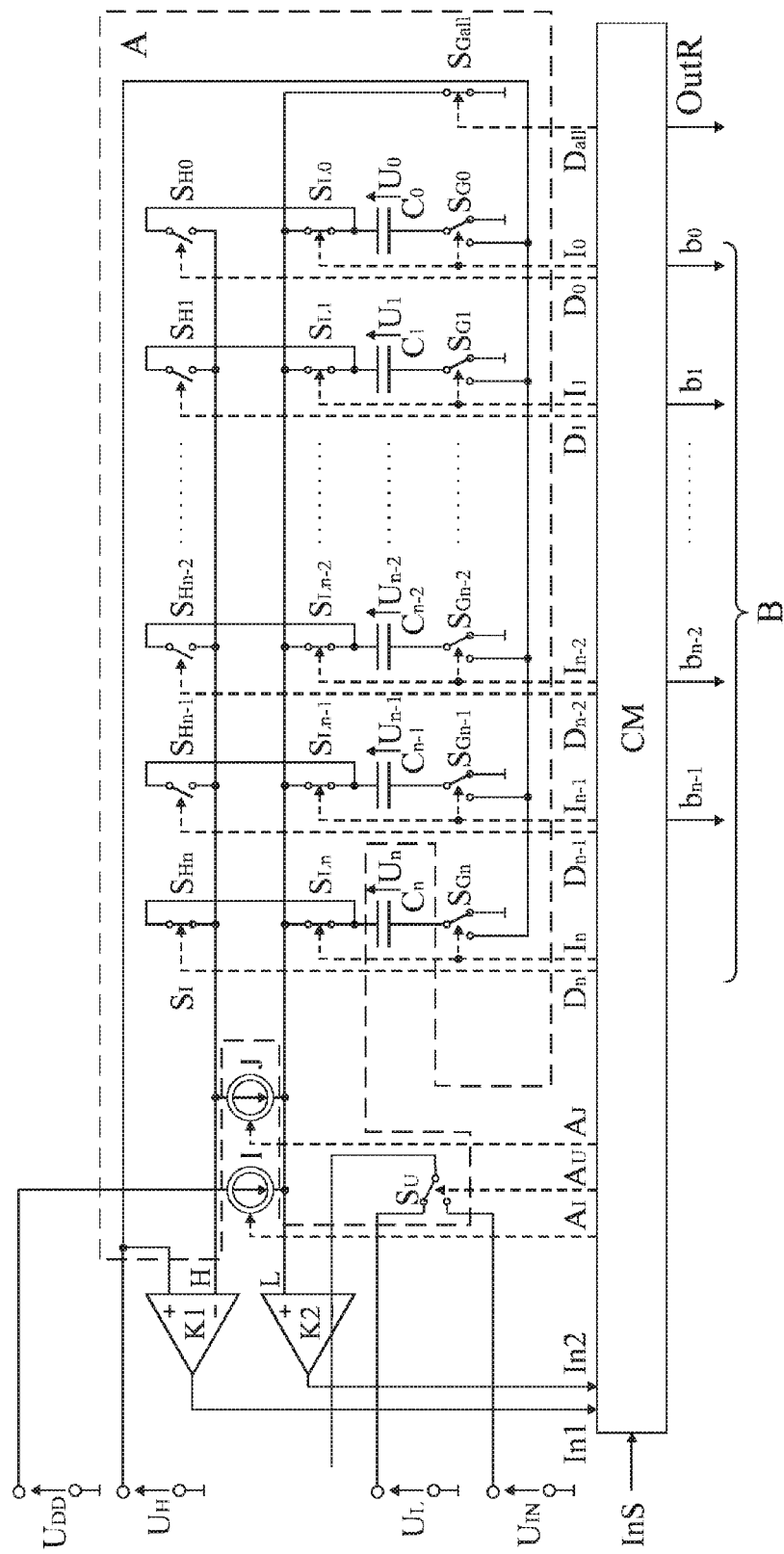

FIG. 15—illustrates the schematic diagram of the another variant of the apparatus in the relaxation phase.

Figure 16:
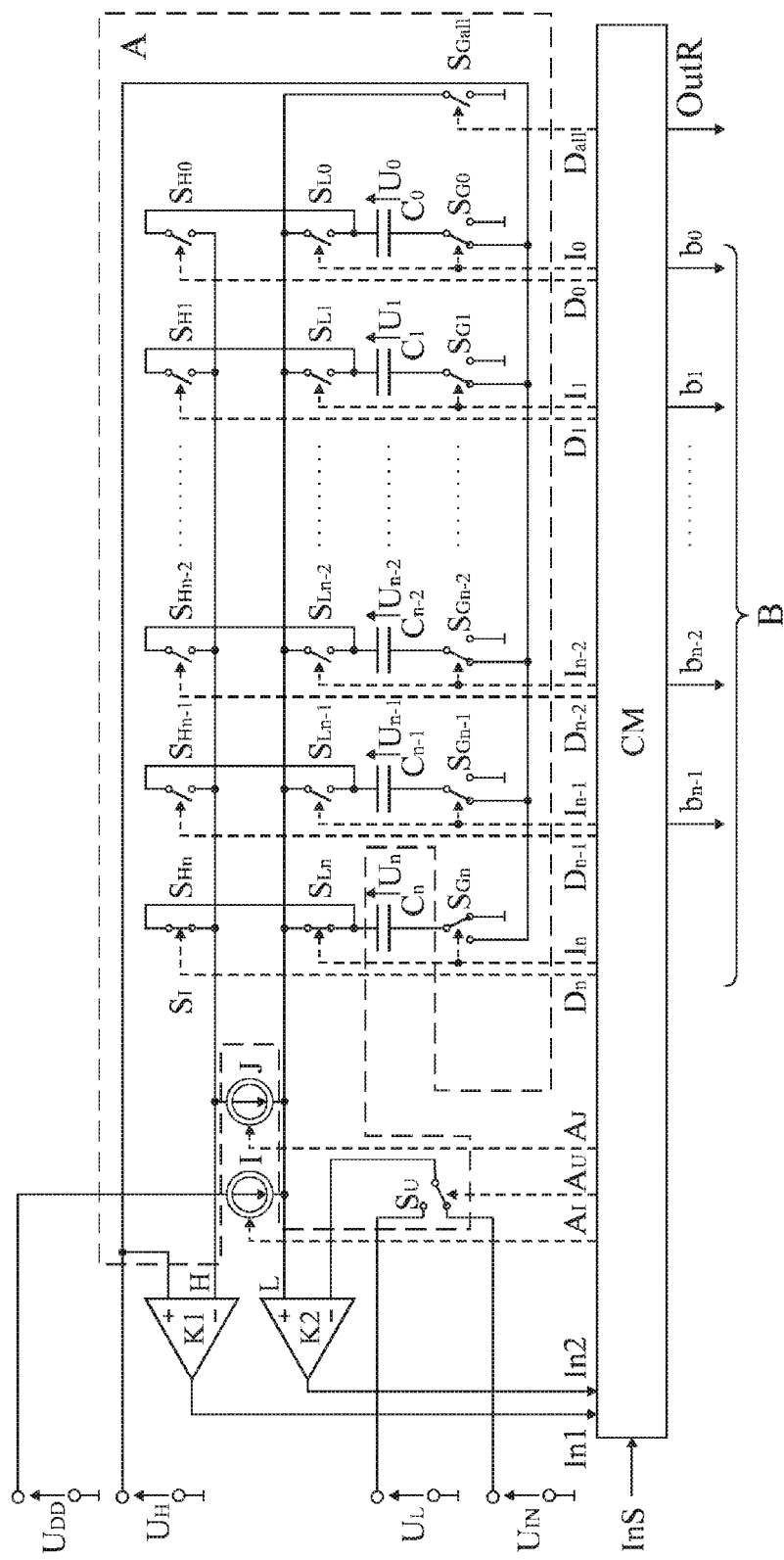

FIG. 16—illustrates the schematic diagram of the another variant of the apparatus at time of starting the conversion cycle: accumulation of charge delivered by the use of the current source I in the sampling capacitor $C_n$.

Figure 17:
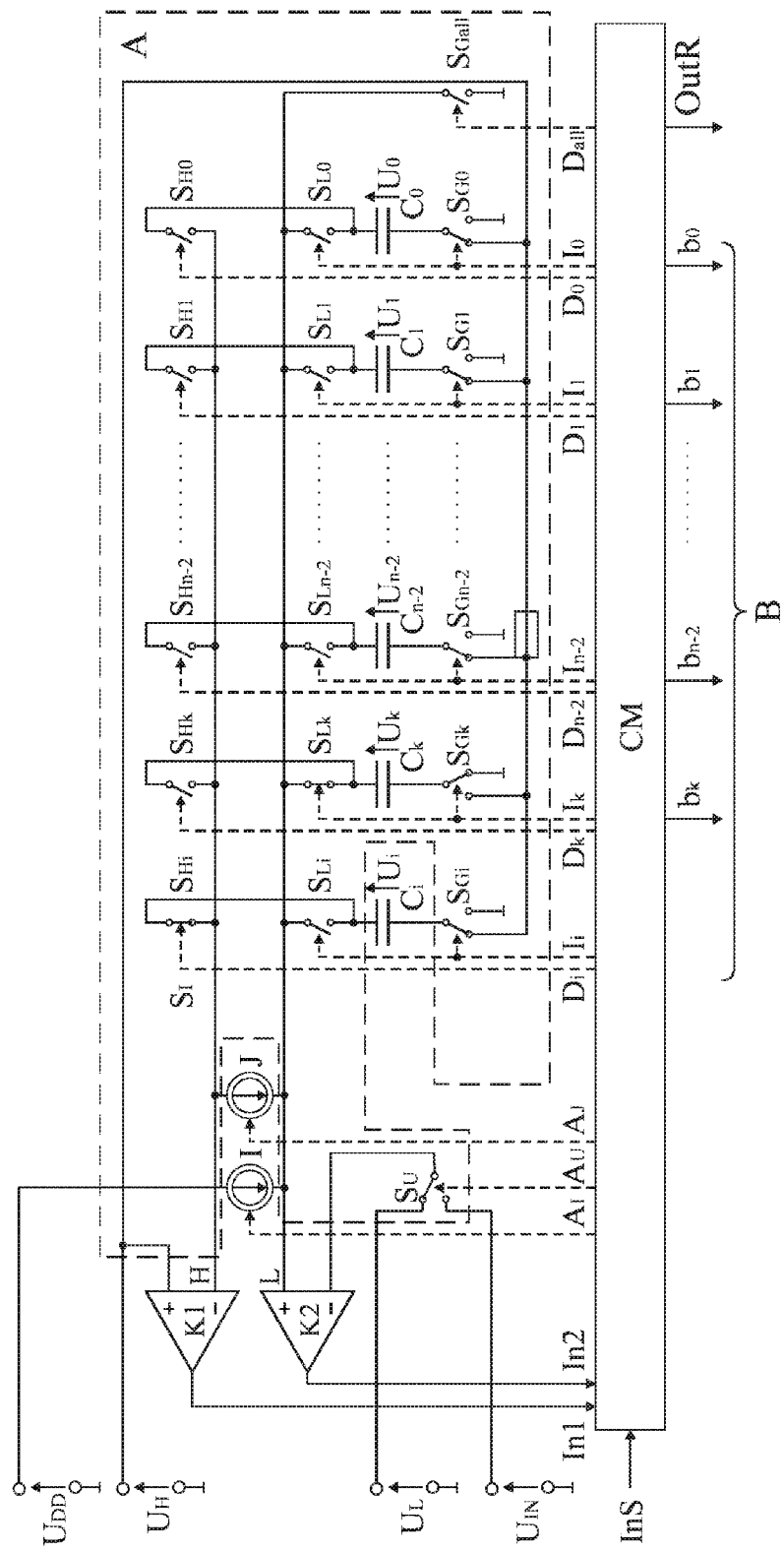

FIG. 17—illustrates the schematic diagram of the another version of the apparatus during the transfer of charge from the source capacitor $C_i$ to the destination capacitor $C_k$ for i=n and k=n−1.

Figure 18:
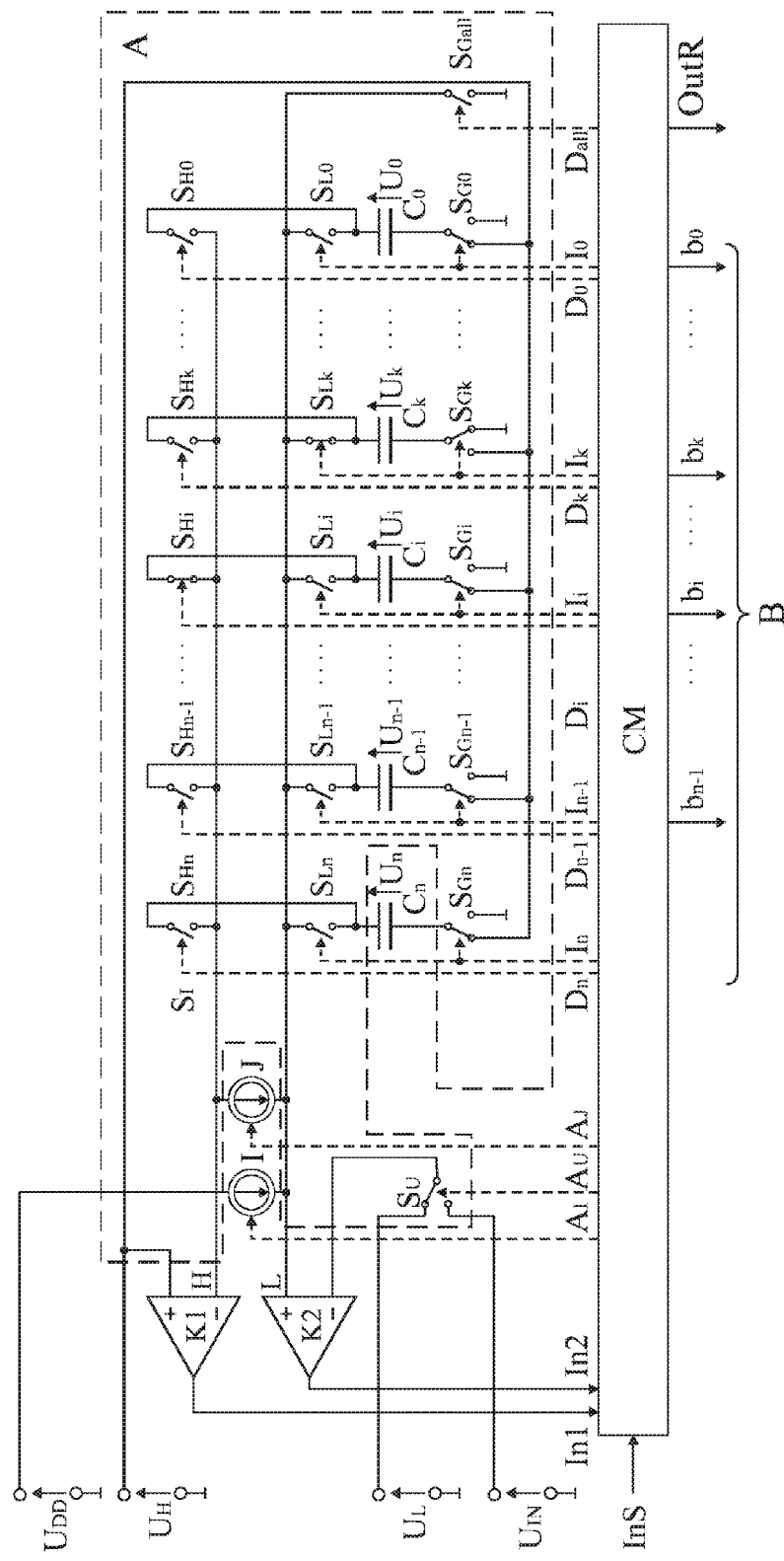

FIG. 18—illustrates the schematic diagram of the another version of the apparatus during the transfer of charge from the source capacitor $C_i$ to the destination capacitor $C_k$.

Figure 19:
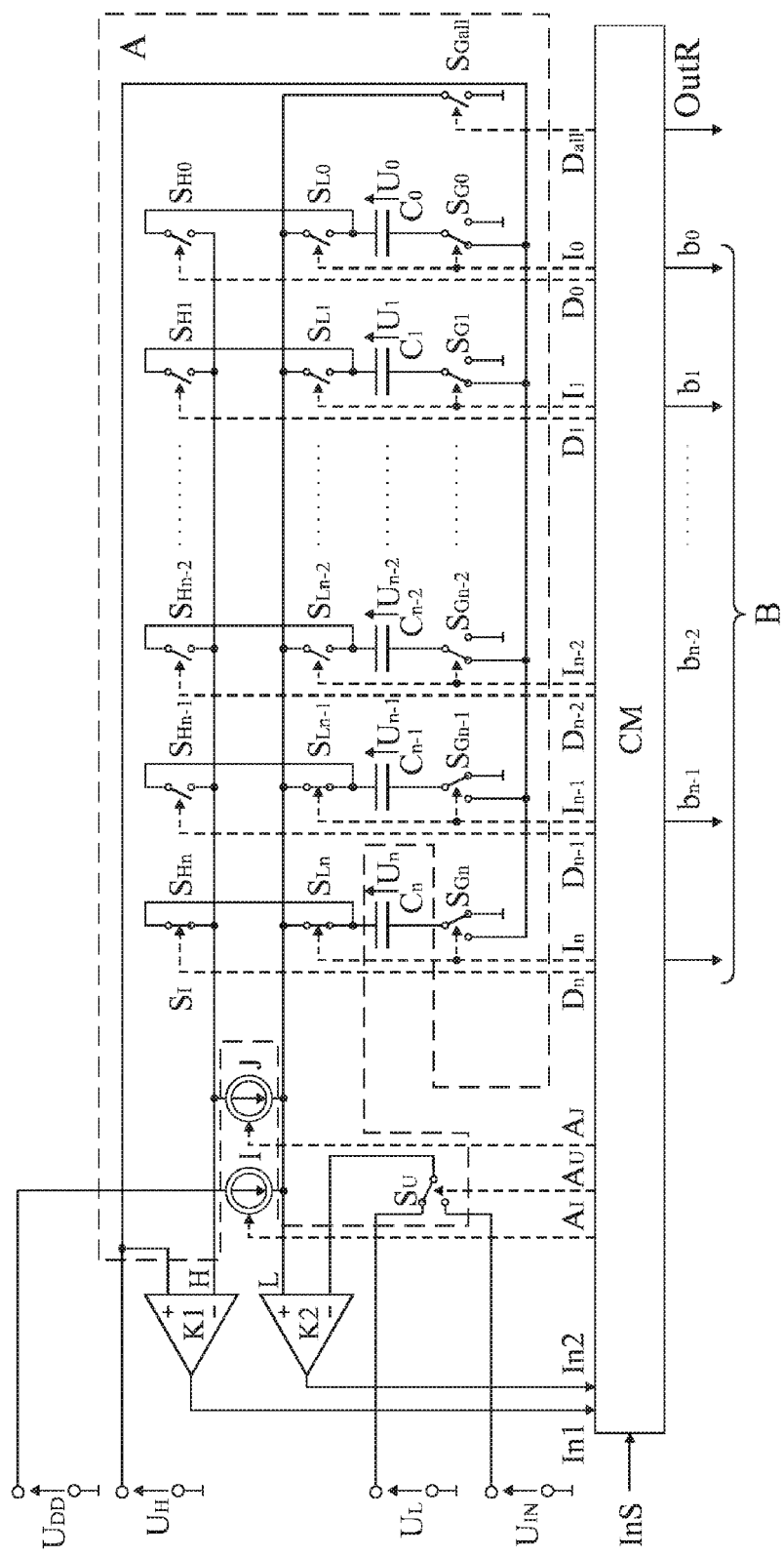

FIG. 19—illustrates the schematic diagram of the another version of the other apparatus variant at time of starting the conversion cycle: accumulation of charge delivered by the use of the current source I both in the sampling capacitor $C_n$ and in the capacitor $C_{n-1}$ connected in parallel.

The method according to the invention consists in that after detecting the beginning of the active state of the signal on the trigger input InS by means of the control module CM, the converted voltage value is mapped to the portion of electric charge proportional to this converted voltage value, and the portion of charge is accumulated in the sampling capacitor $C_n$ by connecting the sampling capacitor $C_n$ in parallel to the source of the converted voltage $U_{IN}$ during the active state of the signal on the trigger input InS, while the duration of the active state of the signal on the trigger input InS is not shorter than the assumed minimum value. After detecting the end of the active state of the signal on the trigger input InS by means of the control module CM, the function of the source capacitor $C_i$ whose, index is defined by the content of the source capacitor $C_i$ index register in the control module, CM is assigned by means of the control module CM to the sampling capacitor $C_n$ by writing the value of the index of the sampling capacitor $C_n$ to the source capacitor $C_i$ index register, and at the same time the function of the destination capacitor $C_k$, whose index is defined by the content of the destination capacitor $C_k$ index register in the control module CM, is assigned by means of the control module CM to the capacitor $C_{n-1}$ having the highest capacitance value in the array A of capacitors while a capacitance value of each capacitor $C_{n-1}$, $C_{n-2}$, ..., $C_1$, $C_0$ of a given index is twice as high as a capacitance value of the capacitor of the previous index, by writing the value of the index of the capacitor $C_{n-1}$ to the destination capacitor $C_k$ index register. Afterwards, the process of redistribution of the accumulated charge in capacitors $C_{n-1}$, $C_{n-2}$, ..., $C_1$, $C_0$ in the array A is realized during which charge accumulated in the source capacitor $C_i$ is transferred to the destination capacitor $C_k$ by the use of the current source I, and at the same time the voltage $U_k$ increasing on the destination capacitor $C_k$ is compared to the reference voltage $U_L$ value by the use of the second comparator K2, and also the voltage $U_i$ on the source capacitor $C_i$ is observed by the use of the first comparator K1. When the voltage $U_i$ on the source capacitor $C_i$ observed by the use of the first comparator K1 equals zero during the charge transfer, the function of the source capacitor $C_i$ is assigned to the current destination capacitor $C_k$ by means of the control module CM on the basis of the output signal of the first comparator K1 by writing the current content of the destination capacitor $C_k$ index register in the control module CM to the source capacitor $C_i$ index register in the control module CM, and also the function of the destination capacitor $C_k$ is assigned to the subsequent capacitor in the array A whose capacitance value is twice lower than the capacitance value of the capacitor that operated as the destination capacitor directly before by reducing the content of the destination capacitor $C_k$ index register by one, and charge transfer from a new source capacitor $C_i$ to a new destination capacitor $C_k$ is continued by the use of the current source I. When the voltage $U_k$ on the destination capacitor $C_k$ observed by the use of the second comparator K2 equals the reference voltage $U_L$ value during the transfer of charge from the source capacitor $C_i$ to the destination capacitor $C_k$, the function of the destination capacitor $C_k$ is assigned by means of the control module CM on the basis of the output signal of the second comparator K2 to the subsequent capacitor in the array A whose capacitance value is twice lower than the capacitance value of the capacitor that operated as the destination capacitor directly before by reducing the content of the destination capacitor $C_k$ index register by one, and also the charge transfer from the source capacitor $C_i$ to a new destination capacitor $C_k$ is continued. This process is still controlled by means of the control module CM on the basis of the output signals of the comparators K1 and K2 until the voltage $U_i$ on the source capacitor $C_i$ observed by the use of the first comparator K1 equals zero during the period in which the function of the destination capacitor $C_k$ is assigned to the capacitor $C_0$ having the lowest capacitance value in the array A of capacitors, or the voltage $U_0$ increasing on the capacitor $C_0$ and observed at the same time by the use of the second comparator K2 equals the reference voltage $U_L$ value. The value one is assigned to these bits $b_{n-1}$, $b_{n-2}$, ..., $b_1$, $b_0$ in the digital word corresponding to the capacitors $C_{n-1}$, $C_{n-2}$, ..., $C_1$, $C_0$ in the array A of capacitors on which the voltage equal to the reference voltage $U_L$, value has been obtained, and the value zero is assigned to the other bits by means of the control module CM.

In the another variant of the method, after detecting the beginning of the active state of the signal on the trigger input InS by means of the control module CM, electric charge is accumulated in the capacitor $C_{n-1}$ having the highest capacitance value in the array A of capacitors and at the same time in the sampling capacitor $C_n$ connected in parallel to the capacitor $C_{n-1}$ in the array A of capacitors where the capacitance value of the sampling capacitor $C_n$ is not smaller than the capacitance value of the capacitor $C_{n-1}$, by connecting at the same time both capacitors $(C_n)$ and $(C_{n-1})$ in parallel to the source of the converted voltage $U_{IN}$ during the active state of the signal on the trigger input InS. After detecting the end of the active state of the signal on the trigger input InS by means of the control module CM, the function of the source capacitor $C_i$, whose index is defined by the content of the source capacitor $C_i$ index register in the control module CM, is assigned by means of the control module CM to the sampling capacitor $C_n$ by writing the value of the index of the sampling capacitor $C_n$ to the source capacitor $C_i$ index register. At the same time, the function of the destination capacitor $C_k$, whose index is defined by the content of the destination capacitor $C_k$ index register in the control module CM, is assigned by means of the control module CM to the capacitor $C_{n-1}$ having the highest capacitance value in the array A of capacitors by writing the value of the index of the capacitor $C_{n-1}$ to the destination capacitor $C_k$ index register. After that the process of charge transfer from the source capacitor $C_i$ to the destination capacitor $C_k$ is realized by the use of the current source I. This process is controlled by means of the control module CM on the basis of the output signals of the comparators K1 and K2 until the voltage $U_i$ on the current source capacitor $C_i$ observed by the use of the first comparator K1 equals zero during the period in which the function of the destination capacitor $C_k$ is assigned to the capacitor $C_0$ having the lowest capacitance value in the array A of capacitors, or the voltage $U_0$, which increases on the capacitor $C_0$ and is simultaneously observed by the use of the second comparator K2, equals the reference voltage $U_L$ value.

In the another variant of the method, after detecting the beginning of the active state of the signal on the trigger input InS by means of the control module CM, electric charge is delivered by the use of the current source I and accumulated in the sampling capacitor $C_n$, and at the same time the voltage $U_n$ increasing on the sampling capacitor $C_n$ is compared to the converted voltage $U_{IN}$ value by the use of the second comparator K2. This process is realized until the voltage $U_n$, which increases on the sampling capacitor $C_n$ equals the converted voltage $U_{IN}$ value. After that, the function of the source capacitor $C_i$ whose index is defined by the content of the source capacitor $C_i$ index register in the control module CM is assigned by means of the control module CM to the sampling capacitor $C_n$ by writing the value of the index of the sampling capacitor $C_n$ to the source capacitor $C_i$ index register. At the same time, the function of the destination capacitor $C_k$, whose index is defined by the content of the destination capacitor $C_k$ index register in the control module CM, is assigned by means of the control module CM to the capacitor $C_{n-1}$ having the highest capacitance value in the array A of capacitors by writing the value of the index of the capacitor $C_{n-1}$ to the destination capacitor $C_k$ index register. After that the process of electric charge transfer from the source capacitor $C_i$ to the destination capacitor $C_k$ is realized by the use of the current source I. This process is controlled by means of the control module CM on the basis of the output signals of the comparators K1 and K2 until the voltage $U_i$ on the current source capacitor $C_i$ observed by the use of the first comparator K1 equals zero during the period in which the function of the destination capacitor $C_k$ is assigned to the capacitor $C_0$ having the lowest capacitance value in the array A of capacitors, or the voltage $U_0$, which increases on the capacitor $C_0$ and is simultaneously observed by the use of the second comparator K2, equals the reference voltage $U_L$ value.

In the another variant of the method, after detecting the beginning of the active state of the signal on the trigger input InS by means of the control module CM, electric charge is delivered by the use of the current source I and accumulated in the capacitor $C_{n-1}$ having the highest capacitance value in the array A of capacitors and at the same time in the sampling capacitor $C_n$ connected in parallel to the capacitor $C_{n-1}$ in the array A of capacitors where the capacitance value of the sampling capacitor $C_n$ is not smaller than the capacitance value of the capacitor $C_{n-1}$, and at the same time the voltage $U_n$ increasing on the sampling capacitor $C_n$ is compared to the converted voltage $U_{IN}$ value by the use of the second comparator K2. This process is realized until the voltage $U_n$, which increases on the sampling capacitor $C_n$ equals the converted voltage $U_{IN}$ value, and after that the function of the source capacitor $C_i$, whose index is defined by the content of the source capacitor $C_i$ index register in the control module CM, is assigned by means of the control module CM to the sampling capacitor $C_n$ by writing the value of the index of the sampling capacitor $C_n$ to the source capacitor $C_i$ index register. At the same time, the function of the destination capacitor $C_k$, whose index is defined by the content of the destination capacitor $C_k$ index register in the control module CM, is assigned by means of the control module CM to the capacitor $C_{n-1}$ having the highest capacitance value in the array A of capacitors by writing the value of the index of the capacitor $C_{n-1}$ to the destination capacitor $C_k$ index register. After that, the process of charge transfer from the source capacitor $C_i$ to the destination capacitor $C_k$ is realized by the use of the current source I. This process is controlled by means of the control module CM on the basis of the output signals of the comparators K1 and K2 until the voltage $U_i$ on the current source capacitor $C_i$ observed by the use of the first comparator K1 equals zero during the period in which the function of the destination capacitor $C_k$ is assigned to the capacitor $C_0$ having the lowest capacitance value in the array A of capacitors, or the voltage $U_0$, which increases on the capacitor $C_0$ and is simultaneously observed by the use of the second comparator K2, equals the reference voltage $U_L$ value.

In the another variant of the method, after detecting the beginning of the active state of the signal on the trigger input InS by means of the control module CM, electric charge is delivered by the use of the current source I and accumulated in the sampling capacitor $C_n$, and at the same time the voltage $U_n$ increasing on the sampling capacitor $C_n$ is compared to the converted voltage $U_{IN}$ value by the use of the second comparator K2. This process is realized until the voltage $U_n$, which increases on the sampling capacitor $C_n$ equals the converted voltage $U_{IN}$ value. After that, the function of the source capacitor $C_i$, whose index is defined by the content of the source capacitor $C_i$ index register in the control module CM, is assigned by means of the control module CM to the sampling capacitor $C_n$ by writing the value of the index of the sampling capacitor $C_n$ to the source capacitor $C_i$ index register. At the same time, the function of the destination capacitor $C_k$, whose index is defined by the content of the destination capacitor $C_k$ index register in the control module CM, is assigned by means of the control module CM to the capacitor $C_{n-1}$ having the highest capacitance value in the array A of capacitors by writing the value of the index of the capacitor $C_{n-1}$ to the destination capacitor $C_k$ index register. After that, the process of redistribution of accumulated charge is realized during which charge is transferred from the source capacitor $C_i$ to the destination capacitor $C_k$ by the use of the additional current source J whose effectiveness is different from the effectiveness of the current source I. The process of charge redistribution is controlled by means of the control module CM on the basis of the output signals of the comparators K1 and K2 until the voltage $U_i$ on the current source capacitor $C_i$ observed by the use of the first comparator K1 equals zero during the period in which the function of the destination capacitor $C_k$ is assigned to the capacitor $C_0$ having the lowest capacitance value in the array A of capacitors, or the voltage $U_0$, which increases on the capacitor $C_0$ and is simultaneously observed by the use of the second comparator K2, equals the reference voltage $U_L$ value.

In the another variant of the method, after detecting the beginning of the active state of the signal on the trigger input InS by means of the control module CM, electric charge is delivered by the use of the current source I and accumulated in the capacitor $C_{n-1}$ having the highest capacitance value in the array A of capacitors and at the same time in the sampling capacitor $C_n$ connected in parallel to the capacitor $C_{n-1}$ in the array A of capacitors where the capacitance value of the sampling capacitor $C_n$ is not smaller than the capacitance value of the capacitor $C_{n-1}$, and at the same time the voltage $U_n$ increasing on the sampling capacitor $C_n$ is compared to the converted voltage $U_{IN}$ value by the use of the second comparator K2. This process is realized until the voltage $U_n$, which increases on the sampling capacitor $C_n$ equals the converted voltage $U_{IN}$ value. After that, the function of the source capacitor $C_i$, whose index is defined by the content of the source capacitor $C_i$ index register in the control module CM, is assigned by means of the control module CM to the sampling capacitor $C_n$ by writing the value of the index of the sampling capacitor $C_n$ to the source capacitor $C_i$ index register. At the same time, the function of the destination capacitor $C_k$ whose index is defined by the content of the destination capacitor $C_k$ index register in the control module CM, is assigned by means of the control module CM to the capacitor $C_{n-1}$ having the highest capacitance value in the array A of capacitors by writing the value of the index of the capacitor $C_{n-1}$ to the destination capacitor $C_k$ index register. After that, the process of redistribution of accumulated charge is realized during which charge is transferred from the source capacitor $C_i$ to the destination capacitor $C_k$ by the use of the additional current source J whose effectiveness is different from the effectiveness of the current source I. The process of charge redistribution is controlled by means of the control module CM on the basis of the output signals of the comparators K1 and K2 until the voltage $U_i$ on the current source capacitor $C_i$ observed by the use of the first comparator K1 equals zero during the period in which the function of the destination capacitor $C_k$ is assigned to the capacitor $C_0$ having the lowest capacitance value in the array A of capacitors, or the voltage $U_0$, which increases on the capacitor $C_0$ and is simultaneously observed by the use of the second comparator K2, equals the reference voltage $U_L$, value.

The apparatus according to the invention comprises an array of capacitors with which the converted voltage $U_{IN}$ and the set of control outputs E of the control module CM. The control module CM is equipped with the digital output B, the complete conversion signal output OutR, the trigger input InS and two control inputs In1 and In2 where the first control input In1 is connected to the output of the first comparator K1 whose inputs are connected to one pair of outputs of the array A of capacitors, and the other control input In2 of the control module CM is connected to the output of the second comparator K2 whose inputs are connected to the other pair of outputs of the array A. Furthermore, the source of auxiliary voltage $U_H$ together with the source of the reference voltage $U_L$, the sampling capacitor $C_n$ and the controlled current source I are connected to the array A of capacitors, and the control input of the current source I is connected to the control output $A_I$ of the control module CM.

The array A in this variant of the apparatus comprises a number of n capacitors $C_{n-1}, C_{n-2}, \ldots, C_1, C_0$, and a capacitance value of a capacitor of a given index is twice as high as a capacitance value of the capacitor of the previous index, while a relevant bit $b_{n-1}, b_{n-2}, \ldots, b_1, b_0$ in the digital output B of the control module CM is assigned to each capacitor $C_{n-1}, C_{n-2}, \ldots, C_1, C_0$. The sampling capacitor $C_n$ is connected to the array A of capacitors, while the top plate of the sampling capacitor $C_n$ is connected to the source of the converted voltage $U_{IN}$ through the closed voltage source on-off switch $S_{Un}$ and also it is connected through the closed first on-off switch $S_{Ln}$ to the first rail L with which the top plates of all the capacitors $C_{n-1}, C_{n-2}, \ldots, C_1, C_0$ in the array A of capacitors are connected through the open first on-off switches $S_{Ln-1}, S_{Ln-2}, \ldots, S_{L1}, S_{L0}$ in the array A. The top plate of the capacitor $C_{n-1}$ having the highest capacitance value in the array A of capacitors is also connected through the closed second on-off switch $S_{Hn-1}$ in the array A to the second rail H with which the top plate of the sampling capacitor $C_n$ is connected through the open second on-off switch $S_{Hn}$ and with which the top plates of the other capacitors $C_{n-2}, \ldots, C_1, C_0$ in the array A are also connected through the open second on-off switches $S_{Hn-2}, \ldots, S_{H1}, S_{H0}$ in the array A. The bottom plate of the sampling capacitor $C_n$ is connected to the ground of the circuit through the change-over switch $S_{Gn}$ whose moving contact is connected to its first stationary contact and the other stationary contact of the change-over switch $S_{Gn}$ is connected to the source of auxiliary voltage $U_H$ and also to the non-inverting input of the first comparator K1. The bottom plates of all the capacitors $C_{n-1}, C_{n-2}, \ldots, C_1, C_0$ in the array A are connected to the source of auxiliary voltage $U_H$ through the change-over switches $S_{Gn-1}, S_{Gn-2}, \ldots, S_{G1}, S_{G0}$ in the array A whose moving contacts are connected to their other stationary contacts, and the first stationary contacts of the change-over switches $S_{Gn-1}, S_{Gn-2}, \ldots, S_{G1}, S_{G0}$ in the array A are connected to the ground of the circuit. The first rail L is connected to the ground of the circuit through the open first rail on-off switch $S_{Gall}$ and to the non-inverting input of the second comparator K2 whose inverting input is connected to the source of the reference voltage $U_L$. The second rail H is connected to the inverting input of the first comparator K1. Moreover, the control input of the first on-off switch $S_{Ln}$ and the control inputs of the first on-off switches $S_{Ln-1}, S_{Ln-2}, S_{L1}, S_{L0}$ in the array A and the control input of the change-over switch $S_{Gn}$ and the control inputs of the relevant change-over switches $S_{Gn-1}, S_{Gn-2}, \ldots, S_{G1}, S_{G0}$ in the array A are coupled together and connected to the relevant control outputs $I_n$ and $I_{n-1}, I_{n-2}, \ldots, I_1, I_0$ of the set of control outputs E of the control module CM. The control input of the second on-off switch $S_{Hn}$ and the control inputs of the second on-off switches $S_{Hn-1}, S_{Hn-2}, \ldots, S_{H1}, S_{H0}$ in the array A and the control input of the first rail on-off switch $S_{Gall}$ are connected to the relevant control outputs $D_n, D_{n-1}, D_{n-2}, \ldots, D_1, D_0$ and $D_{all}$ of the set of control outputs E of the control module CM. One end of the current source I is connected to the second rail H, and the other end of the current source I is connected to the first rail L. The control input of the current source I is connected to the control output $A_I$ of the control module CM. The control input of the voltage source on-off switch $S_{Un}$ is connected to the control output $A_U$ of the control module CM.

In the another version of this apparatus variant the sampling capacitor $C_n$ is connected in parallel to the capacitor $C_{n-1}$ having the highest capacitance value in the array A of capacitors while the capacitance value of the sampling capacitor $C_n$ is not smaller than the capacitance value of the capacitor $C_{n-1}$. At the same time, both capacitors $C_n$ and $C_{n-1}$ are connected in parallel to the source of the converted voltage $U_{IN}$ in a way that the top plate of the capacitor $C_{n-1}$ in the array A of capacitors is connected to the source of the converted voltage $U_{IN}$ through the closed additional voltage source on-off switch $S_{Un-1}$, and the bottom plate of the capacitor $C_{n-1}$ is connected to the ground of the circuit through the change-over switch $S_{Gn-1}$ in the array A whose moving contact is connected to its first stationary contact, and the other stationary contact of the change-over switch $S_{Gn-1}$ in the array A is connected to the source of auxiliary voltage $U_H$. Moreover, the top plate of the capacitor $C_{n-1}$ in the array A of capacitors is connected also to the first rail L through the closed first on-off switch $S_{Ln-1}$, in the array A. The control input of the voltage source on-off switch $S_{Un}$ and the control input of the additional voltage source on-off switch $S_{Un-1}$ are coupled together and connected to the control output $A_U$ of the control module CM, In the another variant of the apparatus, a voltage supply $U_{DD}$ is additionally connected to the array A of capacitors.

The array A in this variant of the apparatus comprises a number of n capacitors $C_{n-1}, C_{n-2}, \ldots, C_1, C_0$, and a capacitance value of a capacitor of a given index is twice as high as a capacitance value of the capacitor of the previous index, while a relevant bit $b_{n-1}, b_{n-2}, \ldots, b_1, b_0$ in the digital output B of the control module CM is assigned to each capacitor $C_{n-1}, C_{n-2}, \ldots, C_1, C_0$. The sampling capacitor $C_n$ is connected to the array A of capacitors, while the top plate of the sampling capacitor $C_n$ is connected through the closed first on-off switch $S_{Ln}$ to the first rail L with which also the top plates of all the capacitors $C_{n-1}, C_{n-2}, \ldots, C_1, C_0$ in the array A of capacitors are connected through the open first on-off switches $S_{Ln-1}, S_{Ln-2}, \ldots, S_{L1}, S_{L0}$ in the array A. The top plate of the capacitor $C_{n-1}$ having the highest capacitance value in the array A of capacitors is connected through the closed second on-off switch $S_{Hn-1}$, in the array A to the second rail H with which the top plate of the sampling capacitor $C_n$ is also connected through the open second on-off switch $S_{Hn}$ and with which the top plates of the other capacitors $C_{n-2}, \ldots, C_1, C_0$ in the array A are connected through the open second on-off switches $S_{Hn-2}, \ldots, S_{H1}, S_{H0}$ in the array A. The bottom plate of the sampling capacitor $C_n$ is connected to the ground of the circuit through the change-over switch $S_{Gn}$ whose moving contact is connected to its first stationary contact and the other stationary contact of the change-over switch $S_{Gn}$ is connected to the source of auxiliary voltage $U_H$ and also to the non-inverting input of the first comparator K1. The bottom plates of all the capacitors $C_{n-1}, C_{n-2}, \ldots, C_1, C_0$ in the array A are connected to the source of auxiliary voltage $U_H$ through the change-over switches $S_{Gn-1}, S_{Gn-2}, \ldots, S_{G1}, S_{G0}$ in the array A whose moving contacts are connected to their other stationary contacts, and the first stationary contacts of the change-over switches $S_{Gn-1}, S_{Gn-2}, \ldots, S_{G1}, S_{G0}$ in the array A are connected to the ground of the circuit. The first rail L is connected to the ground of the circuit through the open first rail on-off switch $S_{Gall}$ and to the non-inverting input of the second comparator K2 whose inverting input is connected to the source of the converted voltage $U_{IN}$ through the voltage source change-over switch $S_U$ whose moving contact is connected to its first stationary contact and the other stationary contact of the voltage source change-over switch $S_U$ is connected to the source of the reference voltage $U_L$, while the second rail H is connected to the inverting input of the first comparator K1. The control input of the first on-off switch $S_{Ln}$ and the control inputs of the first on-off switches $S_{Ln-1}, S_{Ln-2}, \ldots, S_{L1}, S_0$ in the array A and the control input of the change-over switch $S_{Gn}$ and the control inputs of the relevant change-over switches $S_{Gn-1}, S_{Gn-2}, \ldots, S_{G1}, S_{G0}$ in the array A are coupled together and connected to the relevant control outputs $I_n$ and $I_{n-1}, I_{n-1}, \ldots, I_1, I_0$ of the set of control outputs E of the control module CM. The control input of the second on-off switch $S_{Hn}$ and the control inputs of the second on-off switches $S_{Hn-1}, S_{Hn-1}, \ldots, S_{H1}, S_{H0}$ in the array A and the control input of the first rail on-off switch $S_{Gall}$ are connected to the relevant control outputs $D_n, D_{n-1}, D_{n-2}, \ldots, D_1, D_0$ and $D_{all}$ of the set of control outputs E of the control module CM. The control input of the voltage source change-over switch $S_U$ is connected to the control output $A_U$ of the control module CM. One end of the current source I is connected to the voltage supply $U_{DD}$ through the current source change-over switch $S_I$ whose moving contact is connected to its first stationary contact and the other stationary contact of the current source change-over switch $S_I$ is connected to the second rail H. The other end of the current source I is connected to the first rail L. Moreover, the control input of the current source change-over switch $S_I$ is connected to the control output $A_S$ of the control module CM, and the control input of the current source I is connected to the control output $A_I$ of the control module CM.

In the another version of this apparatus variant, the sampling capacitor $C_n$, whose capacitance value is not smaller than the capacitance value of the capacitor $C_{n-1}$, is connected in parallel to the capacitor $C_{n-1}$ having the highest capacitance value in the array A of capacitors through the first rail L and through the ground of the circuit in a way that the top plate of the capacitor $C_{n-1}$ in the array A of capacitors is connected to the first rail L through the closed first on-off switch $S_{Ln-1}$ in the array A, and the bottom plate of the capacitor $C_{n-1}$ is connected to the ground of the circuit through the change-over switch $S_{Gn-1}$ in the array A whose moving contact is connected to its first stationary contact, and the other stationary contact of the change-over switch $S_{Gn-1}$ in the array A is connected to the source of auxiliary voltage $U_H$.

In the another variant of the apparatus, the voltage supply $U_{DD}$ and a controlled additional current source J are connected to the array A of capacitors, and the control input of the additional current source J is connected to the control output $A_J$ of the control module CM.

The array A in this variant of the apparatus comprises a number of n capacitors $C_{n-1}, C_{n-2}, \ldots, C_1, C_0$, and a capacitance value of a capacitor of a given index is twice as high as a capacitance value of the of the previous index, while a relevant bit $b_{n-1}, b_{n-2}, \ldots, b_1, b_0$ in the digital output B of the control module CM is assigned to each capacitor $C_{n-1}, C_{n-2}, \ldots, C_1, C_0$. The sampling capacitor $C_n$ is connected to the array A of capacitors, while the top plate of the sampling capacitor $C_n$ is connected through the closed first on-off switch $S_{Ln}$ to the first rail L with which also the top plates of all the capacitors $C_{n-1}, C_{n-2}, \ldots, C_1, C_0$ in the array A of capacitors are connected through the open first on-off switches $S_{Ln-1}, S_{Ln-2}, \ldots, S_{L1}, S_{L0}$ in the array A. The top plate of the sampling capacitor $C_n$ is also connected through the closed second on-off switch $S_{Hn}$ to the second rail H with which the top plates of all the capacitors $C_{n-1}, C_{n-2}, \ldots, C_1, C_0$ in the array A are connected through the open second on-off switches $S_{Hn-1}, S_{Hn-2}, \ldots, S_{H1}\ S_{H0}$ in the array A. The bottom plate of the sampling capacitor $C_n$ is connected to the ground of the circuit through the change-over switch $S_{Gn}$ whose moving contact is connected to its first stationary contact and the other stationary contact of the change-over switch $S_{Gn}$ is connected to the source of auxiliary voltage $U_H$ and also to the non-inverting input of the first comparator K1. The bottom plates of all the capacitors $C_{n-1}, C_{n-2}, \ldots, C_1, C_0$ in the array A are connected to the source of auxiliary voltage $U_H$ through the change-over switches $S_{Gn-1}, S_{Gn-2}, \ldots, S_{G1}, S_{G0}$ in the array A whose moving contacts are connected to their other stationary contacts, and the first stationary contacts of the change-over switches $S_{Gn-1}, S_{Gn-2}, \ldots, S_{G1}, S_{G0}$ in the array A are connected to the ground of the circuit. The first rail L is connected to the ground of the circuit through the open first rail on-off switch $S_{Gall}$ and to the non-inverting input of the second comparator K2 whose inverting input is connected to the source of the converted voltage $U_{IN}$ through the voltage source change-over switch $S_U$ whose moving contact is connected to its first stationary contact and the other stationary contact of the voltage source change-over switch $S_U$ is connected to the source of the reference voltage $U_L$. The second rail H is connected to the inverting input of the first comparator K1. Moreover, the control input of the first on-off switch $S_{Ln}$ and the control inputs of the first on-off switches $S_{Ln-1}, S_{Ln-2}, \ldots, S_{L1}, S_{L0}$ in the array A and the control input of the change-over switch $S_{Gn}$ and the control inputs of the relevant change-over switches $S_{Gn-1}, S_{Gn-2}, \ldots, S_{G1}, S_{G0}$ in the array A are coupled together and connected to the relevant control outputs $I_n$ and $I_{n-1}, I_{n-2}, \ldots, I_1, I_0$ of the set of control outputs E of the control module CM. The control input of the second on-off switch $S_{Hn}$ and the control inputs of the second on-off switches $S_{Hn-1}, S_{Hn-2}, \ldots, S_{H1}, S_{H0}$ in the array A and the control input of the first rail on-off switch $S_{Gall}$ are connected to the relevant control outputs $D_n, D_{n-1}, D_{n-2}, \ldots, D_1, D_0$ and $D_{all}$ of the set of control outputs E of the control module CM. The control input of the voltage source change-over switch $S_U$ is connected to the control output $A_U$ of the control module CM. One end of the current source I is connected to the voltage supply $U_{DD}$. The other end of the current source I is connected to the first rail L, with which also the other end of the additional current source J is connected. One end of the additional current source J is connected to the second rail H. The control input of the current source I is connected to the control output $A_I$ of the control module CM while the control input of the additional current source J is connected to the control output $A_J$ of the control module CM.

In the another version of this apparatus variant, the sampling capacitor $C_n$ whose capacitance value is not smaller than the capacitance value of the capacitor $C_{n-1}$, is connected in parallel to the capacitor $C_{n-1}$ having the highest capacitance value in the array A of capacitors through the first rail L and through the ground of the circuit in a way that the top plate of the capacitor $C_{n-1}$ in the array A of capacitors is connected to the first rail L through the closed first on-off switch $S_{Ln-1}$, in the array A, and the bottom plate of the capacitor $C_{n-1}$ is connected to the ground of the circuit through the change-over switch $S_{Gn-1}$ in the array A whose moving contact is connected to its first stationary contact, and the other stationary contact of the change-over switch $S_{Gn-1}$ in the array A is connected to the source of auxiliary voltage $U_H$.

The apparatus according to the invention operates as follows.

Between successive cycles of conversion of voltage values to digital words having a number of bits equal to n, the control module CM keeps the apparatus in the state of relaxation during which the control module CM causes, by means of the control signals provided on the outputs $I_n$ and $I_{n-1}, I_{n-2}, \ldots, I_1, I_0$, the closure of the first on-off switches $S_{Ln}$ and $S_{Ln-1}$, $S_{Ln-2}, \ldots, S_{L1}, S_{L0}$ and thereby the connection of the top plate of the sampling capacitor $C_n$ and of the top plates of all the capacitors $C_{n-1}, C_{n-2}, \ldots, C_1, C_0$ in the array A to the first rail L, and also the switching of the change-over switches $S_{Gn}$, $S_{Gn-1}, \ldots, S_{G1}, S_{G0}$ and thereby the connection of the bottom plate of the sampling capacitor $C_n$ and also the connection of the bottom plates of the capacitors $C_{n-1}, C_{n-2}, \ldots, C_1, C_0$ in the array A to the ground of the circuit. On the other hand, by means of the control signal provided on the output $D_{all}$, the control module CM causes the closure of the first rail on-off switch $S_{Gall}$ and thereby the connection of the first rail L to the ground of the circuit enforcing in this way a complete discharge of the sampling capacitor $C_n$ and of the capacitors $C_{n-1}, C_{n-2}, \ldots, C_1, C_0$ in the array A. Afterwards, the control module CM causes, by means of the control signal provided on the output $D_{n-1}$, the closure of the second on-off switch $S_{Hn-1}$ and thereby the connection of the second rail H to the first rail L and to the ground of the circuit which prevents the occurrence of a random potential on the second rail H. At the same time, the control module CM causes, by means of the control signals provided on the output $A_U$, the opening of the voltage source on-off switch $S_{Un}$ and thereby the disconnection of the top plate of the sampling capacitor $C_n$ from the source of the converted voltage $U_{IN}$. At the same time, the control module CM causes, by means of the control signals provided on the output $D_n$ and on the outputs $D_{n-2}, \ldots, D_1, D_0$, the opening of the second on-off switches $S_{Hn}$ and $S_{Hn-2}, \ldots, S_{H1}, S_{H0}$. At the same time, the control module CM causes, by means of the control signal provided on the output $A_I$, the switching off the current source I (FIG. 2). As soon as the control module CM detects the beginning of the active state of the signal on the trigger input InS of the apparatus, the control module CM causes, by means of the control signal provided on the output $D_{all}$, the opening of the first rail on-off switch $S_{Gall}$ and thereby the disconnection of the first rail L from the ground of the circuit. At the same time, the control module CM causes, by means of the control signals provided on the outputs $I_{n-1}, I_{n-2}, \ldots, I_1, I_0$, the opening of the first on-off switches $S_{Ln-1}, S_{Ln-2}, \ldots, S_{L1}, S_{L0}$ and thereby the disconnection of the top plates of all the capacitors $C_{n-1}, C_{n-2}, \ldots, C_1, C_0$ in the array A from the first rail L, and also the switching of the change-over switches $S_{Gn-1}, S_{Gn-2}, \ldots, S_{G1}, S_{G0}$ and thereby the connection of the bottom plates of the capacitors $C_{n-1}, C_{n-2}, \ldots, C_1, C_0$ to the source of auxiliary voltage $U_H$. At the same time, by means of the control signal provided on the output $A_U$, the control module CM causes the closure of the voltage source on-off switch $S_{Un}$ and thereby the connection of the top plate of the sampling capacitor $C_n$ to the source of the converted voltage $U_{IN}$ (FIG. 3). At the same time, the control module CM deactivates the signal provided on the complete conversion signal output OutR and assigns the initial value zero to all the bits $b_{n-1}, b_{n-2}, \ldots, b_1, b_0$ in the digital word. The electric charge is accumulated in the sampling capacitor $C_n$ during the active state of the signal on the trigger input InS of the apparatus while the sampling capacitor $C_n$ is the only capacitor connected at that time to the source of the converted voltage $U_{IN}$ through the closed voltage source on-off switch $S_{Un}$ and through the ground of the circuit. The electric charge accumulated in the sampling capacitor $C_n$ during the active state of the signal on the trigger input InS of the apparatus produces a voltage $U_n$ whose value is proportional to the converted voltage $U_{IN}$ value.

When the control module CM detects the end of the active state of the signal on the trigger input InS of the apparatus, the control module CM causes, by means of the control signal provided on the output $A_U$, the opening of the voltage source on-off switch $S_{Un}$ and thereby the disconnection of the top plate of the sampling capacitor $C_n$ from the source of the converted voltage $U_{IN}$. At the same time, the control module CM causes, by means of the control signal provided on the output $I_n$, the opening of the first on-off switch $S_{Ln}$ and thereby the disconnection of the top plate of the sampling capacitor $C_n$ from the first rail L, and also the concurrent switching of the change-over switch $S_{Gn}$ and thereby the connection of the bottom plate of the sampling capacitor $C_n$ to the source of auxiliary voltage $U_H$. At the same time, the control module CM causes, by means of the control signal provided on the output $D_{n-1}$, the opening of the second on-off switch $S_{Hn-1}$ and thereby the disconnection of the top plate of the capacitor $C_{n-1}$ from the second rail H. Next, by writing the value of the index of the sampling capacitor $C_n$ to the source capacitor $C_i$ index register in the control module CM, the control module CM assigns the function of the source capacitor $C_i$, whose index is defined by the content of the source capacitor $C_i$ index register, to the sampling capacitor $C_n$. At the same time, the control module CM causes, by means of the control signal provided on the output $D_i$, the closure of the second on-off switch $S_{Hi}$ and thereby the connection of the top plate of the source capacitor $C_i$ to the second rail H. At the same time, by writing the value of the index of the capacitor $C_{n-1}$ having the highest capacitance value in the array A to the destination capacitor $C_k$ index register in the control module CM, the control module CM assigns the function of the destination capacitor $C_k$ whose index is defined by the content of the destination capacitor $C_k$ index register to the capacitor $C_{n-1}$. Then, the control module CM causes, by means of the control signal provided on the output $I_k$, the closure of the first on-off switch $S_{Lk}$ and thereby the connection of the top plate of the destination capacitor $C_k$ to the first rail L, and also the concurrent switching of the change-over switch $S_{Gk}$ and thereby the connection of the bottom plate of the destination capacitor $C_k$ to the ground of the circuit. Then, by means of the control signal provided on the output $A_I$, the control module CM causes the switching on the current source I by the use of which the charge accumulated in the source capacitor $C_i$ is transferred through the second rail H and through the first rail L to the destination capacitor $C_k$ (FIG. 4) while the voltage $U_i$ on the source capacitor $C_i$ progressively decreases whereas at the same time the voltage $U_k$ on the destination capacitor $C_k$ progressively increases. In case when the voltage $U_k$ on the current destination capacitor $C_k$ reaches the reference voltage $U_L$ value during the charge transfer, the control module CM on the basis of the output signal of the second comparator K2 assigns the value one to the relevant bit $b_k$ in the digital word, and the control module CM causes, by means of the control signal provided on the output $I_k$, the opening of the first on-off switch $S_{Lk}$ and thereby the disconnection of the top plate of the destination capacitor $C_k$ from the first rail L, and also the concurrent switching of the change-over switch $S_{Gk}$ and thereby the connection of the bottom plate of the destination capacitor $C_k$ to the source of auxiliary voltage $U_H$. Afterwards, by reduction of the content of the destination capacitor $C_k$ index register by one, the control module CM assigns the function of the destination capacitor $C_k$ to the subsequent capacitor in the array A whose capacitance value is twice as lower as the capacitance value of the capacitor which acted as the destination capacitor directly before. After that, the control module CM causes, by means of the control signal provided on the output $I_k$, the closure of the first on-off switch $S_{Lk}$ and thereby the connection of the top plate of a new destination capacitor $C_k$ to the first rail L, and also the concurrent switching of the change-over switch $S_{Gk}$ and thereby the connection of the bottom plate of the destination capacitor $C_k$ to the ground of the circuit.

In case when the voltage $U_i$ on the source capacitor $C_i$ reaches the value zero during the charge transfer, the control module CM, on the basis of the output signal of the first comparator K1 causes, by means of the control signal provided on the output $D_i$, the opening of the second on-off switch $S_{Hi}$ and thereby the disconnection of the top plate of the source capacitor $C_i$ from the second rail H. At the same time, the control module CM causes, by means of the control signal provided on the output $I_k$, the opening of the first on-off switch $S_{Lk}$ and thereby the disconnection of the top plate of the destination capacitor $C_k$ from the first rail L, and also the concurrent switching of the change-over switch $S_{Gk}$ and thereby the connection of the bottom plate of the destination capacitor $C_k$ to the source of auxiliary voltage $U_H$. Next, the control module CM, on the basis of the output signal of the first comparator K1 by writing the current content of the destination capacitor $C_k$ index register to the source capacitor $C_i$ index register, assigns the function of the source capacitor $C_i$ to the capacitor that until now has acted as the destination capacitor $C_k$, and after that the control module CM causes, by means of the control signal provided on the output $D_i$, the closure of the second on-off switch $S_{Hi}$ and thereby the connection of the top plate of a new source capacitor $C_i$ to the second rail H. Afterwards, by reduction of the content of the destination capacitor $C_k$ index register by one, the control module CM assigns the function of the destination capacitor $C_k$, whose index is defined by the content of the destination capacitor $C_k$ index register in the control module CM, to the subsequent capacitor in the array A whose capacitance value is twice as lower as the capacitance value of the capacitor which acted as the destination capacitor directly before. After that, the control module CM causes, by means of the control signal provided on the output $I_k$, the closure of the first on-off switch $S_{Lk}$ and thereby the connection of the top plate of the destination capacitor $C_k$ to the first rail L, and also the concurrent switching of the change-over switch $S_{Gk}$ and thereby the connection of the bottom plate of the new destination capacitor $C_k$ to the ground of the circuit (FIG. 5).

In both cases the control module CM continues to control the process of charge transfer on the basis of the output signals of both comparators K1 and K2. Each occurrence of the active state on the output of second comparator K2 causes the assignment of the function of the destination capacitor $C_k$ to the subsequent capacitor in the array A whose capacitance value is twice as lower as the capacitance value of the capacitor which acted as the destination capacitor directly before. On the other hand, each occurrence of the active state on the output of first comparator K1 causes the assignment of the function of the source capacitor $C_i$ to the capacitor that until now has acted as the destination capacitor $C_k$, and at the same time the assignment of the function of the destination capacitor $C_k$ to the subsequent capacitor in the array A whose capacitance value is twice as lower as the capacitance value of the capacitor which acted as the destination capacitor directly before.

The process of charge redistribution is terminated when the capacitor $C_0$ having the lowest capacitance value in the array A stops to act as the destination capacitor $C_k$. Such situation occurs when the active state appears on the output of the first comparator K1 or on the output of the second comparator K2 during charge transfer to the capacitor $C_0$. When the active state appears on the output of the second comparator K2, the control module CM assigns the value one to the bit $b_0$.

After termination of redistribution of charge accumulated previously in the sampling capacitor $C_n$ and after assigning the corresponding values to the bits $b_{n-1}, b_{n-2}, \ldots b_1, b_0$ in the output digital word, the control module CM activates the signal provided on the complete conversion signal output OutR and causes introduction of the apparatus into the relaxation phase by switching off the current source I, the opening of the voltage source on-off switch $S_{Un}$ and thereby the disconnection of the top plate of the sampling capacitor $C_n$ from the source of the converted voltage $U_{IN}$, also the closure of the first on-off switches $S_{Ln}$ and $S_{Ln-1}, S_{Ln-2}, \ldots, S_{L1}, S_{L0}$ and thereby the connection of the top plate of the sampling capacitor $C_n$ and the connection of the top plates of all the capacitors $C_{n-1}, C_{n-2}, \ldots, C_1, C_0$ in the array A to the first rail L, and also the concurrent switching of the change-over switches $S_{Gn}$ and $S_{Gn-1}, S_{Gn-2}, \ldots, S_{G1}, S_{G0}$ to the positions connecting the bottom plate of the sampling capacitor $C_n$ and the bottom plates of the capacitors $C_{n-1}, C_{n-2}, \ldots, C_1, C_0$ to the ground of the circuit. At the same time, the control module causes the closure of the first rail on-off switch $S_{Gall}$ and thereby the connection of the first rail L to the ground of the circuit, enforcing a complete discharge of the sampling capacitor $C_n$ and of the capacitors $C_{n-1}, C_{n-2}, \ldots, C_1, C_0$ in the array A, and also the opening of the second on-off switches $S_{Hn}$ and $S_{Hn-2}, \ldots, S_{H1}, S_{H0}$ in the array A, and also the closure of the second on-off switch $S_{Hn-1}$ and thereby the connection of the second rail H to the first rail L and to the ground of the circuit (FIG. 2), which prevents the occurrence of a random potential on the first rail H.

The operation of the another version of this apparatus variant consists in that during the time when the apparatus is kept in the state of relaxation, the control module CM causes, by means of the control signals provided on the output $A_U$, the opening of the voltage source on-off switch $S_{Un}$ and thereby the disconnection of the top plate of the sampling capacitor $C_n$ from the source of the converted voltage $U_{IN}$, and also the opening of the additional voltage source on-off switch $S_{Un-1}$ and thereby the disconnection of the top plate of the capacitor $C_{n-1}$ having the highest capacitance value in the array A from the source of the converted voltage $U_{IN}$ (FIG. 6). As soon as the control module CM detects the beginning of the active state of the signal on the trigger input InS of the apparatus, the control module CM causes, by means of the control signal provided on the output $D_{all}$, the opening of the first rail on-off switch $S_{Gall}$ and thereby the disconnection of the first rail L from the ground of the circuit. At the same time, the control module CM causes, by means of the control signals provided on the outputs $I_{n-2}, \ldots, I_1, I_0$, the opening of the first on-off switches $S_{Ln-2}, \ldots, S_{L1}, S_{L0}$ and thereby the disconnection of the top plates of all the capacitors $C_{n-2}, \ldots, C_1, C_0$ in the array A from the first rail L and also the switching of the change-over switches $S_{Gn-2}, \ldots, S_{G1}, S_{G0}$ and thereby the connection of the bottom plates of the capacitors $C_{n-2}, \ldots, C_1, C_0$ to the source of auxiliary voltage $U_H$. At the same time, by means of the control signal provided on the output $A_U$, the control module CM causes the closure of the voltage source on-off switch $S_{Un}$ and thereby the connection of the top plate of the sampling capacitor $C_n$ to the source of the converted voltage $U_{IN}$, and also the closure of the additional voltage source on-off switch $S_{Un-1}$ and thereby the connection of the top plate of the capacitor $C_{n-1}$ in the array A of capacitors to the source of the converted voltage $U_{IN}$ (FIG. 7). At the same time, the control module CM deactivates the signal provided on the complete conversion signal output OutR and assigns the initial value zero to all the bits $b_{n-1}, b_{n-2}, \ldots, b_1, b_0$ in the digital word. The electric charge is accumulated in the capacitor $C_{n-1}$ and at the same time in the sampling capacitor $C_n$ connected in parallel to the capacitor $C_{n-1}$ in the array A of capacitors which are the only capacitors connected at that time to the source of the converted voltage $U_{IN}$ through the closed voltage source on-off switch $S_{Un}$ and through the closed additional voltage source on-off switch $S_{Un-1}$ and through the ground of the circuit.

When the control module CM detects the end of the active state of the signal on the trigger input InS of the apparatus, the control module CM causes, by means of the control signal provided on the output $A_U$, the opening of the voltage source on-off switch $S_{Un}$ and thereby the disconnection of the top plate of the sampling capacitor $C_n$ from the source of the converted voltage $U_{IN}$, and also the concurrent opening of the additional voltage source on-off switch $S_{Un-1}$ and thereby the disconnection of the top plate of the capacitor $C_{n-1}$ from the source of the converted voltage $U_{IN}$. At the same time, the control module CM causes by means of the control signal provided on the output $I_n$, the opening of the first on-off switch $S_{Ln}$ and thereby the disconnection of the top plate of the sampling capacitor $C_n$ from the first rail L, and also the concurrent switching of the change-over switch $S_{Gn}$ and thereby the connection of the bottom plate of the sampling capacitor $C_n$ to the source of auxiliary voltage $U_H$. At the same time, the control module CM causes, by means of the control signal provided on the output $D_{n-1}$, the opening of the second on-off switch $S_{Hn-1}$ and thereby the disconnection of the top plate of the capacitor $C_{n-1}$ from the second rail H. Next, by writing the value of the index of the sampling capacitor $C_n$ to the source capacitor $C_i$ index register in the control module CM, the control module CM assigns the function of the source capacitor $C_i$, whose index is defined by the content of the source capacitor $C_i$ index register, to the sampling capacitor $C_n$. At the same time, the control module CM causes, by means of the control signal provided on the output $D_i$, the closure of the second on-off switch $S_{Hi}$, and thereby the connection of the top plate of the source capacitor $C_i$ to the second rail H. At the same time, by writing the value of the index of the capacitor $C_{n-1}$ having the highest capacitance value in the array A to the destination capacitor $C_k$ index register in the control module CM, the control module CM assigns the function of the destination capacitor $C_k$, whose index is defined by the content of the destination capacitor $C_k$ index register, to the capacitor $C_{n-1}$. Then, the control module CM causes, by means of the control signal provided on the output $I_k$, the closure of the first on-off switch $S_{Lk}$ and thereby the connection of the top plate of the destination capacitor $C_k$ to the first rail L, and also the concurrent switching of the change-over switch $S_{Gk}$ and thereby the connection of the bottom plate of the destination capacitor $C_k$ to the ground of the circuit. Then, by means of the control signal provided on the output $A_I$, the control module CM causes the switching on the current source I by the use of which the charge accumulated in the source capacitor $C_i$ is transferred through the second rail H and through the first rail L to the destination capacitor $C_k$. Next, the control module CM starts to control the process of redistribution of accumulated charge that is terminated when the capacitor $C_0$ having the lowest capacitance value in the array A stops to act as the destination capacitor $C_k$. After that the control module CM activates the signal provided on the complete conversion signal output OutR, and causes introducing the apparatus into the relaxation phase again.

The another variant of the apparatus operates as follows. Between successive cycles of conversion of voltage values to digital words having a number of bits equal to n, the control module CM keeps the apparatus in the state of relaxation during which the control module CM causes, by means of the control signals provided on the outputs $I_n$ and $I_{n-1}, \ldots, I_1, I_0$, the closure of the first on-off switches $S_{Ln}$ and $S_{Ln-1}, \ldots, S_{L1}, S_{L0}$ and thereby the connection of the top plate of the sampling capacitor $C_n$ and the connection of the top plates of all the capacitors $C_{n-1}, C_{n-2}, \ldots, C_1, C_0$ in the array A to the first rail L, and also the switching of the change-over switches $S_{Gn}, S_{Gn-1}, \ldots, S_{G1}, S_{G0}$ and thereby the connection of the bottom plate of the sampling capacitor $C_n$ and the connection of the bottom plates of the capacitors $C_{n-1}, \ldots, C_1, C_0$ in the array A to the ground of the circuit. On the other hand, by means of the control signal provided on the output $D_{all}$, the control module CM causes the closure of the first rail on-off switch $S_{Gall}$ and thereby the connection of the first rail L to the ground of the circuit enforcing in this way a complete discharge of the sampling capacitor $C_n$ and of the capacitors $C_{n-1}, \ldots, C_1, C_0$ in the array A. Afterwards, the control module CM causes, by means of the control signal provided on the output $D_{n-1}$, the closure of the second on-off switch $S_{Hn-1}$ and thereby the connection of the second rail H to the first rail L and to the ground of the circuit which prevents the occurrence of a random potential on the second rail H. At the same time, the control module CM causes, by means of the control signals provided on the output $A_U$, the switching of the voltage source change-over switch $S_U$ and thereby the connection of the inverting input of the second comparator K2 to the source of the reference voltage $U_L$. At the same time, the control module CM causes, by means of the control signals provided on the output $D_n$ and on the outputs $D_{n-2}, \ldots, D_1, D_0$, the opening of the second on-off switches $S_{Hn}$ and $S_{Hn-2}, \ldots, S_{H1}, S_{H0}$. At the same time, the control module CM causes, by means of the control signal provided on the output $A_I$, the switching off the current source I, and on the other hand, by means of the control signal provided on the output $A_S$, the switching of the current source change-over switch $S_I$ and thereby the connection of the one end of the current source I to the voltage supply $U_{DD}$ (FIG. 9).

As soon as the control module CM detects the beginning of the active state of the signal on the trigger input InS of the apparatus, the control module CM causes, by means of the control signal provided on the output $A_U$, the switching of the voltage source change-over switch $S_U$ and thereby the connection of the inverting input of the second comparator K2 to the source of the converted voltage $U_{IN}$. At the same time, the control module CM causes, by means of the control signal provided on the output $D_{all}$, the opening of the first rail on-off switch $S_{Gall}$ and thereby the disconnection of the first rail L from the ground of the circuit. At the same time, the control module CM causes, by means of the control signals provided on the outputs $I_{n-1}, I_{n-2}, \ldots, I_1, I_0$, the opening of the first on-off switches $S_{Ln-1}, S_{Ln-2}, \ldots, S_{L1}, S_{L0}$ and thereby the disconnection of the top plates of all the capacitors $C_{n-1}, C_{n-2}, \ldots, C_1, C_0$ in the array A from the first rail L and also the switching of the change-over switches $S_{Gn-1}, S_{Gn-2}, \ldots, S_{G1}, S_{G0}$ and thereby the connection of the bottom plates of the capacitors $C_{n-1}, C_{n-2}, \ldots, C_1, C_0$ to the source of auxiliary voltage $U_H$. At the same time, the control module CM causes, by means of the control signal provided on the output $A_I$, the switching on the current source I (FIG. 10). At the same time, the control module CM deactivates the signal provided on the complete conversion signal output OutR and assigns the initial value zero to all the bits $b_{n-1}, b_{n-2}, \ldots, b_1, b_0$ in the digital word. The electric charge delivered by the use of the current source I is accumulated in the sampling capacitor $C_n$ which is the only capacitor connected at that time to the other end of the current source I through the first rail L and through the closed first on-off switch $S_{Ln}$. Accumulation of charge in the sampling capacitor $C_n$ causes a progressive increase of the voltage $U_n$ on that capacitor which is compared by the second comparator K2 to the converted voltage $U_{IN}$ value.

When the voltage $U_n$ increasing on the sampling capacitor $C_n$ reaches the converted voltage $U_{IN}$ value which represents the mapping of the converted voltage $U_{IN}$ value to the portion of electric charge proportional to this value and accumulated in the sampling capacitor $C_n$, the control module CM on the basis of the output signal of the second comparator K2 causes, by means of the control signal provided on the output L, the opening of the first on-off switch $S_{Ln}$ and thereby the disconnection of the top plate of the sampling capacitor $C_n$ from the first rail L, and also the concurrent switching of the change-over switch $S_{Gn}$ and thereby the connection of the bottom plate of the sampling capacitor $C_n$ to the source of auxiliary voltage $U_H$. At the same time, the control module CM causes, by means of the control signal provided on the output $D_{n-1}$, the opening of the second on-off switch $S_{Hn-1}$ and thereby the disconnection of the top plate of the capacitor $C_{n-1}$ from the second rail H. At the same time, the control module CM causes, by means of the control signals provided on the output $A_U$, the switching of the voltage source change-over switch $S_U$ and thereby the connection of the inverting input of the second comparator K2 to the source of the reference voltage $U_L$. Next, the control module CM causes, by means of the control signal provided on the output $A_S$, the switching of the current source change-over switch $S_I$ and thereby the connection of the one end of the current source I to the second rail H. Next, by writing the value of the index of the sampling capacitor $C_n$ to the source capacitor $C_i$ index register in the control module CM, the control module CM assigns the function of the source capacitor $C_i$ whose index is defined by the content of the source capacitor $C_i$ index register to the sampling capacitor $C_n$. At the same time, the control module CM causes, by means of the control signal provided on the output $D_i$, the closure of the second on-off switch $S_{Hi}$ and thereby the connection of the top plate of the source capacitor $C_i$ to the second rail H. At the same time, by writing the value of the index of the capacitor $C_{n-1}$ having the highest capacitance value in the array A to the destination capacitor $C_k$ index register in the control module CM, the control module CM assigns the function of the destination capacitor $C_k$ whose index is defined by the content of the destination capacitor $C_k$ index register to the capacitor $C_{n-1}$. Then, the control module CM causes, by means of the control signal provided on the output $I_k$, the closure of the first on-off switch $S_{Lk}$ and thereby the connection of the top plate of the destination capacitor $C_k$ to the first rail L, and also the concurrent switching of the change-over switch $S_{Gk}$ and thereby the connection of the bottom plate of the destination capacitor $C_k$ to the ground of the circuit. Afterwards, the charge accumulated in the source capacitor $C_i$ is transferred through the second rail H and through the first rail L to the destination capacitor $C_k$ (FIG. 4) while the voltage $U_i$ on the source capacitor $C_i$ progressively decreases whereas at the same time the voltage $U_k$ on the destination capacitor $C_k$ progressively increases.

In case when the voltage $U_k$ on the current destination capacitor $C_k$ reaches the reference voltage $U_L$ value during the charge transfer, the control module CM on the basis of the output signal of the second comparator K2 assigns the value one to the relevant bit $b_k$ in the digital word, and the control module CM causes, by means of the control signal provided on the output $I_k$, the opening of the first on-off switch $S_{Lk}$ and thereby the disconnection of the top plate of the destination capacitor $C_k$ from the first rail L, and also the concurrent switching of the change-over switch $S_{Gk}$ and thereby the connection of the bottom plate of the destination capacitor $C_k$ to the source of auxiliary voltage $U_H$. Afterwards, by reduction of the content of the destination capacitor $C_k$ index register by one, the control module CM assigns the function of the destination capacitor $C_k$ to the subsequent capacitor in the array A whose capacitance value is twice as lower as the capacitance value of the capacitor which acted as the destination capacitor directly before. After that, the control module CM causes, by means of the control signal provided on the output $I_k$, the closure of the first on-off switch $S_{Lk}$ and thereby the connection of the top plate of a new destination capacitor $C_k$ to the first rail L, and also the concurrent switching of the change-over switch $S_{Gk}$ and thereby the connection of the bottom plate of the destination capacitor $C_k$ to the ground of the circuit.

In case when the voltage $U_i$ on the source capacitor $C_i$ reaches the value zero during the charge transfer, the control module CM, on the basis of the output signal of the first comparator K1 causes, by means of the control signal provided on the output $D_i$, the opening of the second on-off switch $S_{Hi}$ and thereby the disconnection of the top plate of the source capacitor $C_i$ from the second rail H. At the same time, the control module CM causes, by means of the control signal provided on the output $I_k$, the opening of the first on-off switch $S_{Lk}$ and thereby the disconnection of the top plate of the destination capacitor $C_k$ from the first rail L, and also the concurrent switching of the change-over switch $S_{Gk}$ and thereby the connection of the bottom plate of the destination capacitor $C_k$ to the source of auxiliary voltage $U_H$. Next, the control module CM, on the basis of the output signal of the first comparator K1 by writing the current content of the destination capacitor $C_k$ index register to the source capacitor $C_i$ index register, assigns the function of the source capacitor $C_i$ to the capacitor that until now has acted as the destination capacitor $C_k$, and after that, the control module CM causes, by means of the control signal provided on the output $D_i$, the closure of the second on-off switch $S_{Hi}$ and thereby the connection of the top plate of a new source capacitor $C_i$ to the second rail H. Afterwards, by reduction of the content of the destination capacitor $C_k$ index register by one, the control module CM assigns the function of the destination capacitor $C_k$, whose index is defined by the content of the destination capacitor $C_k$ index register in the control module CM, to the subsequent capacitor in the array A whose capacitance value is twice as lower as the capacitance value of the capacitor which acted as the destination capacitor directly before. Then, the control module CM causes, by means of the control signal provided on the output $I_k$, the closure of the first on-off switch $S_{Lk}$ and thereby the connection of the top plate of the destination capacitor $C_k$ to the first rail L, and also the concurrent switching of the change-over switch $S_{Gk}$ and thereby the connection of the bottom plate of the destination capacitor $C_k$ to the ground of the circuit (FIG. 5).

In both cases, the control module CM continues to control the process of charge transfer on the basis of the output signals of both comparators K1 and K2. Each occurrence of the active state on the output of second comparator K2 causes the assignment of the function of the destination capacitor $C_k$ to the subsequent capacitor in the array A, whose capacitance value is twice as lower as the capacitance value of the capacitor, which acted as the destination capacitor directly before. On the other hand, each occurrence of the active state on the output of first comparator K1 causes the assignment of the function of the source capacitor $C_i$ to the capacitor that until now has acted as the destination capacitor $C_k$, and at the same time the assignment of the function of the destination capacitor $C_k$ to the subsequent capacitor in the array A whose capacitance value is twice as lower as the capacitance value of the capacitor which acted as the destination capacitor directly before.

The process of charge redistribution is terminated when the capacitor $C_0$ having the lowest capacitance value in the array A stops to act as the destination capacitor $C_k$. Such situation occurs when the active state appears on the output of the first comparator K1 or on the output of the second comparator K2 during charge transfer to the capacitor $C_0$. When the active state appears on the output of the second comparator K2, the control module CM assigns the value one to the bit $b_0$.

After termination of redistribution of charge delivered by the use of the current source I and accumulated previously in the sampling capacitor $C_n$ and after assigning the corresponding values to the bits $b_{n-1}, b_{n-2}, \ldots, b_1, b_0$ in the output digital word, the control module CM activates the signal provided on the complete conversion signal output OutR and causes introduction of the apparatus into the relaxation phase by switching off the current source I, also the switching of the current source change-over switch $S_I$ and thereby the connection of the one end of the current source I to the voltage supply $U_{DD}$, also the switching of the voltage source change-over switch $S_U$ to the position connecting the inverting input of the second comparator K2 to the source of the reference voltage $U_L$, also the closure of the first on-off switches $S_{Ln}$ and $S_{Ln-1}$, $S_{Ln-2}, \ldots, S_{L1}, S_{L0}$ and thereby the connection of the top plate of the sampling capacitor $C_n$ and the connection of the top plates of all the capacitors $C_{n-1}, C_{n-2}, \ldots, C_1, C_0$ in the array A to the first rail L, and also the concurrent switching of the change-over switches $S_{Gn}$ and $S_{Gn-1}, S_{Gn-2}, \ldots, S_{G1}, S_{G0}$ to the positions connecting the bottom plate of the sampling capacitor $C_n$ and the bottom plates of the capacitors $C_{n-1}, C_{n-2}, \ldots, C_1, C_0$ to the ground of the circuit. At the same time, the control module causes the closure of the first rail on-off switch $S_{Gall}$ and thereby the connection of the first rail L to the ground of the circuit, enforcing a complete discharge of the sampling capacitor $C_n$ and of the capacitors $C_{n-1}, C_{n-2}, \ldots, C_1, C_0$ in the array A, and also the opening of the second on-off switches $S_{Hn}$ and $S_{Hn-2}, \ldots, S_{H1}, S_{H0}$ in the array A, and also the closure of the second on-off switch $S_{Hn-1}$ and thereby the connection of the second rail H to the first rail L and to the ground of the circuit (FIG. 9) which prevents the occurrence of a random potential on the first rail H.

The operation of the another version of this apparatus variant consists in that as soon as the control module CM detects the beginning of the active state of the signal on the trigger input InS of the apparatus, the control module CM causes, by means of the control signal provided on the output $A_U$, the switching of the voltage source change-over switch $S_U$ and thereby the connection of the inverting input of the second comparator K2 to the source of the converted voltage $U_{IN}$. At the same time, the control module CM causes, by means of the control signal provided on the output $D_{all}$, the opening of the first rail on-off switch $S_{Gall}$ and thereby the disconnection of the first rail L from the ground of the circuit. At the same time, the control module CM causes, by means of the control signals provided on the outputs $I_{n-2}, \ldots, I_1, I_0$, the opening of the first on-off switches $S_{Ln-2}, \ldots, S_{L1}, S_{L0}$ and thereby the disconnection of the top plates of all the capacitors $C_{n-2}, \ldots, C_1, C_0$ in the array A from the first rail L and also the switching of the change-over switches $S_{Gn-2}, \ldots, S_{G1}, S_{G0}$ and thereby the connection of the bottom plates of the capacitors $C_{n-2}, \ldots, C_1, C_0$ to the source of auxiliary voltage $U_H$. At the same time, the control module CM causes, by means of the control signal provided on the output $A_I$, the switching on the current source I (FIG. 13). At the same time, the control module CM deactivates the signal provided on the complete conversion signal output OutR and assigns the initial value zero to all the bits $b_{n-1}, b_{n-2}, \ldots, b_1, b_0$ in the digital word. The electric charge is accumulated in the capacitor $C_{n-1}$ and at the same time in the sampling capacitor $C_n$ connected in parallel to the capacitor $C_{n-1}$ in the array A of capacitors which are the only capacitors connected at that time to the other end of the current source I through the first rail L and through the closed first on-off switches $S_{Ln}$ and $S_{Ln-1}$.

When the voltage $U_n$ increasing on the sampling capacitor $C_n$ reaches the converted voltage $U_{IN}$ value, the control module CM on the basis of the output signal of the second comparator K2 causes, by means of the control signal provided on the output L, the opening of the first on-off switch $S_{Ln}$ and thereby the disconnection of the top plate of the sampling capacitor $C_n$ from the first rail L, and also the concurrent switching of the change-over switch $S_{Gn}$ and thereby the connection of the bottom plate of the sampling capacitor $C_n$ to the source of auxiliary voltage $U_H$. At the same time, the control module CM causes, by means of the control signal provided on the output $D_{n-1}$, the opening of the second on-off switch $S_{Hn-1}$, and thereby the disconnection of the top plate of the capacitor $C_{n-1}$ from the second rail H, and on the other hand, by means of the control signals provided on the output $A_U$, the switching of the voltage source change-over switch $S_U$ and thereby the connection of the inverting input of the second comparator K2 to the source of the reference voltage $U_L$. Next, the control module CM causes, by means of the control signal provided on the output $A_S$, the switching of the current source change-over switch $S_I$ and thereby the connection of the one end of the current source I to the second rail H. Next, by writing the value of the index of the sampling capacitor $C_n$ to the source capacitor $C_i$ index register in the control module CM, the control module CM assigns the function of the source capacitor $C_i$ whose index is defined by the content of the source capacitor $C_i$ index register to the sampling capacitor $C_n$. At the same time, the control module CM causes, by means of the control signal provided on the output $D_i$, the closure of the second on-off switch $S_{Hi}$ and thereby the connection of the top plate of the source capacitor $C_i$ to the second rail H. At the same time, by writing the value of the index of the capacitor $C_{n-1}$ having the highest capacitance value in the array A to the destination capacitor $C_k$ index register in the control module CM, the control module CM assigns the function of the destination capacitor $C_k$ whose index is defined by the content of the destination capacitor $C_k$ index register to the capacitor $C_{n-1}$. Then, the control module CM causes, by means of the control signal provided on the output $I_k$, the closure of the first on-off switch $S_{Lk}$ and thereby the connection of the top plate of the destination capacitor $C_k$ to the first rail L, and also the concurrent switching of the change-over switch $S_{Gk}$ and thereby the connection of the bottom plate of the destination capacitor $C_k$ to the ground of the circuit. Afterwards, the charge accumulated in the source capacitor $C_i$ is transferred through the second rail H and through the first rail L to the destination capacitor $C_k$ (FIG. 11). Next, the control module CM starts to control the process of redistribution of accumulated charge that is terminated when the capacitor $C_0$ having the lowest capacitance value in the array A stops to act as the destination capacitor $C_k$. After that the control module CM activates the signal provided on the complete conversion signal output OutR, and causes introducing the apparatus into the relaxation phase again.

The another variant of the apparatus operates as follows. Between successive cycles of conversion of voltage values to digital words having a number of bits equal to n, the control module CM keeps the apparatus in the state of relaxation during which the control module CM causes, by means of the control signals provided on the outputs $I_n$ and $I_{n-1}, I_{n-2}, \ldots, I_1, I_0$, the closure of the first on-off switches $S_{Ln}$, and $S_{Ln-1}$, $S_{Ln-2}, \ldots, S_{L1}, S_{L0}$ and thereby the connection of the top plate of the sampling capacitor $C_n$ and the connection of the top plates of all the capacitors $C_{n-1}, C_{n-2}, \ldots, C_1, C_0$ in the array A to the first rail L, and also the switching of the change-over switches $S_{Gn}$ and $S_{Gn-1}, \ldots, S_{G1}, S_{G0}$ and thereby the connection of the bottom plate of the sampling capacitor $C_n$ and the connection of the bottom plates of the capacitors $C_{n-1}, \ldots, C_1, C_0$ in the array A to the ground of the circuit. On the other hand, by means of the control signal provided on the output $D_{all}$, the control module CM causes the closure of the first rail on-off switch $S_{Gall}$ and thereby the connection of the first rail L to the ground of the circuit enforcing in this way a complete discharge of the sampling capacitor $C_n$ and of the capacitors $C_{n-1}, \ldots, C_1, C_0$ in the array A. Afterwards, the control module CM causes, by means of the control signal provided on the output $D_n$, the closure of the second on-off switch $S_{Hn}$ and thereby the connection of the second rail H to the first rail L and to the ground of the circuit which prevents the occurrence of a random potential on the second rail H. At the same time, the control module CM causes, by means of the control signals provided on the output $A_U$, the switching of the voltage source change-over switch $S_U$ and thereby the connection of the inverting input of the second comparator K2 to the source of the reference voltage $U_L$. At the same time, the control module CM causes, by means of the control signals provided on the output $D_{n-1}, D_{n-2}, \ldots, D_1, D_0$, the opening of the second on-off switches $S_{Hn-1}, S_{Hn-2}, \ldots, S_{H1}, S_{H0}$. At the same time, the control module CM causes, by means of the control signal provided on the output $A_I$, the switching off the current source I, and on the other hand, by means of the control signal provided on the output $A_J$, the switching off the additional current source J (FIG. 15).

As soon as the control module CM detects the beginning of the active state of the signal on the trigger input InS of the apparatus, the control module CM causes, by means of the control signal provided on the output $A_U$, the switching of the voltage source change-over switch $S_U$ and thereby the connection of the inverting input of the second comparator K2 to the source of the converted voltage $U_{IN}$. At the same time, the control module CM causes, by means of the control signal provided on the output $D_{all}$, the opening of the first rail on-off switch $S_{Gall}$ and thereby the disconnection of the first rail L from the ground of the circuit. At the same time, the control module CM causes, by means of the control signals provided on the outputs $I_{n-1}, I_{n-2}, \ldots, I_1, I_0$, the opening of the first on-off switches $S_{Ln-1}, S_{Ln-2}, \ldots, S_{L1}, S_{L0}$ and thereby the disconnection of the top plates of all the capacitors $C_{n-1}, C_{n-2}, \ldots, C_1, C_0$ in the array A from the first rail L, and also the switching of the change-over switches $S_{Gn-1}, S_{Gn-2}, \ldots, S_{G1}, S_{G0}$ and thereby the connection of the bottom plates of the capacitors $C_{n-1}, C_{n-2}, \ldots, C_1, C_0$ to the source of auxiliary voltage $U_H$. At the same time, the control module CM causes, by means of the control signal provided on the output $A_I$, the switching on the current source I (FIG. 16). At the same time, the control module CM deactivates the signal provided on the complete conversion signal output OutR and assigns the initial value zero to all the bits $b_{n-1}, b_{n-2}, \ldots, b_1, b_0$ in the digital word. The electric charge delivered by the use of the current source I is accumulated in the sampling capacitor $C_n$ which is the only capacitor connected at that time to the other end of the current source I through the first rail L and through the closed first on-off switch $S_{Ln}$. Accumulation of charge in the sampling capacitor $C_n$ causes a progressive increase of the voltage $U_n$ on that capacitor which is compared by the second comparator K2 to the converted voltage $U_{IN}$ value.

When the voltage $U_n$ increasing on the sampling capacitor $C_n$ reaches the converted voltage $U_{IN}$ value which represents the mapping of the converted voltage $U_{IN}$ value to the portion of electric charge proportional to this value and accumulated in the sampling capacitor $C_n$, the control module CM on the basis of the output signal of the second comparator K2 causes, by means of the control signal provided on the output $A_I$, the switching off the current source I, and also by means of the control signal provided on the output $I_n$, the opening of the first on-off switch $S_{Ln}$ and thereby the disconnection of the top plate of the sampling capacitor $C_n$ from the first rail L, and also the concurrent switching of the change-over switch $S_{Gn}$ and thereby the connection of the bottom plate of the sampling capacitor $C_n$ to the source of auxiliary voltage $U_H$. At the same time, the control module CM causes, by means of the control signals provided on the output $A_U$, the switching of the voltage source change-over switch $S_U$ and thereby the connection of the inverting input of the second comparator K2 to the source of the reference voltage $U_L$. Next, by writing the value of the index of the sampling capacitor $C_n$ to the source capacitor $C_i$ index register in the control module CM, the control module CM assigns the function of the source capacitor $C_i$ whose index is defined by the content of the source capacitor $C_i$ index register to the sampling capacitor $C_n$. At the same time, by writing the value of the index of the capacitor $C_{n-1}$ having the highest capacitance value in the array A to the destination capacitor $C_k$ index register in the control module CM, the control module CM assigns the function of the destination capacitor $C_k$ whose index is defined by the content of the destination capacitor $C_k$ index register to the capacitor $C_{n-1}$. Then, the control module CM causes, by means of the control signal provided on the output $I_k$, the closure of the first on-off switch $S_{Lk}$ and thereby the connection of the top plate of the destination capacitor $C_k$ to the first rail L, and also the concurrent switching of the change-over switch $S_{Gk}$ and thereby the connection of the bottom plate of the destination capacitor $C_k$ to the ground of the circuit. Next, the control module CM causes, by means of the control signal provided on the output $A_J$, the switching on the additional current source J by the use of which the charge accumulated in the source capacitor $C_i$ is transferred through the second rail H and through the first rail L to the destination capacitor $C_k$ (FIG. 17) while the voltage $U_i$ on the source capacitor $C_i$ progressively decreases whereas at the same time the voltage $U_k$ on the destination capacitor $C_k$ progressively increases.

In case when the voltage $U_k$ on the current destination capacitor $C_k$ reaches the reference voltage $U_L$ value during the charge transfer, the control module CM on the basis of the output signal of the second comparator K2 assigns the value one to the relevant bit $b_k$ in the digital word, and the control module CM causes, by means of the control signal provided on the output $I_k$, the opening of the first on-off switch $S_{Lk}$ and thereby the disconnection of the top plate of the destination capacitor $C_k$ from the first rail L and also the concurrent switching of the change-over switch $S_{Gk}$ and thereby the connection of the bottom plate of the destination capacitor $C_k$ to the source of auxiliary voltage $U_H$. Afterwards, by reduction of the content of the destination capacitor $C_k$ index register by one, the control module CM assigns the function of the destination capacitor $C_k$ to the subsequent capacitor in the array A whose capacitance value is twice as lower as the capacitance value of the capacitor which acted as the destination capacitor directly before. After that the control module CM causes, by means of the control signal provided on the output $I_k$, the closure of the first on-off switch $S_{Lk}$ and thereby the connection of the top plate of a new destination capacitor $C_k$ to the first rail L, and also the concurrent switching of the change-over switch $S_{Gk}$ and thereby the connection of the bottom plate of the destination capacitor $C_k$ to the ground of the circuit.

In case when the voltage $U_i$ on the source capacitor $C_i$ reaches the value zero during the charge transfer, the control module CM, on the basis of the output signal of the first comparator K1 causes, by means of the control signal provided on the output $D_i$, the opening of the second on-off switch $S_{Hi}$ and thereby the disconnection of the top plate of the source capacitor $C_i$ from the second rail H. At the same time, the control module CM causes, by means of the control signal provided on the output $I_k$, the opening of the first on-off switch $S_{Lk}$ and thereby the disconnection of the top plate of the destination capacitor $C_k$ from the first rail L and also the concurrent switching of the change-over switch $S_{Gk}$ and thereby the connection of the bottom plate of the destination capacitor $C_k$ to the source of auxiliary voltage $U_H$. Next, the control module CM, on the basis of the output signal of the first comparator K1, by writing the current content of the destination capacitor $C_k$ index register to the source capacitor $C_i$ index register, assigns the function of the source capacitor $C_i$ to the capacitor that until now has acted as the destination capacitor $C_k$, and after that, the control module CM causes, by means of the control signal provided on the output $D_i$, the closure of the second on-off switch $S_{Hi}$ and thereby the connection of the top plate of a new source capacitor $C_i$ to the second rail H. Afterwards, by reduction of the content of the destination capacitor $C_k$ index register by one, the control module CM assigns the function of the destination capacitor $C_k$, whose index is defined by the content of the destination capacitor $C_k$ index register in the control module CM, to the subsequent capacitor in the array A, whose capacitance value is twice as lower as the capacitance value of the capacitor, which acted as the destination capacitor directly before. After that, the control module CM causes, by means of the control signal provided on the output $I_k$, the closure of the first on-off switch $S_{Lk}$ and thereby the connection of the top plate of the capacitor $C_k$ to the first rail L, and also the concurrent switching of the change-over switch $S_{Gk}$ and thereby the connection of the bottom plate of the new destination capacitor $C_k$ to the ground of the circuit (FIG. 18).

In both cases the control module CM continues to control the process of charge transfer on the basis of the output signals of both comparators K1 and K2. Each occurrence of the active state on the output of second comparator K2 causes the assignment of the function of the destination capacitor $C_k$ to the subsequent capacitor in the array A whose capacitance value is twice as lower as the capacitance value of the capacitor which acted as the destination capacitor directly before. On the other hand, each occurrence of the active state on the output of the first comparator K1 causes the assignment of the function of the source capacitor $C_i$ to the capacitor that until now has acted as the destination capacitor $C_k$, and at the same time the assignment of the function of the destination capacitor $C_k$ to the subsequent capacitor in the array A, whose capacitance value is twice as lower as the capacitance value of the capacitor which acted as the destination capacitor directly before. The process of charge redistribution is terminated when the capacitor $C_0$ having the lowest capacitance value in the array A stops to act as the destination capacitor $C_k$. Such situation occurs when the active state appears on the output of the first comparator K1, or on the output of the second comparator K2 during charge transfer to the capacitor $C_0$.

When the active state appears on the output of the second comparator K2, the control module CM assigns the value one to the bit $b_0$. After termination of redistribution of charge delivered by the use of the current source I and accumulated previously in the sampling capacitor $C_n$ and after assigning the corresponding values to the bits $b_{n-1}, b_{n-2}, \ldots, b_1, b_0$ in the output digital word, the control module CM activates the signal provided on the complete conversion signal output OutR and causes introduction of the apparatus into the relaxation phase by switching off the additional current source J, also the switching of the voltage source change-over switch $S_U$ to the position connecting the inverting input of the second comparator K2 to the source of the reference voltage $U_L$, also the closure of the first on-off switches $S_{Ln}$, and $S_{Ln-1}$, $S_{Ln-2}, \ldots, S_{L1}, S_{L0}$ and thereby the connection of the top plate of the sampling capacitor $C_n$ and the connection of the top plates of all the capacitors $C_{n-1}, C_{n-2}, \ldots, C_1, C_0$ in the array A to the first rail L, and also the concurrent switching of the change-over switches $S_{Gn}$ and $S_{Gn-1}, S_{Gn-2}, \ldots, S_{G1}, S_{G0}$ to the positions connecting the bottom plate of the sampling capacitor $C_n$ and the bottom plates of the capacitors $C_{n-1}$, $C_{n-2}, \ldots, C_1, C_0$ to the ground of the circuit. At the same time, the control module causes the closure of the first rail on-off switch $S_{Gall}$ and thereby the connection of the first rail L to the ground of the circuit, enforcing a complete discharge of the sampling capacitor $C_n$ and of the capacitors $C_{n-1}, C_{n-2}, \ldots$, $C_1, C_0$ in the array A, and also the opening of the second on-off switches $S_{Hn-1}, S_{Hn-2}, \ldots, S_{H1}, S_{H0}$ in the array A, and also the closure of the second on-off switch $S_{Hn}$ and thereby the connection of the second rail H to the first rail L and to the ground of the circuit (FIG. 15), which prevents the occurrence of a random potential on the first rail H.

The operation of the another version of this apparatus variant consists in that as soon as the control module CM detects the beginning of the active state of the signal on the trigger input InS of the apparatus, the control module CM causes, by means of the control signal provided on the output $A_U$, the switching of the voltage source change-over switch $S_U$ and thereby the connection of the inverting input of the second comparator K2 to the source of the converted voltage $U_{IN}$. At the same time, the control module CM causes, by means of the control signal provided on the output $D_{all}$, the opening of the first rail on-off switch $S_{Gall}$ and thereby the disconnection of the first rail L from the ground of the circuit. At the same time, the control module CM causes, by means of the control signals provided on the outputs $I_{n-2}, \ldots, I_1, I_0$, the opening of the first on-off switches $S_{Ln-2}, \ldots, S_{L1}, S_{L0}$ and thereby the disconnection of the top plates of all the capacitors $C_{n-2}, \ldots, C_1, C_0$ in the array A from the first rail L and also the switching of the change-over switches $S_{Gn-2}, \ldots, S_{G1}, S_{G0}$ and thereby the connection of the bottom plates of the capacitors $C_{n-2}, \ldots, C_1, C_0$ to the source of auxiliary voltage $U_H$. At the same time, the control module CM causes, by means of the control signal provided on the output $A_I$, the switching on the current source I (FIG. 19). At the same time, the control module CM deactivates the signal provided on the complete conversion signal output OutR and assigns the initial value zero to all the bits $b_{n-1}$, $b_{n-2}$, ... $b_1$, $b_0$ in the digital word. The electric charge is accumulated in the capacitor $C_{n-1}$ and at the same time in the sampling capacitor $C_n$ connected in parallel to the capacitor $C_{n-1}$ in the array A of capacitors which are the only capacitors connected at that time to the other end of the current source I through the first rail L and the closed first on-off switches $S_{Ln}$ and $S_{Ln-1}$.

When the voltage $U_n$ increasing on the sampling capacitor $C_n$ reaches the converted voltage $U_{IN}$ value, the control module CM on the basis of the output signal of the second comparator K2 causes, by means of the control signal provided on the output $A_I$, the switching off the current source I, and on the other hand, by means of the control signal provided on the output $I_n$, the opening of the first on-off switch $S_{Ln}$ and thereby the disconnection of the top plate of the sampling capacitor $C_n$ from the first rail L, and also the concurrent switching of the change-over switch $S_{Gn}$ and thereby the connection of the bottom plate of the sampling capacitor $C_n$ to the source of auxiliary voltage $U_H$. At the same time, the control module CM causes, by means of the control signals provided on the output $A_U$, the switching of the voltage source change-over switch $S_U$ and thereby the connection of the inverting input of the second comparator K2 to the source of the reference voltage $U_L$. Next, by writing the value of the index of the sampling capacitor $C_n$ to the source capacitor $C_i$ index register in the control module CM, the control module CM assigns the function of the source capacitor $C_i$ whose index is defined by the content of the source capacitor $C_i$ index register to the sampling capacitor $C_n$. At the same time, by writing the value of the index of the capacitor $C_{n-1}$ having the highest capacitance value in the array A to the destination capacitor $C_k$ index register in the control module CM, the control module CM assigns the function of the destination capacitor $C_k$ whose index is defined by the content of the destination capacitor $C_k$ index register to the capacitor $C_{n-1}$. Then, the control module CM causes, by means of the control signal provided on the output $I_k$, the closure of the first on-off switch $S_{Lk}$ and thereby the connection of the top plate of the destination capacitor $C_k$ to the first rail L, and also the concurrent switching of the change-over switch $S_{Gk}$ and thereby the connection of the bottom plate of the destination capacitor $C_k$ to the ground of the circuit. Next, the control module CM causes, by means of the control signal provided on the output $A_J$, the switching on the additional current source J by the use of which the charge is transferred from the source capacitor $C_i$ through the second rail H and through the first rail L to the destination capacitor $C_k$ (FIG. 17). Next, the control module CM starts to control the process of redistribution of accumulated charge that is terminated when the capacitor $C_0$ having the lowest capacitance value in the array A stops to act as the destination capacitor $C_k$. After that the control module CM activates the signal provided on the complete conversion signal output OutR, and causes introducing the apparatus into the relaxation phase again.

ABBREVIATIONS

A array of capacitors
CM control module
K1 first comparator
K2 second comparator
I current source
J additional current source
$U_L$ source of the reference voltage
$U_H$ source of auxiliary voltage
$U_{IN}$ source of the converted voltage
$U_{DD}$ voltage supply
InS trigger input
In1 first control input of the control module
In2 second control input of the control module
B digital output of the control module
E set of control outputs of the control module
OutR complete conversion signal output
L first rail
H second rail
$C_{n-1}$, $C_{n-2}$, ..., $C_1$, $C_0$ capacitors in the array of capacitors
$C_n$ sampling capacitor
$C_i$ source capacitor
$C_k$ destination capacitor
$U_{n-1}$, $U_{n-2}$, ..., $U_1$, $U_0$ voltages on the capacitors in the array of capacitors
$U_n$ voltage on the sampling capacitor
$U_i$ voltage on the source capacitor
$U_k$ voltage on the destination capacitor
$b_{n-1}$, $b_{n-2}$, ..., $b_1$, $b_0$ bits in the digital word
$S_{Ln}$ first on-off switch
$S_{Hn}$ second on-off switch
$S_{Gn}$ change-over switch
$S_{Ln-1}$, $S_{Ln-2}$, ..., $S_{L1}$, $S_{L0}$ first on-off switches in the array of capacitors
$S_{Hn-1}$, $S_{Hn-2}$, ..., $S_{H1}$, $S_{H0}$ second on-off switches in the array of capacitors
$S_{Gn-1}$, $S_{Gn-2}$, ..., $S_{G1}$, $S_{G0}$ change-over switches in the array of capacitors
$S_{Gall}$ first rail on-off switch
$S_{Un}$ voltage source on-off switch
$S_{Un-1}$ additional voltage source on-off switch
$S_U$ voltage source change-over switch
$S_I$ current source change-over switch
$A_1$, $A_J$, $A_S$, $A_U$ control outputs of the control module
$I_n$, $I_{n-1}$, $I_{n-2}$, ..., $I_1$, $I_0$ control outputs of the control module
$D_n$, $D_{n-1}$, $D_{n-2}$, ..., $D_1$, $D_0$, $D_{Gall}$ control outputs of the control module

The invention claimed is:

1. A method for conversion of a voltage value to a digital word consisting in mapping the voltage value to a portion of electric charge proportional to this voltage value, while charge is accumulated in at least one capacitor, and in assigning the digital word having a number of bits denoted by n characterized in that after detecting a beginning of an active state of a signal on a trigger input (InS) by means of a control module (CM), the converted voltage value is mapped to the portion of electric charge proportional to this converted voltage value, and the portion of charge is accumulated in a sampling capacitor ($C_n$) by connecting the sampling capacitor ($C_n$) in parallel to a source of the converted voltage ($U_{IN}$) during the active state of the signal on the trigger input (InS), while a duration of the active state of the signal on the trigger input (InS) is not shorter than an assumed minimum value, and after detecting an end of the active state of the signal on the trigger input (InS) by means of the control module (CM), a function of a source capacitor ($C_i$) whose index is defined by a content of a source capacitor ($C_i$) index register in the control module (CM) is assigned by means of the control module (CM) to the sampling capacitor ($C_n$) by writing a value of the index of the sampling capacitor ($C_n$) to the source capacitor ($C_i$) index register, and at the same time a function of a destination capacitor ($C_k$) whose index is defined by the content of a destination capacitor ($C_k$) index register in the control module (CM) is assigned by means of the control module (CM) to a capacitor ($C_{n-1}$) having the highest capacitance value in an array (A) of capacitors while a capacitance value of each capacitor ($C_{n-1}$, $C_{n-2}$, ..., $C_1$, $C_0$) of a given index is twice as high as a capacitance value of a capacitor of a previous index by writing the value of the index of the capacitor ($C_{n-1}$) to the destination capacitor ($C_k$) index register, and after that, the process of redistribution of the accumulated charge in capacitors in the array (A) is realized and during this process the charge accumulated in the source capacitor ($C_i$) is transferred to the destination capacitor ($C_k$) by the use of a current source (I), and at the same time a voltage ($U_k$) increasing on the destination capacitor ($C_k$) is compared to a reference voltage ($U_L$) value by the use of a second comparator (K2), and also a voltage ($U_i$) on the source capacitor ($C_i$) is observed by the use of a first comparator (K1), and when the voltage ($U_i$) on the source capacitor ($C_i$) observed by the use of the first comparator (K1) equals zero during the charge transfer, the function of the source capacitor ($C_i$) is assigned to the current destination capacitor ($C_k$) by means of the control module (CM) on the basis of an output signal of the first comparator (K1) by writing a current content of the destination capacitor ($C_k$) index register in the control module (CM) to the source capacitor ($C_i$) index register in the control module (CM), and also the function of the destination capacitor ($C_k$) is assigned by reducing the content of the destination capacitor ($C_k$) index register by one to a subsequent capacitor in the array (A) whose capacitance value is twice lower than a capacitance value of a capacitor that operated as the destination capacitor directly before, and charge transfer from a new source capacitor ($C_i$) to a new destination capacitor ($C_k$) is continued by the use of the current source (I), and when the voltage ($U_k$) on the destination capacitor ($C_k$) observed by the use of the second comparator (K2) equals the reference voltage ($U_L$) value during the transfer of charge from the source capacitor ($C_i$) to the destination capacitor ($C_k$), the function of the destination capacitor ($C_k$) is assigned by reducing the content of the destination capacitor ($C_k$) index register by one by means of the control module (CM) on the basis of an output signal of the second comparator (K2) to the subsequent capacitor in the array (A) whose capacitance value is twice lower than the capacitance value of the capacitor that operated as the destination capacitor directly before, and also the charge transfer from the source capacitor ($C_i$) to a new destination capacitor ($C_k$) is continued, while this process is still controlled by means of the control module (CM) on the basis of the output signals of the comparators (K1) and (K2) until the voltage ($U_i$) on the source capacitor ($C_i$) observed by the use of the first comparator (K1) equals zero during the period in which the function of the destination capacitor ($C_k$) is assigned to the capacitor ($C_0$) having the lowest capacitance value in the array (A) of capacitors, or the voltage ($U_0$) increasing on the capacitor ($C_0$) and observed at the same time by the use of the second comparator (K2) equals the reference voltage ($U_L$) value while the value one is assigned to these bits in the digital word corresponding to the capacitors in the array (A) of capacitors on which the voltage equal to the reference voltage ($U_L$) value has been obtained, and the value zero is assigned to the other bits by means of the control module (CM).

2. The method for conversion as claimed in claim 1 characterized in that after detecting the beginning of the active state of the signal on the trigger input (InS) by means of the control module (CM), electric charge is accumulated in the capacitor ($C_{n-1}$) having the highest capacitance value in the array (A) of capacitors and at the same time in the sampling capacitor ($C_n$) connected in parallel to the capacitor ($C_{n-1}$) in the array (A) of capacitors, where the capacitance value of the sampling capacitor ($C_n$) is not smaller than the capacitance value of the capacitor ($C_{n-1}$), by connecting at the same time both capacitors ($C_n$) and ($C_{n-1}$) in parallel to the source of the converted voltage ($U_{IN}$) during the active state of the signal on the trigger input (InS), and after detecting the end of the active state of the signal on the trigger input (InS) by means of the control module (CM), the function of the source capacitor ($C_i$) whose index is defined by the content of the source capacitor ($C_i$) index register in the control module (CM) is assigned by means of the control module (CM) to the sampling capacitor ($C_n$) by writing the value of the index of the sampling capacitor ($C_n$) to the source capacitor ($C_i$) index register, and also the function of the destination capacitor ($C_k$), whose index is defined by the content of the destination capacitor ($C_k$) index register in the control module (CM), is assigned by means of the control module (CM) to the capacitor ($C_{n-1}$) having the highest capacitance value in the array (A) of capacitors by writing the value of the index of the capacitor ($C_{n-1}$) to the destination capacitor ($C_k$) index register, and after that the process of electric charge transfer from the source capacitor ($C_i$) to the destination capacitor ($C_k$) is realized by the use of the current source (I), while this process is controlled by means of the control module (CM) on the basis of the output signals of the comparators (K1) and (K2) until the voltage ($U_i$) on the current source capacitor ($C_i$) observed by the use of the first comparator (K1) equals zero during the period in which the function of the destination capacitor ($C_k$) is assigned to the capacitor ($C_0$) having the lowest capacitance value in the array (A) of capacitors, or the voltage ($U_0$), which increases on the capacitor ($C_0$) and is observed simultaneously by the use of the second comparator (K2), equals the reference voltage ($U_L$) value.

3. The method for conversion as claimed in claim 1 characterized in that after detecting the beginning of the active state of the signal on the trigger input (InS) by means of the control module (CM), electric charge is delivered by the use of the current source (I) and accumulated in the sampling capacitor ($C_n$), and at the same time the voltage ($U_n$) increasing on the sampling capacitor ($C_n$) is compared to the converted voltage ($U_{IN}$) value by the use of the second comparator (K2), which is realized until the voltage ($U_n$), which increases on the sampling capacitor ($C_n$) equals the converted voltage ($U_{IN}$) value, and after that, the function of the source capacitor ($C_i$) whose index is defined by the content of the source capacitor ($C_i$) index register in the control module (CM) is assigned by means of the control module (CM) to the sampling capacitor ($C_n$) by writing the value of the index of the sampling capacitor ($C_n$) to the source capacitor ($C_i$) index register, and also the function of the destination capacitor ($C_k$) whose index is defined by the content of the destination capacitor ($C_k$) index register in the control module (CM) is assigned by means of the control module (CM) to the capacitor ($C_{n-1}$) having the highest capacitance value in the array (A) of capacitors by writing the value of the index of the capacitor ($C_{n-1}$) to the destination capacitor ($C_k$) index register, and after that, the process of electric charge transfer from the source capacitor ($C_i$) to the destination capacitor ($C_k$) is realized by the use of the current source (I), while this process is controlled by means of the control module (CM) on the basis of the output signals of the comparators (K1) and (K2) until the voltage ($U_i$) on the current source capacitor ($C_i$) observed by the use of the first comparator (K1) equals zero during the period in which the function of the destination capacitor ($C_k$) is assigned to the capacitor ($C_0$) having the lowest capacitance value in the array (A) of capacitors, or the voltage ($U_0$), which increases on the capacitor ($C_0$) and is observed simultaneously by the use of the second comparator (K2), equals the reference voltage ($U_L$) value.

4. The method for conversion as claimed in claim 1 characterized in that after detecting the beginning of the active state of the signal on the trigger input (InS) by means of the control module (CM), electric charge is delivered by the use of the current source (I) and accumulated at the same time in the capacitor ($C_{n-1}$) having the highest capacitance value in the array (A) of capacitors and in the sampling capacitor ($C_n$) connected in parallel to the capacitor ($C_{n-1}$) in the array (A) of capacitors where the capacitance value of the sampling capacitor ($C_n$) is not smaller than the capacitance value of the capacitor ($C_{n-1}$), and at the same time the voltage ($U_n$) increasing on the sampling capacitor ($C_n$) is compared to the converted voltage ($U_{IN}$) value by the use of the second comparator (K2), which is realized until the voltage ($U_n$), which increases on the sampling capacitor ($C_n$) equals the converted voltage ($U_{IN}$) value, and after that the function of the source capacitor ($C_i$) whose index is defined by the content of the source capacitor ($C_i$) index register in the control module (CM) is assigned by means of the control module (CM) to the sampling capacitor ($C_n$) by writing the value of the index of the sampling capacitor ($C_n$) to the source capacitor ($C_i$) index register, and also the function of the destination capacitor ($C_k$) whose index is defined by the content of the destination capacitor ($C_k$) index register in the control module (CM) is assigned by means of the control module (CM) to the capacitor ($C_{n-1}$) having the highest capacitance value in the array (A) of capacitors by writing the value of the index of the capacitor ($C_{n-1}$) to the destination capacitor ($C_k$) index register, and after that, the process of charge transfer from the source capacitor ($C_i$) to the destination capacitor ($C_k$) is realized by the use of the current source (I), while this process is controlled by means of the control module (CM) on the basis of the output signals of the comparators (K1) and (K2) until the voltage ($U_i$) on the current source capacitor ($C_i$) observed by the use of the first comparator (K1) equals zero during the period in which the function of the destination capacitor ($C_k$) is assigned to the capacitor ($C_0$) having the lowest capacitance value in the array (A) of capacitors, or the voltage ($U_0$), which increases on the capacitor ($C_0$) and is observed simultaneously by the use of the second comparator (K2), equals the reference voltage ($U_L$) value.

5. The method for conversion as claimed in claim 1 characterized in that after detecting the beginning of the active state of the signal on the trigger input (InS) by means of the control module (CM) electric charge is delivered by the use of the current source (I) and accumulated in the sampling capacitor ($C_n$), and at the same time the voltage ($U_n$) increasing on the sampling capacitor ($C_n$) is compared to the converted voltage ($U_{IN}$) value by the use of the second comparator (K2), which is realized until the voltage ($U_n$), which increases on the sampling capacitor ($C_n$) equals the converted voltage ($U_{IN}$) value, and after that, the function of the source capacitor ($C_i$) whose index is defined by the content of the source capacitor ($C_i$) index register in the control module (CM) is assigned by means of the control module (CM) to the sampling capacitor ($C_n$) by writing the value of the index of the sampling capacitor ($C_n$) to the source capacitor ($C_i$) index register, and also the function of the destination capacitor ($C_k$) whose index is defined by the content of the destination capacitor ($C_k$) index register in the control module (CM) is assigned by means of the control module (CM) to the capacitor ($C_{n-1}$) having the highest capacitance value in the array (A) of capacitors by writing the value of the index of the capacitor ($C_{n-1}$) to the destination capacitor ($C_k$) index register, and after that, the process of redistribution of accumulated electric charge is realized during which charge is transferred from the source capacitor ($C_i$) to the destination capacitor ($C_k$) by the use of the additional current source (J) whose effectiveness is different from the effectiveness of the current source (I) and the process of charge redistribution is controlled by means of the control module (CM) on the basis of the output signals of the comparators (K1) and (K2) until the voltage ($U_i$) on the current source capacitor ($C_i$) observed by the use of the first comparator (K1) equals zero during the period in which the function of the destination capacitor ($C_k$) is assigned to the capacitor ($C_0$) having the lowest capacitance value in the array (A) of capacitors, or the voltage ($U_0$), which increases on the capacitor ($C_0$) and is observed simultaneously by the use of the second comparator (K2), equals the reference voltage ($U_L$) value.

6. The method for conversion as claimed in claim 1 characterized in that after detecting the beginning of the active state of the signal on the trigger input (InS) by means of the control module (CM), electric charge is delivered by the use of the current source (I) and accumulated in the capacitor ($C_{n-1}$) having the highest capacitance value in the array (A) of capacitors and at the same time in the sampling capacitor ($C_n$) connected in parallel to the capacitor ($C_{n-1}$) in the array (A) of capacitors where the capacitance value of the sampling capacitor ($C_n$) is not smaller than the capacitance value of the capacitor ($C_{n-1}$), and at the same time the voltage ($U_n$) increasing on the sampling capacitor ($C_n$) is compared to the converted voltage ($U_{IN}$) value by the use of the second comparator (K2), which is realized until the voltage ($U_n$), which increases on the sampling capacitor ($C_n$) equals the converted voltage ($U_{IN}$) value, and after that, the function of the source capacitor ($C_i$) whose index is defined by the content of the source capacitor ($C_i$) index register in the control module (CM) is assigned by means of the control module (CM) to the sampling capacitor ($C_n$) by writing the value of the index of the sampling capacitor ($C_n$) to the source capacitor ($C_i$) index register, and also the function of the destination capacitor ($C_k$) whose index is defined by the content of the destination capacitor ($C_k$) index register in the control module (CM) is assigned by means of the control module (CM) to the capacitor ($C_{n-1}$) having the highest capacitance value in the array (A) of capacitors by writing the value of the index of the capacitor ($C_{n-1}$) to the destination capacitor ($C_k$) index register, and after that, the process of redistribution of accumulated electric charge is realized during which charge is transferred from the source capacitor ($C_i$) to the destination capacitor ($C_k$) by the use of the additional current source (J) whose effectiveness is different from the effectiveness of the current source (I) and the process of charge redistribution is controlled by means of the control module (CM) on the basis of the output signals of the comparators (K1) and (K2) until the voltage ($U_i$) on the current source capacitor ($C_i$) observed by the use of the first comparator (K1) equals zero during the period in which the function of the destination capacitor ($C_k$) is assigned to the capacitor ($C_0$) having the lowest capacitance value in the array (A) of capacitors, or the voltage ($U_0$), which increases on the capacitor ($C_0$) and is observed simultaneously by the use of the second comparator (K2), equals the reference voltage ($U_L$) value.

7. An apparatus for conversion of a voltage value to a digital word comprising an array of capacitors and at least one comparator connected to a control module equipped with a digital output where control outputs of the control module are connected to the array of capacitors characterized in that a source of the converted voltage ($U_{IN}$) is connected to the array (A) of capacitors whose control inputs are connected to a set of control outputs (E) of the control module (CM), and also the control module (CM) is equipped with a digital output (B), a complete conversion signal output (OutR), a trigger input (InS) and two control inputs (In1) and (In2) where the first control input (In1) is connected to an output of a first comparator (K1) whose inputs are connected to one pair of outputs of the array (A) of capacitors, and the other control input (In2) of the control module (CM) is connected to an output of the second comparator (K2) whose inputs are connected to the other pair of outputs of the array (A), and furthermore, a source of auxiliary voltage ($U_H$) together with a source of the reference voltage ($U_L$), a sampling capacitor ($C_n$) and a controlled current source (I) are connected to the array (A) of capacitors, and a control input of the current source (I) is connected to a control output ($A_I$) of the control module (CM).

8. The apparatus as claimed in claim 7 characterized in that the array (A) of capacitors comprises a number of n capacitors ($C_{n-1}, C_{n-2}, \ldots, C_1, C_0$), and a capacitance value of a capacitor of a given index is twice as high as a capacitance value of the capacitor of a previous index, and the sampling capacitor ($C_n$) is connected to the array (A) of capacitors, while the top plate of the sampling capacitor ($C_n$) is connected to the source of the converted voltage ($U_{IN}$) through a closed voltage source on-off switch ($S_{Un}$) and also it is connected through a closed first on-off switch ($S_{Ln}$) to a first rail (L) with which top plates of all the capacitors ($C_{n-1}, C_{n-2}, \ldots, C_1, C_0$) in the array (A) of capacitors are connected through open first on-off switches ($S_{Ln-1}, S_{Ln-2}, \ldots, S_{L1}, S_{L0}$), while the top plate of a capacitor ($C_{n-1}$) having the highest capacitance value in the array (A) of capacitors is also connected through a closed second on-off switch ($S_{Hn-1}$) to a second rail (H) with which the top plate of the sampling capacitor ($C_n$) is also connected through an open second on-off switch ($S_{Hn}$) and with which the top plates of the other capacitors ($C_{n-2}, \ldots, C_1, C_0$) in the array (A) are connected through the open second on-off switches ($S_{Hn-2}, \ldots, S_{H1}, S_{H0}$), and the bottom plate of the sampling capacitor ($C_n$) is connected to the ground of the circuit through a change-over switch ($S_{Gn}$) whose moving contact is connected to its first stationary contact and the other stationary contact of the change-over switch ($S_{Gn}$) is connected to the source of auxiliary voltage ($U_H$) and also to a non-inverting input of the first comparator (K1), while the bottom plates of all the capacitors ($C_{n-1}, C_{n-2}, \ldots, C_1, C_0$) in the array (A) are connected to the source of auxiliary voltage ($U_H$) through the change-over switches ($S_{Gn-1}, S_{Gn-2}, \ldots, S_{G1}, S_{G0}$) whose moving contacts are connected to their other stationary contacts, and the first stationary contacts of the change-over switches ($S_{Gn-1}, S_{Gn-2}, \ldots, S_{G1}, S_{G0}$) are connected to the ground of the circuit, whereas the first rail (L) is connected to the ground of the circuit through an open first rail on-off switch ($S_{Gall}$) and to a non-inverting input of the second comparator (K2) whose inverting input is connected to the source of the reference voltage ($U_L$), while the second rail (H) is connected to an inverting input of the first comparator (K1), and moreover, a control input of the first on-off switch ($S_{Ln}$) and control inputs of the first on-off switches ($S_{Ln-1}, S_{Ln-2}, \ldots, S_{L1}, S_{L0}$) in the array (A) and a control input of the change-over switch ($S_{Gn}$) and control inputs of the relevant change-over switches ($S_{Gn-1}, S_{Gn-2}, \ldots, S_{G1}, S_{G0}$) in the array (A) are coupled together and connected to relevant control outputs ($I_n$) and ($I_{n-1}, I_{n-2}, \ldots, I_1, I_0$) of the set of control outputs (E) of the control module (CM), while a control input of the second on-off switch ($S_{Hn}$) and control inputs of the second on-off switches ($S_{Hn-1}, S_{Hn-2}, \ldots, S_{H1}, S_{H0}$) in the array (A) and a control input of the first rail on-off switch ($S_{Gall}$) are connected to relevant control outputs ($D_n$), ($D_{n-1}, D_{n-2}, \ldots, D_1, D_0$) and ($D_{all}$) of the set of control outputs (E) of the control module (CM), while one end of the current source (I) is connected to the second rail (H), and the other end of the current source (I) is connected to the first rail (L), and the control input of the current source (I) is connected to the control output ($A_I$) of the control module (CM), whereas a control input of the voltage source on-off switch ($S_{Un}$) is connected to a control output ($A_U$) of the control module (CM).

9. The apparatus as claimed in claim 8 characterized in that the sampling capacitor ($C_n$) is connected in parallel to the capacitor ($C_{n-1}$) having the highest capacitance value in the array (A) of capacitors while the capacitance value of the sampling capacitor ($C_n$) is not smaller than the capacitance value of the capacitor ($C_{n-1}$), and at the same time both capacitors ($C_n$) and ($C_{n-1}$) are connected in parallel to the source of the converted voltage ($U_{IN}$) in a way that the top plate of the capacitor ($C_{n-1}$) in the array (A) of capacitors is connected to the source of the converted voltage ($U_{IN}$) through the closed additional voltage source on-off switch ($S_{Un-1}$), and the bottom plate of the capacitor ($C_{n-1}$) is connected to the ground of the circuit through the change-over switch ($S_{Gn-1}$) whose moving contact is connected to its first stationary contact, and the other stationary contact of the change-over switch ($S_{Gn-1}$) is connected to the source of auxiliary voltage ($U_H$), and moreover, the top plate of the capacitor ($C_{n-1}$) in the array (A) of capacitors is connected also to the first rail (L) through the closed first on-off switch ($S_{Ln-1}$), whereas the control input of the voltage source on-off switch ($S_{Un}$) and the control input of the additional voltage source on-off switch ($S_{Un-1}$) are coupled together and connected to the control output ($A_U$) of the control module (CM).

10. The apparatus as claimed in claim 7 characterized in that a voltage supply ($U_{DD}$) is additionally connected to the array (A) of capacitors.

11. The apparatus as claimed in claim 10 characterized in that the array (A) of capacitors comprises a number of n capacitors ($C_{n-1}, C_{n-2}, \ldots, C_1, C_0$), and a capacitance value of a capacitor of a given index is twice as high as a capacitance value of the capacitor of the previous index, and the sampling capacitor ($C_n$) is connected to the array (A) of capacitors, while the top plate of the sampling capacitor ($C_n$) is connected through the closed first on-off switch ($S_{Ln}$) to the first rail (L) with which also the top plates of all the capacitors ($C_{n-1}, C_{n-2}, \ldots, C_1, C_0$) in the array (A) of capacitors are connected through the open first on-off switches ($S_{Ln-1}, S_{Ln-2}, \ldots, S_{L1}, S_{L0}$), while the top plate of the capacitor ($C_{n-1}$) having the highest capacitance value in the array (A) of capacitors is also connected through the closed second on-off switch ($S_{Hn-1}$) to the second rail (H) with which the top plate of the sampling capacitor ($C_n$) is also connected through the open second on-off switch ($S_{Hn}$) and with which the top plates of the other capacitors ($C_{n-2}, \ldots, C_1, C_0$) in the array (A) are connected through the open second on-off switches ($S_{Hn-2}, \ldots, S_{H1}, S_{H0}$), and the bottom plate of the sampling capacitor ($C_n$) is connected to the ground of the circuit through the change-over switch ($S_{Gn}$) whose moving contact is connected to its first stationary contact and the other stationary contact of the change-over switch ($S_{Gn}$) is connected to the source of auxiliary voltage ($U_H$) and also to the non-inverting input of the first comparator (K1), while the bottom plates of all the capacitors ($C_{n-1}, C_{n-2}, \ldots, C_1, C_0$) in the array (A) are connected to the source of auxiliary voltage ($U_H$) through the change-over switches ($S_{Gn-1}, S_{Gn-2}, \ldots, S_{G1}, S_{G0}$) whose moving contacts are connected to their other stationary contacts, and the first stationary contacts of the change-over switches ($S_{Gn-1}, S_{Gn-2}, \ldots, S_{G1}, S_{G0}$) are connected to the ground of the circuit, whereas the first rail (L) is connected to the ground of the circuit through the open first rail on-off switch ($S_{Gall}$) and to the non-inverting input of the second comparator (K2) whose inverting input is connected to the source of the converted voltage ($U_{IN}$) through the voltage source change-over switch ($S_U$) whose moving contact is connected to its first stationary contact and the other stationary contact of the voltage source change-over switch ($S_U$) is connected to the source of the reference voltage ($U_L$), while the second rail (H) is connected to the inverting input of the first comparator (K1), and moreover, the control input of the first on-off switch ($S_{Ln}$) and the control inputs of the first on-off switches ($S_{Ln-1}$, $S_{Ln-2}$, ..., $S_{L1}$, $S_{L0}$) in the array (A) and the control input of the change-over switch ($S_{Gn}$) and the control inputs of the relevant change-over switches ($S_{Gn-1}$, $S_{Gn-2}$, ..., $S_{G1}$, $S_{G0}$) in the array (A) are coupled together and connected to the relevant control outputs ($I_n$) and ($I_{n-1}$, $I_{n-2}$, ..., $I_1$, $I_0$) of the set of control outputs (E) of the control module (CM), while the control input of the second on-off switch ($S_{Hn}$) and the control inputs of the second on-off switches ($S_{Hn-1}$, $S_{Hn-2}$, ..., $S_{H1}$, $S_{H0}$) in the array (A) and the control input of the first rail on-off switch ($S_{Gall}$) are connected to the relevant control outputs ($D_n$), ($D_{n-1}$, $D_{n-2}$, ..., $D_1$, $D_0$) and ($D_{all}$) of the set of control outputs (E) of the control module (CM), whereas the control input of the voltage source change-over switch ($S_U$) is connected to the control output ($A_U$) of the control module (CM) while one end of the current source (I) is connected to the voltage supply ($U_{DD}$) through the current source change-over switch ($S_I$) whose moving contact is connected to its first stationary contact and the other stationary contact of the current source change-over switch ($S_I$) is connected to the second rail (H), and the other end of the current source (I) is connected to the first rail (L), and moreover, the control input of the current source change-over switch ($S_I$) is connected to the control output ($A_S$) of the control module (CM), and the control input of the current source (I) is connected to the control output ($A_I$) of the control module (CM).

12. The apparatus as claimed in claim 11 characterized in that the sampling capacitor ($C_n$), whose capacitance value is not smaller than the capacitance value of the capacitor ($C_{n-1}$), is connected in parallel to the capacitor ($C_{n-1}$) having the highest capacitance value in the array (A) of capacitors through the first rail (L) and through the ground of the circuit in a way that the top plate of the capacitor ($C_{n-1}$) in the array (A) of capacitors is connected to the first rail (L) through the closed first on-off switch ($S_{Ln-1}$), and the bottom plate of the capacitor ($C_{n-1}$) is connected to the ground of the circuit through the change-over switch ($S_{Gn-1}$) whose moving contact is connected to its first stationary contact, and the other stationary contact of the change-over switch ($S_{Gn-1}$) is connected to the source of auxiliary voltage ($U_H$).

13. The apparatus as claimed in claim 7 characterized in that the voltage supply ($U_{DD}$) and a controlled additional current source (J) are connected to the array (A) of capacitors, and the control input of the additional current source (J) is connected to the control output ($A_J$) of the control module (CM).

14. The apparatus as claimed in claim 13 characterized in that the array (A) of capacitors comprises a number of n capacitors ($C_{n-1}$, $C_{n-2}$, ..., $C_1$, $C_0$), and a capacitance value of a capacitor of a given index is twice as high as a capacitance value of the capacitor of the previous index, and the sampling capacitor ($C_n$) is connected to the array (A) of capacitors, while the top plate of the sampling capacitor ($C_n$) is connected through the closed first on-off switch ($S_{Ln}$) to the first rail (L) with which also the top plates of all the capacitors ($C_{n-1}$, $C_{n-2}$, ..., $C_1$, $C_0$) in the array (A) of capacitors are connected through the open first on-off switches ($S_{Ln-1}$, $S_{Ln-2}$, ..., $S_{L1}$, $S_{L0}$), while the top plate of the sampling capacitor ($C_n$) is also connected through the closed second on-off switch ($S_{Hn}$) to the second rail (H) with which the top plates of all the capacitors ($C_{n-1}$, $C_{n-2}$, ..., $C_1$, $C_0$) in the array (A) are connected through the open second on-off switches ($S_{Hn-1}$, $S_{Hn-2}$, ..., $S_{H1}$, $S_{H0}$), and the bottom plate of the sampling capacitor ($C_n$) is connected to the ground of the circuit through the change-over switch ($S_{Gn}$) whose moving contact is connected to its first stationary contact and the other stationary contact of the change-over switch ($S_{Gn}$) is connected to the source of auxiliary voltage ($U_H$) and also to the non-inverting input of the first comparator (K1), while the bottom plates of all the capacitors ($C_{n-1}$, $C_{n-2}$, ..., $C_1$, $C_0$) in the array (A) are connected to the source of auxiliary voltage ($U_H$) through the change-over switches ($S_{Gn-1}$, $S_{Gn-2}$, ..., $S_{G1}$, $S_{G0}$) whose moving contacts are connected to their other stationary contacts, and the first stationary contacts of the change-over switches ($S_{Gn-1}$, $S_{Gn-2}$, ..., $S_{G1}$, $S_{G0}$) are connected to the ground of the circuit, whereas the first rail (L) is connected to the ground of the circuit through the open first rail on-off switch ($S_{Gall}$) and to the non-inverting input of the second comparator (K2) whose inverting input is connected to the source of the converted voltage ($U_{IN}$) through the voltage source change-over switch ($S_U$) whose moving contact is connected to its first stationary contact and the other stationary contact of the voltage source change-over switch ($S_U$) is connected to the source of the reference voltage ($U_L$), while the second rail (H) is connected to the inverting input of the first comparator (K1), and moreover, the control input of the first on-off switch ($S_{Ln}$) and the control inputs of the first on-off switches ($S_{Ln-1}$, $S_{Ln-2}$, ..., $S_{L1}$, $S_{L0}$) in the array (A) and the control input of the change-over switch ($S_{Gn}$) and the control inputs of the relevant change-over switches ($S_{Gn-1}$, $S_{Gn-2}$, ..., $S_{G1}$, $S_{G0}$) in the array (A) are coupled together and connected to the relevant control outputs ($I_n$) and ($I_{n-1}$, $I_{n-2}$, ..., $I_1$, $I_0$) of the set of control outputs (E) of the control module (CM), while the control input of the second on-off switch ($S_{Hn}$) and the control inputs of the second on-off switches ($S_{Hn-1}$, $S_{Hn-2}$, ..., $S_{H1}$, $S_{H0}$) in the array (A) and the control input of the first rail on-off switch ($S_{Gall}$) are connected to the relevant control outputs ($D_n$), ($D_{n-1}$, $D_{n-2}$, ..., $D_1$, $D_0$) and ($D_{all}$) of the set of control outputs (E) of the control module (CM), whereas the control input of the voltage source change-over switch ($S_U$) is connected to the control output ($A_U$) of the control module (CM) while one end of the current source (I) is connected to the voltage supply ($U_{DD}$) and the other end of the current source (I) is connected to the first rail (L), with which also the other end of the additional current source (J) is connected whereas one end of the additional current source (J) is connected to the second rail (H), and the control input of the current source (I) is connected to the control output ($A_I$) of the control module (CM) while the control input of the additional current source (J) is connected to the control output ($A_J$) of the control module (CM).

15. The apparatus as claimed in claim 14 characterized in that the sampling capacitor ($C_n$), whose capacitance value is not smaller than the capacitance value of the capacitor ($C_{n-1}$), is connected in parallel to the capacitor ($C_{n-1}$) having the highest capacitance value in the array (A) of capacitors through the first rail (L) and through the ground of the circuit in a way that the top plate of the capacitor ($C_{n-1}$) in the array (A) of capacitors is connected to the first rail (L) through the closed first on-off switch ($S_{Ln-1}$), and the bottom plate of the capacitor ($C_{n-1}$) is connected to the ground of the circuit through the change-over switch ($S_{Gn-1}$) whose moving contact is connected to its first stationary contact, and the other stationary contact of the change-over switch ($S_{Gn-1}$) is connected to the source of auxiliary voltage ($U_H$).

* * * * *